(12) United States Patent
Watanabe et al.

(10) Patent No.: US 7,795,629 B2
(45) Date of Patent: Sep. 14, 2010

(54) LIGHT-EMITTING DIODE DISPLAY AND METHOD FOR MANUFACTURING THE SAME

(75) Inventors: Toshihiko Watanabe, Kanagawa (JP); Masato Doi, Kanagawa (JP); Shoichi Muraguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/432,482

(22) Filed: Apr. 29, 2009

(65) Prior Publication Data

US 2009/0278142 A1    Nov. 12, 2009

(30) Foreign Application Priority Data

May 12, 2008    (JP)    ............................. 2008-124444

(51) Int. Cl.
*H01L 33/00* (2010.01)
(52) U.S. Cl. .......... 257/89; 257/E21.499; 257/E33.056; 438/28
(58) Field of Classification Search .................. 257/89, 257/E21.499, E33.056; 438/28
See application file for complete search history.

(56) References Cited

U.S. PATENT DOCUMENTS

| 2004/0160154 | A1* | 8/2004 | Nishimura et al. | .......... 313/113 |
| 2005/0233504 | A1 | 10/2005 | Doi et al. | |
| 2009/0001391 | A1* | 1/2009 | Ogihara et al. | ................. 257/89 |

FOREIGN PATENT DOCUMENTS

| JP | 2004-273596 | 9/2004 |
| JP | 2004-281630 | 10/2004 |

* cited by examiner

*Primary Examiner*—Trung Dang
(74) *Attorney, Agent, or Firm*—K&L Gates LLP

(57) ABSTRACT

A method for manufacturing a light-emitting diode display is provided. The method includes pre-fixing first, second, and third light-emitting diodes on a light emitting unit production substrate to produce light-emitting units each including first, second, and third light-emitting diodes, first electrodes of the first, second, and third light-emitting diodes being connected to a sub-common electrode. The method also includes transferring and fixing the light-emitting units from the light-emitting unit production substrate to a display substrate to produce a light-emitting diode display including the light-emitting units which are arranged in a first direction and a second direction perpendicular to the first direction (i.e., arranged in a two-dimensional matrix).

24 Claims, 35 Drawing Sheets

[STEP-100]

[STEP-110A-(1)]

[STEP-110A-(1)] (CONTINUED)

[STEP-110A-(1)] (CONTINUED)

[STEP-110A-(2)]

[STEP-110A-(2)] (CONTINUED)

[STEP-110A-(2)] (CONTINUED)

LASER IRRADIATION     LASER IRRADIATION

[STEP-110A-(2)] (CONTINUED)

[STEP-110A-(2)] (CONTINUED)

[STEP-110B]

[STEP-110B] (CONTINUED)

[STEP-110C]

[STEP-120C] (CONTINUED)

[STEP-120D]

[STEP-120D] (CONTINUED)

[STEP-120B]

[STEP-120C]

[STEP-120D]

[STEP-210B]

[STEP-210C]

[STEP-210D]

[STEP-310B]

[STEP-310B] (CONTINUED)

[STEP-310C]

[STEP-410B]

[STEP-410C]

[STEP-410D]

LIGHT-EMITTING DIODE DISPLAY AND METHOD FOR MANUFACTURING THE SAME

CROSS REFERENCES TO RELATED APPLICATIONS

The present application claims priority to that disclosed in Japanese Priority Patent Application JP 2008-124444 filed in the Japan Patent Office on May 12, 2008, the entire content of which is hereby incorporated by reference.

BACKGROUND

The present disclosure relates to a light-emitting diode display device and a method for manufacturing the same.

There are various technical fields involving mounting micro-articles on a mounting substrate. An example of such fields is the field of light-emitting diode displays. In a light-emitting diode display, a red light-emitting diode functions as a red light-emitting sub-pixel, a green light-emitting diode functions as a green light-emitting sub-pixel, and a blue light-emitting diode functions as a blue light-emitting sub-pixel so that a color image is displayed according to emission states of these three types of sub-pixels.

For example, in a 40-inch diagonal full HD (High Definition) full-color display, the number of pixels in a horizontal direction of a screen is 1920, and the number of pixels in a vertical direction of a screen is 1080. In this case, therefore, the number of the light-emitting diodes mounted is 1920× 1080× (the number of the three types of light-emitting diodes, i.e., the red light-emitting diode, the green light-emitting diode, and the blue light-emitting diode, which constitute one pixel) and is thus about 6,000,000. Therefore, as a method for mounting such a vast number of light-emitting diodes on a display substrate, there is a method of forming a light-emitting diode array of a size smaller than a screen size and successively mounting light-emitting diodes on a display substrate from the light-emitting diode array while shifting the positions, i.e., a step transfer method (step mounting method).

Such a step transfer method is disclosed in, for example, Japanese Unexamined Patent Application Publication Nos. 2004-273596 and 2004-281630. In a technique disclosed in these patent application publications, basically, elements are buried in an adhesive layer formed on a surface of a transfer substrate so that the elements partially project from the substrate, and then buried deeply in the adhesive layer using a roller or the like (refer to, for example, paragraphs [0045] to [0048] of Japanese Unexamined Patent Application Publication No. 2004-273596 and paragraphs [0038] and [0046] of Japanese Unexamined Patent Application Publication No. 2004-281630).

As a substrate for manufacturing GaInN-based light-emitting diodes, at present, it is difficult to produce a substrate having a large nominal diameter exceeding 2 inches. As a substrate for manufacturing AlGaInP-based light-emitting diodes, at present, it is difficult to produce a substrate having a large nominal diameter exceeding 3 inches. Thus, a sapphire substrate having a nominal diameter of 2 inches is used for producing blue light-emitting diodes and green light-emitting diodes, and a GaAs substrate having a nominal diameter of 3 inches is used for producing red light-emitting diodes. When a 26-inch diagonal light-emitting diode display is manufactured, blue light-emitting diodes, green light-emitting diodes, and red light-emitting diodes are mounted on a display substrate of a size of 650 mm×550 mm.

As described above, one pixel usually includes three sub-pixels. Therefore, the three types of light-emitting diodes, i.e., red light-emitting diodes, green light-emitting diodes, and blue light-emitting diodes, are moved (e.g., transferred) to a display substrate, and then wiring is formed and drawn by a complicated process, for driving these three types of light-emitting diodes.

It is desirable to provide a method for manufacturing a light-emitting diode display which is capable of manufacturing a light-emitting diode display by a simple process, and a light-emitting diode display manufactured by the method.

SUMMARY

A method for manufacturing a light-emitting diode display according to an embodiment includes the following steps.

(A) A plurality of first light-emitting diodes which emit red light are provided on a first light-emitting diode production substrate, the first light-emitting diodes each including the following components:

(a-1) a first compound semiconductor layer having a first conductivity type;

(a-2) an active layer;

(a-3) a second compound semiconductor layer having a second conductivity type different from the first conductivity type;

(a-4) a first electrode electrically connected to the first compound semiconductor layer; and (a-5) a second electrode electrically connected to the second compound semiconductor layer;

a plurality of second light-emitting diodes which emit green light are provided on a second light-emitting diode production substrate, the second light-emitting diodes each including the following components:

(b-1) a first compound semiconductor layer having a first conductivity type;

(b-2) an active layer;

(b-3) a second compound semiconductor layer having a second conductivity type different from the first conductivity type;

(b-4) a first electrode electrically connected to the first compound semiconductor layer; and (b-5) a second electrode electrically connected to the second compound semiconductor layer; and a plurality of third light-emitting diodes which emit blue light are provided on a third light-emitting diode production substrate, the third light-emitting diodes each including the following components:

(c-1) a first compound semiconductor layer having a first conductivity type;

(c-2) an active layer;

(c-3) a second compound semiconductor layer having a second conductivity type different from the first conductivity type;

(c-4) a first electrode electrically connected to the first compound semiconductor layer; and (c-5) a second electrode electrically connected to the second compound semiconductor layer.

(B) The first light-emitting diodes, the second light-emitting diodes, and the third light-emitting diodes are pre-fixed to a light-emitting unit production substrate to form light-emitting units each including a desired number of the first light-emitting diodes, a desired number of the second light-emitting diodes, and a desired number of the third light-emitting diodes, and the first electrodes of the first light-emitting diodes, the second light-emitting diodes, and the third light-emitting diodes being connected to a sub-common electrode.

(C) The light-emitting units are transferred and fixed to a display substrate from the light-emitting unit production substrate to produce a light-emitting diode display including a plurality of light-emitting units which are arranged in a two-dimensional matrix, i.e., arranged in a first direction and a second direction perpendicular to the first direction.

In the method for manufacturing a light-emitting diode display, preferably, the arrangement pitch of the first light-emitting diodes in the light-emitting diode display is an integral multiple of the manufacturing pitch of the first light-emitting diodes on the first light-emitting diode production substrate, the arrangement pitch of the second light-emitting diodes in the light-emitting diode display is an integral multiple of the manufacturing pitch of the second light-emitting diodes on the second light-emitting diode production substrate, and the arrangement pitch of the third light-emitting diodes in the light-emitting diode display is an integral multiple of the manufacturing pitch of the third light-emitting diodes on the third light-emitting diode production substrate. In this case, a loss of the materials used for manufacturing the light-emitting diodes is decreased, and the manufacturing process is rationalized. The value of an integral multiple may be determined on the basis of the specifications of the light-emitting diode display, the manufacturing process of the light-emitting diodes, and the like.

The method for manufacturing a light-emitting diode display according to the preferred embodiment may include preparing a first transfer substrate having a fixed layer. In this case, the step (B) includes the following steps.

(B-1) The first light-emitting diodes on the first light-emitting diode production substrate are transferred to the fixed layer, the second light-emitting diodes on the second light-emitting diode production substrate are transferred to the fixed layer, and the third light-emitting diodes on the third light-emitting diode production substrate are transferred to the fixed layer.

(B-2) The sub-common electrode is formed to extend from the first electrodes of a light-emitting diode group to the fixed layer, the light-emitting diode group including a desired number of the first light-emitting diodes, a desired number of the second light-emitting diodes, and a desired number of the third light-emitting diodes which form each light-emitting unit.

(B-3) The light-emitting diode group, which forms each light-emitting unit, is bonded and pre-fixed to the light-emitting diode unit production substrate through the fixed layer and the sub-common electrode, and then the first transfer substrate is removed.

(B-4) First contact holes are formed in the fixed layer to be connected to the second electrodes of the first light-emitting diodes and first pad portions are formed to extend from the first contact holes to the fixed layer. Second contact holes are formed in the fixed layer to be connected to the second electrodes of the second light-emitting diodes and second pad portions are formed to extend from the second contact holes to the fixed layer. Third contact holes are formed in the fixed layer to be connected to the second electrodes of the third light-emitting diodes and third pad portions are formed to extend from the third contact holes to the fixed layer. Further, fourth contact holes are formed in the fixed layer to be connected to the sub-common electrode and fourth pad portions are formed to extend from the fourth contact holes to the fixed layer. As a result, light-emitting units are formed.

(B-5) Then, the light-emitting units are separated in the fixed layer.

The method may further include preparing a display substrate on which an insulating material layer and first, second, and third common electrodes covered with the insulating material layer and extending in the first direction are formed. In this case, the step (C) includes the following steps.

(C-1) The light-emitting units are bonded to a second transfer substrate and the light-emitting unit production substrate is removed.

(C-2) The light-emitting units are arranged on the display substrate so that the light-emitting units are surrounded by the insulating material layer and then the second transfer substrate is removed.

(C-3) First connection portions are formed for electrically connecting the first pad portions to the first common electrode so as to extend from the fixed layer to the insulating material layer. Second connection portions are formed for electrically connecting the second pad portions to the second common electrode so as to extend from the fixed layer to the insulating material layer. Third connection portions are formed for electrically connecting the third pad portions to the third common electrode so as to extend from the fixed layer to the insulating material layer. A fourth common electrode is formed on the insulating material layer, and fourth connection portions are formed for electrically connecting the fourth pad portions to the fourth common electrode so as to extend from the fixed layer to the insulating material layer. For convenience sake, this configuration is referred to as "the method for manufacturing a light-emitting diode display according to a first configuration".

Alternatively, the method for manufacturing a light-emitting diode display according to the preferred embodiment may include preparing a first transfer substrate having the fixed layer, performing step (B) (i.e., steps (B-1) to (B-5)) in the method for manufacturing a light-emitting diode display according to the first configuration, and preparing a display substrate on which first, second, and third common electrodes are formed to extend in the first direction. In this case, the step (C) includes the following steps.

(C-1) The light-emitting units are bonded to a second transfer substrate and the light-emitting unit production substrate is removed.

(C-2) The light-emitting units are arranged on the display substrate and then the second transfer substrate is removed.

(C-3) An insulating material layer is formed to cover the first, second, and third common electrodes and surround the light-emitting units.

(C-4) First connection portions are formed for electrically connecting the first pad portions to the first common electrode so as to extend from the fixed layer to the insulating material layer. Second connection portions are formed for electrically connecting the second pad portions to the second common electrode so as to extend from the fixed layer to the insulating material layer. Third connection portions are formed for electrically connecting the third pad portions to the third common electrode so as to extend from the fixed layer to the insulating material layer. A fourth common electrode is formed on the insulating material layer, and fourth connection portions are formed for electrically connecting the fourth pad portions to the fourth common electrode so as to extend from the fixed layer to the insulating material layer. For convenience sake, this configuration is referred to as "the method for manufacturing a light-emitting diode display according to a second configuration".

Alternatively, the method for manufacturing a light-emitting diode display according to the preferred embodiment may include preparing a first transfer substrate having a fixed layer. In this case, the step (B) includes the following steps.

(B-1) The first light-emitting diodes on the first light-emitting diode production substrate are transferred to the fixed layer, the second light-emitting diodes on the second light-emitting diode production substrate axe transferred to the fixed layer, and the third light-emitting diodes on the third light-emitting diode production substrate are transferred to the fixed layer.

(B-2) The sub-common electrode is formed to extend from the first electrodes of a light-emitting diode group to the fixed layer, the light-emitting diode group including a desired number of the first light-emitting diodes, a desired number of the second light-emitting diodes, and a desired number of the third light-emitting diodes which form each light-emitting unit.

(B-3) The light-emitting diode group, which forms each light-emitting unit, is bonded and pre-fixed to the light-emitting diode unit production substrate through the fixed layer and the sub-common electrode to produce light-emitting units and then the first transfer substrate is removed.

(B-4) Then, the light-emitting units are separated in the fixed layer.

The method may further include preparing a display substrate on which an insulating material layer and first, second, and third common electrodes covered with the insulating material layer and extending in the first direction are formed. In this case, the step (C) includes the following steps.

(C-1) The light-emitting units are bonded to a second transfer substrate and the light-emitting unit production substrate is removed.

(C-2) The light-emitting units are arranged on the display substrate so that the light-emitting units are surrounded by the insulating material layer and then the second transfer substrate is removed.

(C-3) First contact holes are formed in the fixed layer in order to electrically connect the second electrodes of the first light-emitting diodes to the first common electrode and first connection portions are formed to extend from the fixed layer to the insulating material layer. Second contact holes are formed in the fixed layer in order to electrically connect the second electrodes of the second light-emitting diodes to the second common electrode and second connection portions are formed to extend from the fixed layer to the insulating material layer. Third contact holes are formed in the fixed layer in order to electrically connect the second electrodes of the third light-emitting diodes to the third common electrode and third connection portions are formed to extend from the fixed layer to the insulating material layer. A fourth common electrode is formed on the insulating material layer, and fourth contact holes are formed in the fixed layer in order to electrically connect the sub-common electrodes to the fourth common electrode and fourth connection portions are formed to extend from the fixed layer to the insulating material layer. For convenience sake, this configuration is referred to as "the method for manufacturing a light-emitting diode display according to a third configuration".

Alternatively, the method for manufacturing a light-emitting diode display according to the preferred embodiment may include preparing a first transfer substrate having a fixed layer, performing step (B) (i.e., steps (B-1) to (B-4)) in the method for manufacturing a light-emitting diode display according to the third configuration, and preparing a display substrate on which first, second, and third common electrodes are formed to extend in the first direction. In this case, the step (C) includes the following steps.

(C-1) The light-emitting units are bonded to a second transfer substrate and the light-emitting unit production substrate is removed.

(C-2) The light-emitting units are arranged on the display substrate and then the second transfer substrate is removed.

(C-3) An insulating material layer is formed to cover the first, second, and third common electrodes and surround the light-emitting units.

(C-4) First contact holes are formed in the fixed layer in order to electrically connect the second electrodes of the first light-emitting diodes to the first common electrode and first connection portions are formed to extend from the fixed layer to the insulating material layer. Second contact holes are formed in the fixed layer in order to electrically connect the second electrodes of the second light-emitting diodes to the second common electrode and second connection portions are formed to extend from the fixed layer to the insulating material layer. Third contact holes are formed in the fixed layer in order to electrically connect the second electrodes of the third light-emitting diodes to the third common electrode and third connection portions are formed to extend from the fixed layer to the insulating material layer. A fourth common electrode is formed on the insulating material layer, and fourth contact holes are formed in the fixed layer in order to electrically connect the sub-common electrodes to the fourth common electrode and fourth connection portions are formed to extend from the fixed layer to the insulating material layer. For convenience sake, this configuration is referred to as "the method for manufacturing a light-emitting diode display according to a fourth configuration".

A light-emitting diode display according to an embodiment includes a plurality of light-emitting units arranged in a first direction and a second direction perpendicular to the first direction, i.e., arranged in a two-dimensional matrix, the light-emitting units each including the following components:

a desired number of first light-emitting diodes which emit red light and each of which includes the following components:
- (a-1) a first compound semiconductor layer having a first conductivity type;
- (a-2) an active layer;
- (a-3) a second compound semiconductor layer having a second conductivity type different from the first conductivity type;
- (a-4) a first electrode electrically connected to the first compound semiconductor layer; and
- (a-5) a second electrode electrically connected to the second compound semiconductor layer;

a desired number of second light-emitting diodes which emit green light and each of which include the following components:
- (b-1) a first compound semiconductor layer having a first conductivity type;
- (b-2) an active layer;
- (b-3) a second compound semiconductor layer having a second conductivity type different from the first conductivity type;
- (b-4) a first electrode electrically connected to the first compound semiconductor layer; and
- (b-5) a second electrode electrically connected to the second compound semiconductor layer; and a desired number of third light-emitting diodes which emit blue light and each of which the following components:
- (c-1) a first compound semiconductor layer having a first conductivity type;
- (c-2) an active layer;

(c-3) a second compound semiconductor layer having a second conductivity type different from the first conductivity type;

(c-4) a first electrode electrically connected to the first compound semiconductor layer; and (c-5) a second electrode electrically connected to the second compound semiconductor layer.

The first electrodes of the first, second, and third light-emitting diodes in each of the light-emitting units are connected to a sub-common electrode, the second electrodes of the first, second, and third light-emitting diodes in each of the light-emitting units arranged in the first direction are connected to first, second, and third common electrodes, respectively, which extend in the first direction, and the sub-common electrodes of the light-emitting units arranged in the second direction are connected to a fourth common electrode extending in the second direction.

The light-emitting diode display may be configured as follows.

The first, second, and third common electrodes are formed on a display substrate.

The sub-common electrodes are formed in a fixed layer fixed on the display substrate.

The first, second, and third light-emitting diodes in each of the light-emitting units are fixed in the fixed layer.

The fixed layer is surrounded by an insulating material layer which covers the first, second, and third common electrodes.

The first, second, and third light-emitting diodes in each of the light-emitting units are disposed on the sub-common electrode so that the first electrodes of the light-emitting diodes are connected to the sub-common electrode.

The second electrodes of the first light-emitting diodes are connected to the first common electrode through first contact holes formed in the fixed layer and first connection portions formed to extend from the fixed layer to the insulating material layer.

The second electrodes of the second light-emitting diodes are connected to the second common electrode through second contact holes formed in the fixed layer and second connection portions formed to extend from the fixed layer to the insulating material layer.

The second electrodes of the third light-emitting diodes are connected to the third common electrode through third contact holes formed in the fixed layer and third connection portions formed to extend from the fixed layer to the insulating material layer.

The sub-common electrodes are connected to the fourth common electrode formed on the insulating material layer through fourth contact holes formed in the fixed layer and fourth connection portions formed to extend from the fixed layer to the insulating material layer.

The light-emitting diode display having the above-mentioned preferred configuration may be configured as follows.

First pad portions are provided in the fixed layer to be disposed between the first contact holes and the first connection portions.

Second pad portions are provided in the fixed layer to be disposed between the second contact holes and the second connection portions.

Third pad portions are provided in the fixed layer to be disposed between the third contact holes and the third connection portions.

Fourth pad portions are provided in the fixed layer to be disposed between the fourth contact holes and the fourth connection portions.

The light-emitting diode display having the above-mentioned preferred configuration or the method for manufacturing a light-emitting diode display according to the first or second configuration including the above-described preferred configuration may be configured as follows.

The size of the first pad portions is larger than the size of the second electrodes of the first light-emitting diodes.

The size of the second pad portions is larger than the size of the second electrodes of the second light-emitting diodes, The size of the third pad portions is larger than the size of the second electrodes of the third light-emitting diodes, Specifically, when the size (area) of the first, second, or third pad portions is $S_P$, and the size (area) of the second electrodes of the first, second, or third light-emitting diodes is $S_E$, it is preferred to satisfy $S_E<S_P<L_U/3$, preferably $S_E<S_P<L_U/12$, wherein $L_U$ represents the maximum length of one side of one pixel.

The light-emitting diode display having the above-mentioned preferred configuration or the method for manufacturing a light-emitting diode display according to the first or second configuration including the above-described preferred configuration may be configured as follows.

The center of the first pad portion which closes each of the first contact holes does not coincide with the center of the first contact hole and deviates to the first common wiring side.

The center of the second pad portion which closes each of the second contact holes does not coincide with the center of the second contact hole and deviates to the second common wiring side, The center of the third pad portion which closes each of the third contact holes does not coincide with the center of the third contact hole and deviates to the third common wiring side.

In this configuration, when the first, second, and third connection portions are formed, an allowance may be given to the distances between these connection portions and the fourth connection portions. Therefore, short-circuiting may be securely prevented from occurring between these connection portions and the fourth connection portions.

The light-emitting diode display having the above-mentioned preferred configuration or the method for manufacturing a light-emitting diode display including the above-described preferred configuration may be configured as follows. Tight emitted from the first, second, and third light-emitting diodes is emitted from the first electrode side, and the sub-common electrodes have a light-transmitting structure. In this case, the sub-common electrodes may include metal layers or alloy layers. Alternatively, in this case, the sub-common electrodes may include light-transmitting electrodes and metal layers or alloy layers extending from the light-transmitting electrodes so that the first electrodes of the first, second, and third light-emitting diodes are in contact with the light-transmitting electrodes, and the fourth contact holes are in contact with the metal layers or alloy layers.

The sub-common electrodes may include metal layers or alloy layers, and specifically the sub-common electrodes may be mesh-like electrodes or comb-like electrodes. Alternatively, the sub-common electrodes may include light-transmitting electrodes and metal layers or alloy layers extending from the light-transmitting electrodes. Specifically, the light-transmitting electrodes may be composed of a transparent conductive material such as ITO, IZO, or the like, or the light-transmitting electrodes may be mesh-like electrodes or comb-like electrodes. The mesh-like electrodes or comb-like electrodes may not have light transmissivity as long as they have a light-transmitting structure. Examples of materials used for forming the metal layers or alloy layers include elemental metals such as Ti, Cr, Ni, Au Ag, Cu, Pt, W, Ta, Al, and the like, and alloys thereof. The sub-common electrodes may have a multilayer structure including two or more layers. The first electrodes of the first, second, and third light-emitting diodes are in contact with the light-transmitting electrodes. Specifically the light-transmitting electrodes may be formed on the first electrodes or on the first electrodes and the peripheries thereof. The fourth contact holes are preferably in contact with the metal layers or alloy layers. Specifically, the fourth contact holes may be formed on the metal layers or alloy layers.

Further, in the light-emitting diode display having the above-mentioned preferred configuration or the method for manufacturing a light-emitting diode display having the above-described preferred configuration, it is preferred to satisfy the following relationships:

$$L_{U\text{-}1}/L_{P\text{-}1} \leq 0.5$$

$$L_{U\text{-}2}/L_{P\text{-}2} \leq 0.5,$$

preferably $$L_{U\text{-}1}/L_{P\text{-}1} \leq 0.5$$

$$L_{U\text{-}2}/L_{P\text{-}2} \leq 0.25$$

wherein $L_{P\text{-}1}$ and $L_{P\text{-}2}$ are the lengths along the first direction and the second direction, respectively, of one pixel including the first, second, and third light-emitting diodes, and $L_{U\text{-}1}$ and $L_{U\text{-}2}$ are the lengths along the first direction and the second direction, respectively, of one light-emitting unit.

Further, in the light-emitting diode display having the above-mentioned preferred configuration or the method for manufacturing a light-emitting diode display having the above-described preferred configuration, it is preferred to satisfy the following relationship:

$$2.5 \times 10^{-11} \text{ m}^2 \leq S_{max} \leq 1 \times 10^{-8} \text{ m}^2,$$

preferably $$2.5 \times 10^{-11} \text{ m}^2 \leq S_{max} \leq 2.5 \times 10^{-9} \text{ m}^2,$$

wherein $S_{max}$ is the area of the emission surface of the largest light-emitting diodes among the first, second, and third light-emitting diodes. In addition, it is preferred to satisfy the following relationship:

$$3 \times 10^0 \leq S_{Unit}/S_{Total} \leq 1.3 \times 10^4,$$

preferably $$5 \leq S_{Unit}/S_{Total} \leq 1 \times 10^3,$$

wherein $S_{Total}$ is the total area of the light emission surfaces of the first, second, and third light-emitting diodes in one light-emitting unit, and $S_{Unit}$ is the area of one light-emitting unit. However, the ratio $S_{Unit}/S_{Total}$ is not limited to this range.

In the light-emitting diode display having the above-mentioned preferred configuration or the method for manufacturing of same (may be generically referred to as "the present embodiments" hereinafter), the desired number $N_1$ of the first light-emitting diodes constituting one light-emitting unit may be an integer of 1 or 2 or more, the desired number $N_2$ of the second light-emitting diodes constituting one light-emitting unit may be an integer of 1 or 2 or more, and the desired number $N_3$ of the third light-emitting diodes constituting one light-emitting unit may be an integer of 1 or 2 or more. The numbers of $N_1$, $N_2$, and $N_3$ may be the same or different.

When the numbers of $N_1$, $N_2$, and $N_3$ are each an integer of 2 or more, the light-emitting diodes may be connected in series or in parallel in one light-emitting unit. Examples of combination of the numbers of ($N_1$, $N_2$, $N_3$) include, but are not limited to, (1, 1, 1), (1, 2, 1), (2, 2, 2), and (2, 4, 2).

In the present embodiments, examples of compound semiconductors which constitute the first compound semiconductor layers, the active layers, the second compound semiconductor layers include GaN-based compound semiconductors (including AlGaN mixed crystals, AlGaInN mixed crystals, and GaInN mixed crystals), GaInNAs-based compound semiconductors (including GaInAs mixed crystals and GaNAs mixed crystals), AlGaInP-based compound semiconductors, AlAs-based compound semiconductors, AlGaInAs-based compound semiconductors, AlGaAs-based compound semiconductors, GaInAs-based compound semiconductors, GaInAsP-based compound semiconductors, GaInP-based compound semiconductors, GaP-based compound semiconductors, InP-based compound semiconductors, InN-based compound semiconductors, and AlN-based compound semiconductors. Examples of n-type impurities to be added to the compound semiconductor layers include silicon (Si), selenium (Se), germanium (Ge), tin (Sn), carbon (C), and titanium (Ti). Examples of p-type impurities include zinc (Zn), magnesium (Mg), beryllium (Be), cadmium (Cd), calcium (Ca), barium (Ba), and oxygen (O). The active layers may include a single compound semiconductor layer or may have a single quantum well structure (QW structure) or a multi-quantum well structure (MQW structure). Examples of a method for forming various compound semiconductor layers including the active layer include an metalorganic chemical vapor deposition method (MOCVD method and MOVPE method), an metalorganic molecular beam epitaxial method (MOMBE method), and a hydride vapor phase epitaxy method (HVPE method) in which halogen contributes to transport or reaction. In order to produce the first light-emitting diodes which emit red light, the second light-emitting diodes which emit green light, and the third light-emitting diodes which emit blue light, the compound semiconductors and the compositions thereof may be appropriately selected.

When the first conductivity type is n type, the second conductivity type is p-type, while When the first conductivity type is p type, the second conductivity type is n-type.

In order to electrically connect the first electrodes to the first compound semiconductor layers, for example, the first electrodes may be formed on the first compound semiconductor layers. Similarly, in order to electrically connect the second electrodes to the second compound semiconductor layers, for example, the second electrodes may be formed on the second compound semiconductor layers. When the first conductivity type is n-type, and the second conductivity type is p-type, the first electrodes are n-side electrodes, and the second electrodes are p-side electrodes. In contrast, when the first conductivity type is p-type, and the second conductivity type is n-type, the first electrodes are p-side electrodes, and the second electrodes are n-side electrodes. Examples of the p-side electrodes include Au/AuZn, Au/Pt/Ti(/Au)/AuZn, Au/Pt/TiW (/Ti)(/Au)/AuZn, Au/AuPd, Au/Pt/Ti(/Au)/AuPd, Au/Pt/TiW(/Ti)(/Au)/AuPd, Au/Pt/Ti, Au/Pt/TiW(/Ti), Au/Pt/TiW/Pd/TiW(/Ti), Pt, Ni, Ag, and Ge. Examples of the n-side electrodes include Au/Ni/AuGe, Au/Pt/Ti(/Au)/Ni/AuGe, Au/Pt/TiW(/Ti)/Ni/AuGe, and Ti, In this expression, the more in front of "/" a layer is described, the more the layer is positioned electrically away from the active layer. Alternatively, the first electrodes may be composed of a transparent, conductive material such as ITO, IZO, ZnO:Al, or ZnO:B. When the first electrodes are the n-side electrodes or p-side electrode, a layer composed of a transparent conductive material may be used as a current diffusion layer and combined with any one of the above-described metal laminated structures.

Examples of the first, second, and third light-emitting diode production substrates include a GaAs substrate, a GaP substrate, an AlN substrate, an AlP substrate, an InN substrate, an InP substrate, an AlGaInN substrate, an AlGaN substrate, an AlInN substrate, a GaInN substrate, an AlGaInP substrate, an AlGaP substrate, an AlInP substrate, a GaInP substrate, a ZnS substrate, a sapphire substrate, a SiC substrate, an alumina substrate, a ZnO substrate, a LiMgO substrate, a LiGaO substrate, a $MgAl_2O_4$ substrate, a Si substrate, a Ge substrate, and the these substrates each further including an underlying layer and a buffer layer formed on a surface (main surface). In order to produce the first light-emitting diodes which emit red light, the second light-emitting diodes which emit green light, and the third light-emitting diodes which emit blue light, substrates may be appropriately selected from these substrates.

Examples of materials which constitute the light-emitting unit production substrate, the display substrate, the first transfer substrate, and the second transfer substrate include a glass plate, a metal plate, an alloy plate, a ceramic plate, and a plastic plate. Examples of the method for pre-fixing the first, second, and third light-emitting diodes to the light-emitting unit production substrate, the method for bonding the light-emitting diode groups to the light-emitting unit production substrate, the method for bonding the light-emitting units to the second transfer substrate, and the method for fixing the light-emitting units to the display substrate include a method using an adhesive, a metal bonding method, a semiconductor bonding method, and a metal-semiconductor bonding method. On the other hand, the first, second, and third light-emitting diode production substrates, the first transfer substrate, the light-emitting unit production substrate, and the second transfer substrate may be removed by, for example, a laser-abrasion method, a heating method, or an etching method. The light-emitting units may be arranged on the display substrate so as to be surrounded by the insulating material layer or may be arranged by, for example, a method using an adhesive.

The fixed layer may have a two-layer structure including an insulating layer and a burying material layer provided in order from the first transfer substrate side Examples of a material which constitutes the insulating layer include polyamide resins and polyimide resins. As an example of a method for fixing the first, second, and third light-emitting diodes to the fixed layer, the burying material layer is previously partially cured, the first, second, and the third light-emitting diodes are buried in the remaining uncured portion of the burying material layer, and then the uncured portion of the burying material layer is cured.

The burying material layer may be basically composed of any desired material as long as the material may be cured or solidified by irradiation with energy rays, such as light (particularly, ultraviolet light), radiation (X-rays), electron beams, or the like, cured or solidified by applying heat, pressure, or the like, or cured or solidified on the basis of any method. Examples of a material which is easily formed and easily cured or solidified include resin layers, particularly, photosensitive resins, thermosetting resins, and thermoplastic resins. Examples of photosensitive resins include negative type resins such as polyvinyl cinnamate, polyvinylazidobenzal, and the like in which an exposed portion becomes insoluble by light crosslinking reaction, negative type resins in which an exposed portion becomes insoluble by photopolymerization reaction of acrylamide or the like, and positive type resins such as o-quinone diazidonovolac resin which is made easy soluble by photodecomposition of a quinonediazido group to produce a carboxylic acid. Examples of the thermosetting resins include epoxy resins, phenol resins, urea resins, melamine resins, unsaturated polyester resins, urethane resins, polyimide resins, and the like. Examples of the thermoplastic resins include polyethylene resins, polystyrene resins, polyvinyl chloride resins, polyamide resins, and the like. For example, when a resin layer composed of a photosensitive resin is used, the burying material layer may be cured by irradiation with light or ultraviolet light. When a resin layer composed of a thermosetting resin is used, the burying material layer may be cured by heating with a hot plate, an oven, or the like. When a resin layer composed of a thermoplastic resin is used, the burying material layer may be partially selectively heated by light irradiation heating or the like to be molten and provided with mobility. As the burying material layer, other materials such as a pressure-sensitive resin (e.g., acrylic resin), a metal (elemental metal or alloy), glass, and the like may be used.

Examples of materials (may be referred to as "electrode materials" hereinafter) which constitute the first, second, third, fourth common electrodes (may be referred to as the "common electrodes and the like" hereinafter) include various metals, such as chromium (Or), aluminum (Al), tungsten (W), niobium (Nb), tantalum (Ta), molybdenum (Mo), copper (Cu), gold (Au), silver (Ag), titanium (Ti), nickel (Ni), cobalt (Co), zirconium (Zr), iron (Fe), platinum (Pt), zinc (Zn), and the like; alloys (e.g., MoW) or compounds (e.g., TiW, nitrides such as TiN, WN, and the like, silicides such as $WSi_2$, $MoSi_2$, $TiSi_2$, $TaSi_2$, and the like); semiconductors, such as silicon (Si) and the like; carbon thin films, such as diamond and the like; and conductive metal oxides, such as ITO (indium tin oxide), indium oxide, zinc oxide, and the like Examples of a method for forming the common electrodes and the like include various physical vapor deposition methods (PVD method), such as vacuum deposition methods such as an electron beam evaporation method and a thermal filament evaporation method, a sputtering method, an ion plating method, and a laser abrasion method; various chemical vapor deposition methods (CVD method); a screen printing method; an ink jet printing method; a metal mask printing method; a plating method (electroplating method and electroless plating method); a lift-off method; a sol-gel method; and the like. Any one of these methods may be combined with an etching method. An appropriate forming method may be selected to permit direct patterning of the common electrodes and the like.

The first, second, third, and fourth contact holes may be formed using, for example, any one of the above-described electrode materials. The first, second, third, and fourth contact holes may be formed by the same method as that for forming apertures in the fixed layer on the basis of lithography or forming the electrodes using the above-described electrode material. The method for forming the first pad portions extending from the first contact holes to the fixed layer, forming the second pad portions extending from the second contact holes to the fixed layer, forming the third pad portions extending from the third contact holes to the fixed layer, and forming the fourth pad portions extending from the fourth contact holes to the fixed layer may be appropriately selected from the above-mentioned methods for forming the common electrodes and the like. Further, the method for forming the first connection portions extending from the fixed layer to the insulating material layer, forming the second connection portions extending from the fixed layer to the insulating material layer, forming the third connection portions extending from the fixed layer to the insulating material layer, and forming the fourth connection portions extending from the fixed layer to the insulating material layer may be appropriately selected from the above-mentioned methods for forming the common electrodes and the like.

As a method for separating the light-emitting units including the light-emitting diode groups in the fixed layer, a laser irradiation method, a dry etching method, a wet etching method, or a dicing method may be used.

As the insulating material layer, $SiO_2$ materials such as $SiO_2$, SiON, SOG (spin-on glass), low-melting-point glass, and glass plate; and insulating resins such as polyimide and the like may be used alone or in appropriate combination. The insulating material layer may be formed by any one of various processes such as various CVD processes, a coating process, a sputtering process, various printing processes such as a screen printing process, and the like.

In related art, a plurality of first, second, and third light-emitting diodes are transferred to a display substrate, and then wiring is extended to first and second electrodes of the first, second, and third light-emitting diodes. On the other hand, according to an embodiment, a plurality of light-emitting units each including first, second, and third light-emitting diodes are transferred to a display substrate, the first electrodes of the light-emitting diodes being connected to a sub-common electrode. Therefore, wiring (common electrode) is easily extended to the second electrode of each of the first, second, and third light-emitting diodes. As a result, the process of manufacturing a light-emitting diode display may be simplified.

Additional features and advantages are described herein, and will be apparent from the following Detailed Description and the FIGS.

DETAILED DESCRIPTION

First Embodiment

A first embodiment relates to a light-emitting diode display according to an embodiment and a method for manufacturing same, and specifically relates to a method for manufacturing a light-emitting diode display according; to a first configuration.

Figure 1:
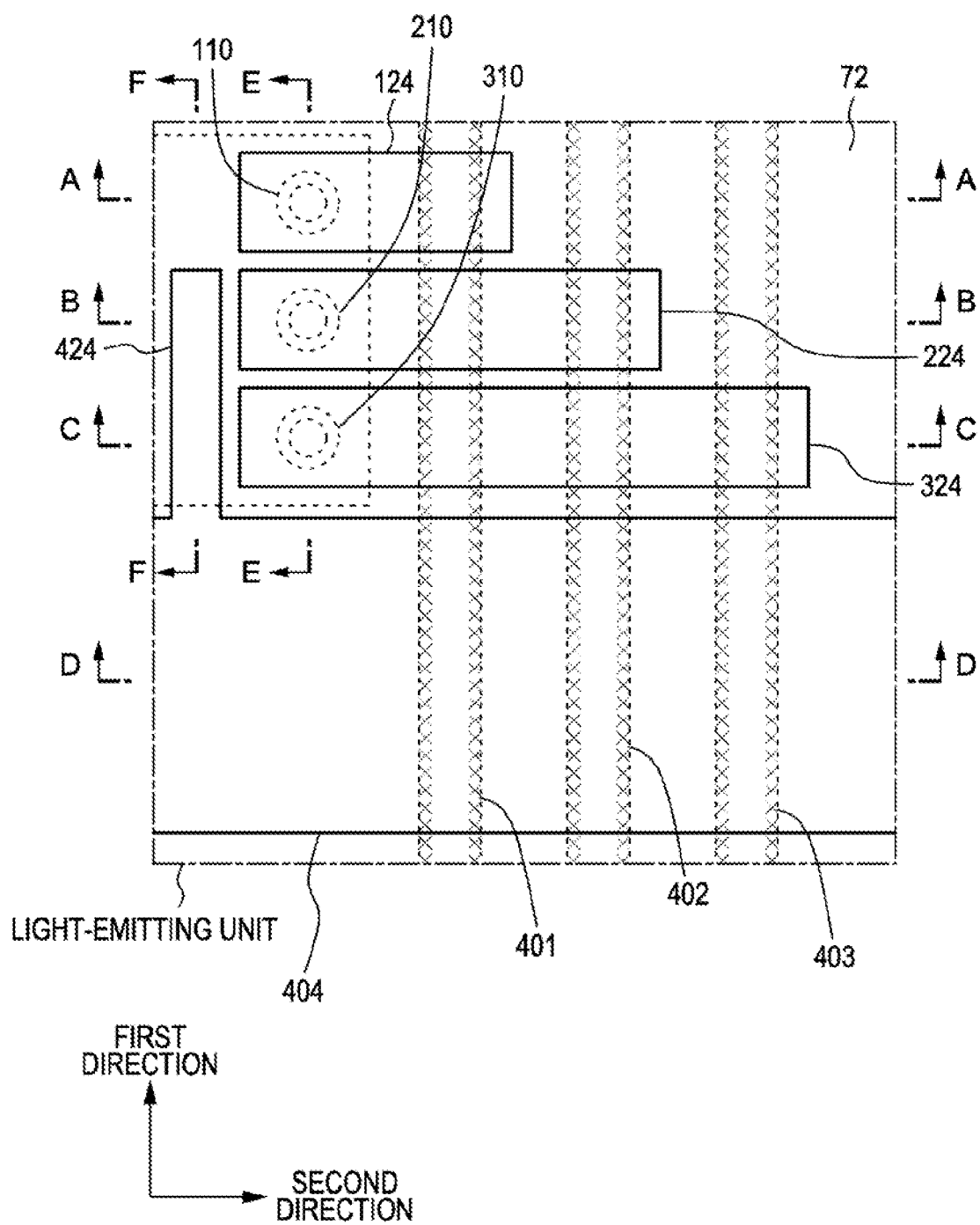
FIG. 1 is a schematic plan view showing one light-emitting unit in a light-emitting diode display according to a first embodiment.
Figure 2A:
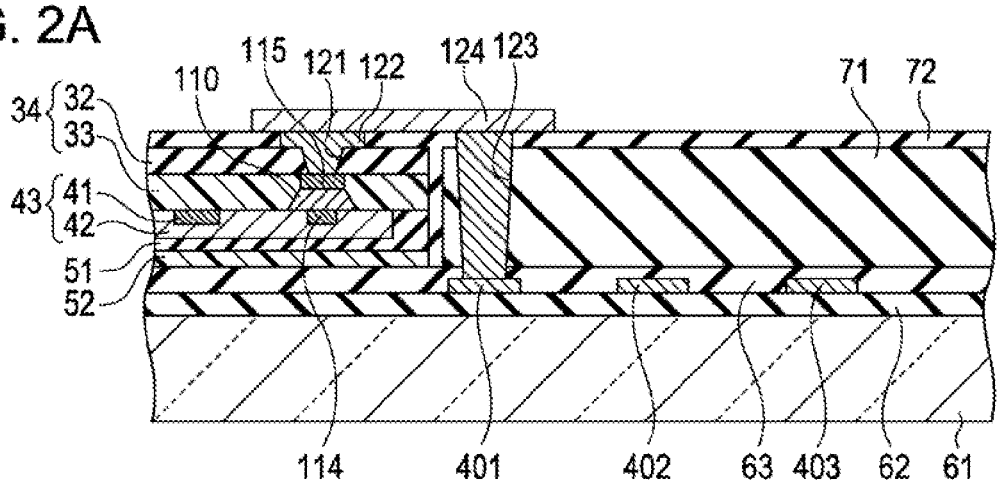
FIGS. 2A, 2B, and 2C are schematic partial sectional views of one light-emitting unit in the light-emitting diode display according to the first embodiment, taken along lines A-A, BB, and C-C, respectively, in FIG. 1.
Figure 2B:
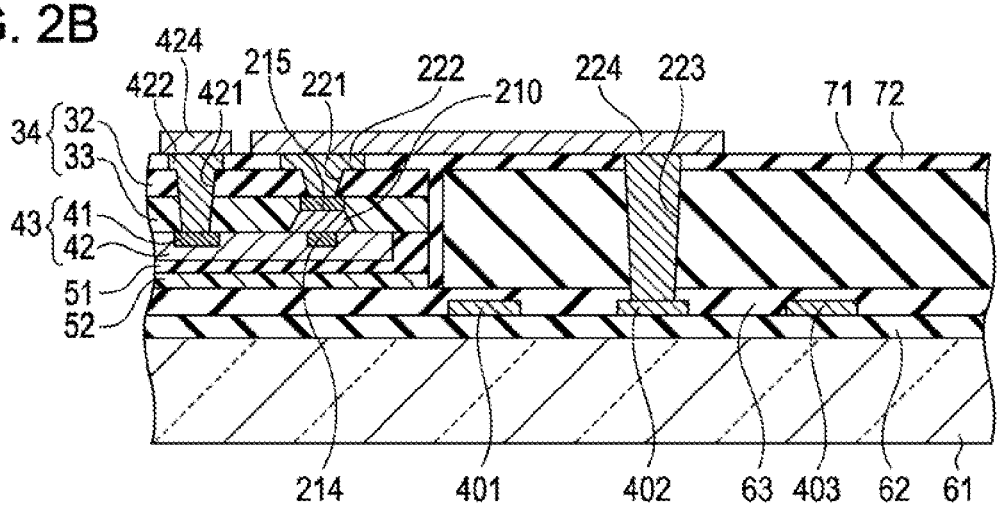
Figure 2C:
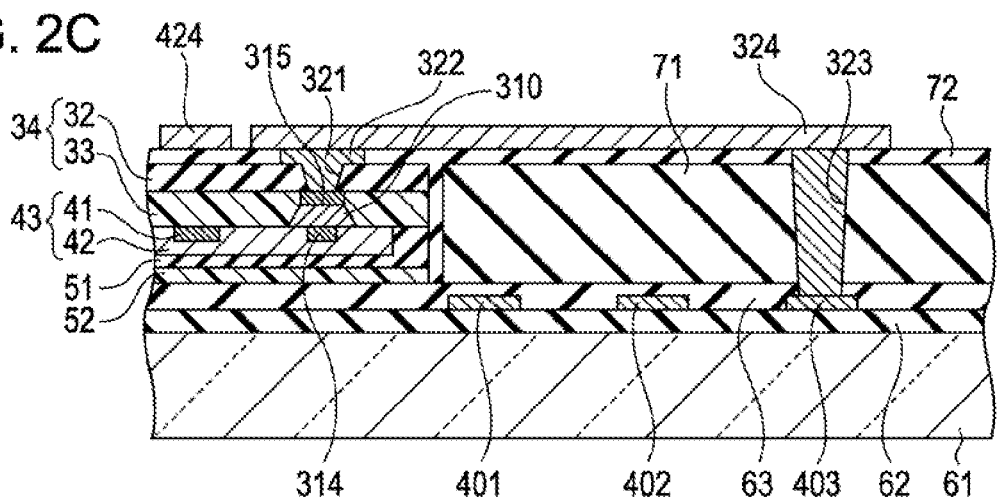
Figure 3A:
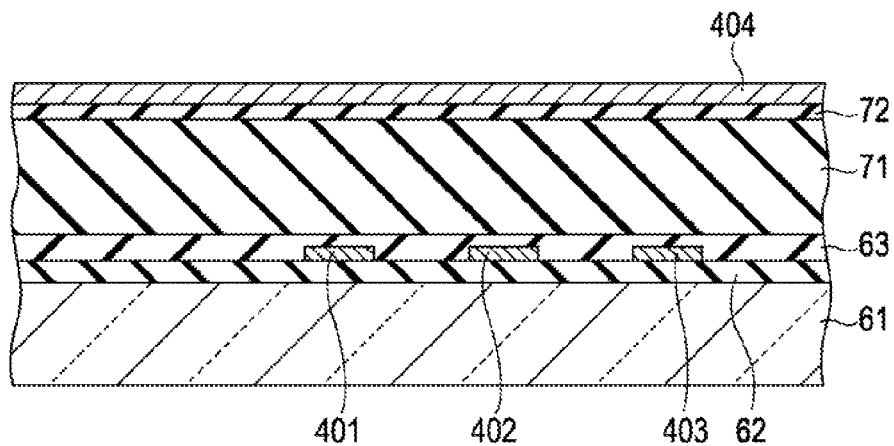
FIGS. 3A, 3B, and 3C are schematic partial sectional views of one light-emitting unit in the light-emitting diode display according to the first embodiment, taken along lines D-D, E-E, and F-F, respectively, in FIG. 1.
Figure 3B:
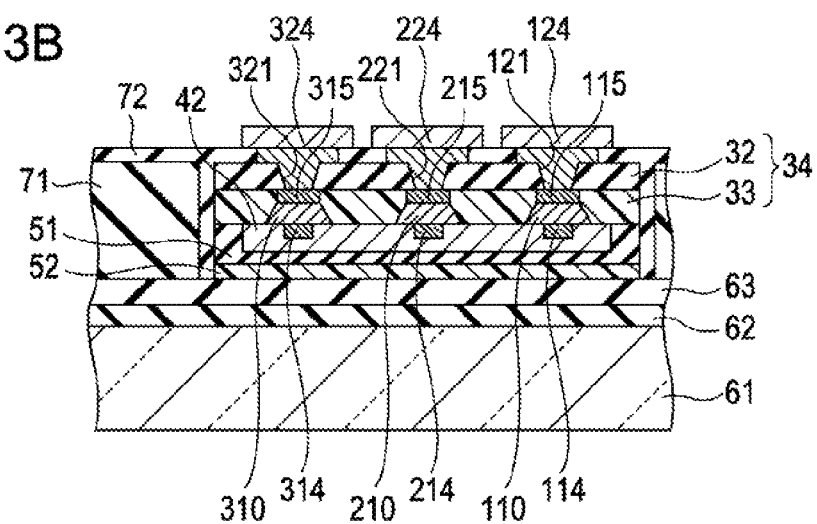
Figure 3C:
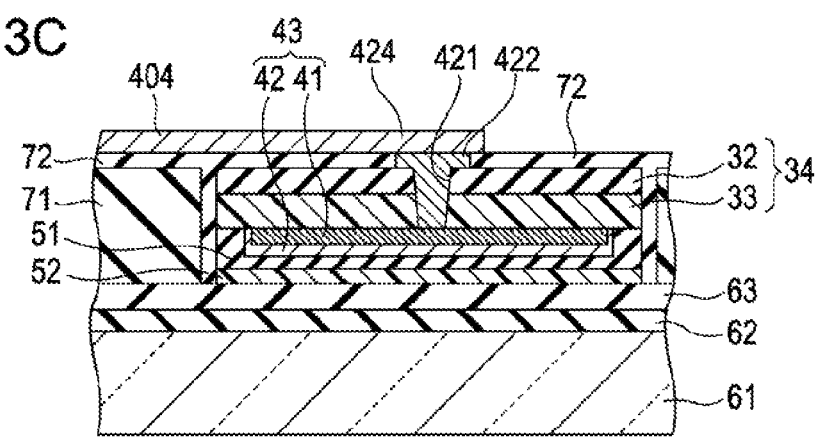
Figure 4A:
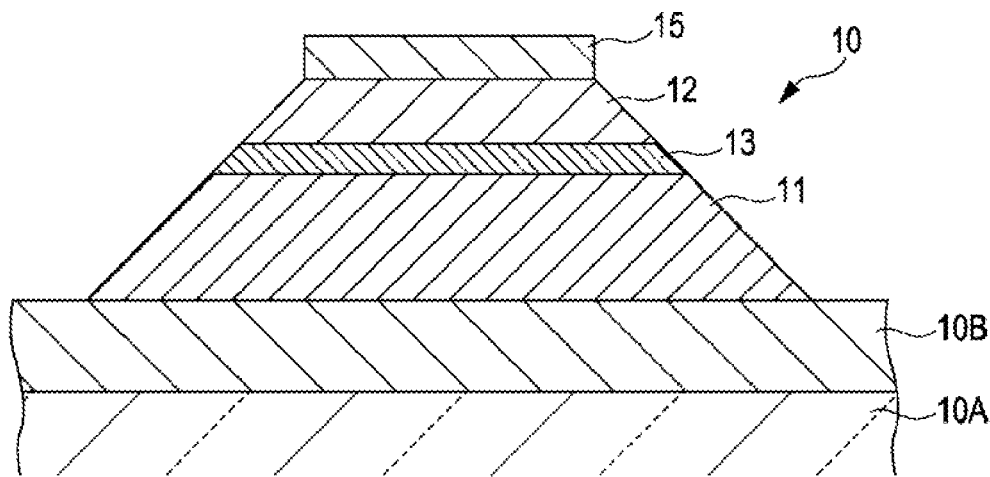
FIGS. 4A and 4B are each a schematic partial end view of light-emitting diodes and the like, for illustrating a method for manufacturing the light-emitting diode display according to the first embodiment.
Figure 4B:
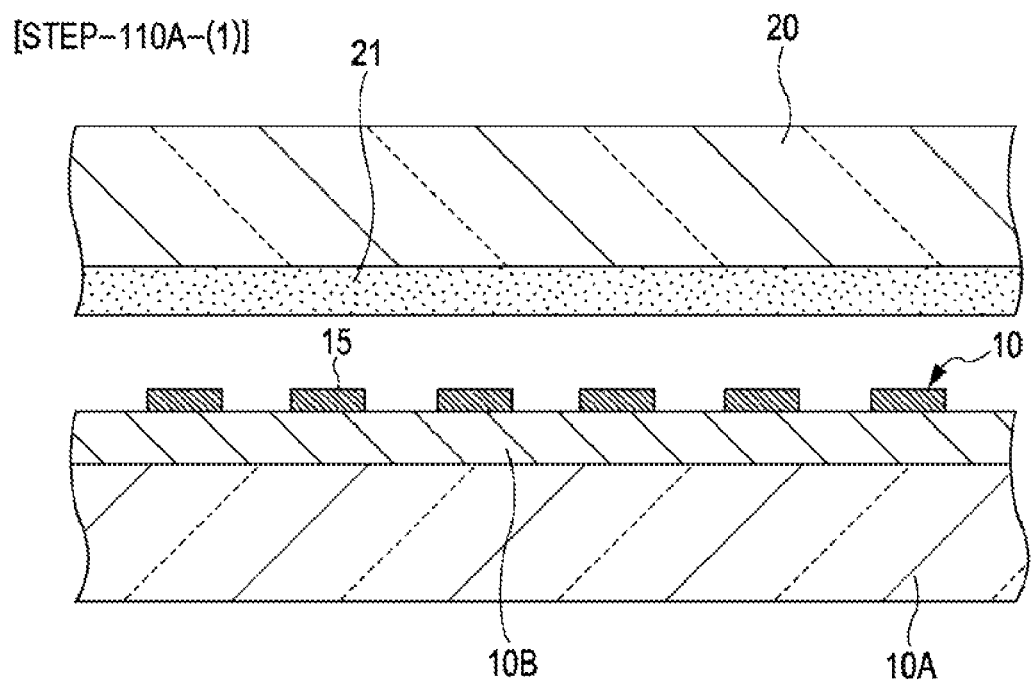

FIG. 1 is a schematic plan view showing one light-emitting unit. FIGS. 2A, 2B, and 2C are schematic partial sectional views taken along lines A-A. B-B, and C-C, respectively, in FIG. 1, FIGS. 3A, 3B, and 3C are schematic partial sectional views taken along lines D-D, E-E, and F-F, respectively, in FIG. 1. In FIG. 1, one light-emitting unit shown by a one-dot chain line, and a light-emitting diode is shown by a dotted line. In addition, the outer edges of first, second, and third common electrodes are cross-hatched, and the outer edges of a fourth common electrode and first, second, third, and fourth connection portions are shown by solid lines. Further, FIG. 4A is a schematic partial sectional view of a light-emitting diode.

A light-emitting diode display of the first embodiment includes a plurality of light-emitting units arranged in a first direction and a second direction perpendicular to the first direction, i.e., arranged in a two-dimensional matrix, each of the light-emitting units including a desired number of first light-emitting diodes 110 which emit red light, a desired number of second light-emitting diodes 210 which emit green light, and a desired number of third light-emitting diodes 310 which emit blue light.

Each of the first light-emitting diodes 110 which emit red light includes:
(a-1) a first compound semiconductor layer 11 having a first conductivity type (specifically, in this embodiment, n-type);
(a-2) an active layer 13;
(a-3) a second compound semiconductor layer 12 having a second conductivity type (specifically, in this embodiment, p-type) different from the first conductivity type;
(a-4) a first electrode 114 electrically connected to the first compound semiconductor layer 11; and
(a-5) a second electrode electrically 115 connected to the second compound semiconductor layer 12.

Each of the second light-emitting diodes which emit green light includes:
(b-1) a first compound semiconductor layer 11 having a first conductivity type;
(b-2) an active layer 13;
(b-3) a second compound semiconductor layer 12 having a second conductivity type different from the first conductivity type;

(b-4) a first electrode 214 electrically connected to the first compound semiconductor layer 11; and (b-5) a second electrode electrically 215 connected to the second compound semiconductor layer 12.

Each of the third light-emitting diodes which emit blue light includes:

(c-1) a first compound semiconductor layer 11 having a first conductivity type;

(c-2) an active layer 13;

(c-3) a second compound semiconductor layer 12 having a second conductivity type different from the first conductivity type 11;

(c-4) a first electrode 314 electrically connected to the first compound semiconductor layer 11; and (c-5) a second electrode 315 electrically connected to the second compound semiconductor layer 12.

The first electrodes 114 of the first light-emitting diodes 110, the first electrodes 214 of the second light-emitting diodes 210, and the first electrodes 314 of the first light-emitting diodes 310 in each light-emitting unit are connected to a sub-common electrode 43. On the other hand, the second electrodes 115 of the first first-light emitting diodes 110 of each of the light-emitting units arranged along the first direction are connected to a first common electrode (first common wiring) 401 extending along the first, direction. Further, the second electrodes 215 of the second first-light emitting diodes 210 are connected to a second common electrode (second common, wiring) 402 extending along the first direction. Further, the second electrodes 315 of the third first-light emitting diodes 310 are connected to a third common electrode (second common wiring) 403 extending along the first direction. In addition, the sub-common electrodes 43 of the light-emitting units arranged along the second direction are connected to a fourth common electrode (fourth common wiring) 404 extending along the second direction.

The first, second, and third common electrodes 401, 402, and 403 are formed on a display substrate 61, and the sub-common electrodes 43 are formed in a fixed layer 34 fixed on the display substrate 61. Further, the first, second, and third light-emitting diodes 110, 210, and 310 in each of the light-emitting units are fixed in the fixed layer 34, the fixed layer 34 being surrounded by an insulating material layer 71. The insulating material layer 71 covers the first, second, and third common electrodes 401, 402, and 403 which are formed on the display substrate 61.

In the light-emitting diode display of the first embodiment, light emitted from the first, second, and third light-emitting diodes 110, 210, and 310 is emitted from the first electrode side. The sub-common electrodes 43 have a light-transmitting structure. The sub-common electrodes 43 may include metal layers or alloy layers. Alternatively, the sub-common electrodes 43 may include light-transmitting electrodes 42 and metal layers 41 extending from the light-transmitting electrodes 42. Further, the first, second, and third light-emitting diodes 110, 210, and 310 in each light-emitting unit are arranged on the sub-common electrode 43 while the first electrodes 114, 214, and 314 are connected to the sub-common electrode 43. Specifically, the first electrodes 114, 214, and 314 of the first, second, and third light-emitting diodes 110, 210, and 310 are in contact with the light-transmitting electrodes 42. More specifically, the light-transmitting electrodes 42 are formed on the first electrodes 114, 214, and 314 and in the peripheries of the first electrodes 114, 214, and 314. On the other hand, fourth contact holes 421 are in contact with the metal layers 41. Specifically, the fourth contact holes 421 are formed on the metal layers 41. The light-transmitting electrodes 42 are composed of a transparent conductive material, while the metal layers 41 are composed of, for example, a metal wiring material such as Au, Cu, or Al.

The second electrodes 115 of the first light-emitting diodes 110 are connected to the first common electrode 401 through first contact holes 121 formed in the fixed layer 34 and first connection portions 124 formed from the fixed layer 34 to the insulating material layer 71. The second electrodes 215 of the second light-emitting diodes 210 are connected to the second common electrode 402 through second contact holes 221 formed in the fixed layer 34 and second connection portions 224 formed from the fixed layer 34 to the insulating material layer 71. The second electrodes 315 of the third light-emitting diodes 310 are connected to the third common electrode 403 through third contact holes 321 formed in the fixed layer 34 and third connection portions 324 formed from the fixed layer 34 to the insulating material layer 71. The sub-common electrodes 43 are connected to the fourth common electrode 404 formed on the insulating material layer 71 through fourth contact holes 421 formed in the fixed Saver 34 and fourth connection portions 424 formed from the fixed layer 34 to the insulating material layer 71. In the first embodiment, first pad portions 122 are formed in the fixed layer 34 to be disposed between the first contact holes 121 and the first connection portions 124. In addition, second pad portions 222 are formed in the fixed layer 34 to be disposed between the second contact holes 221 and the second connection portions 224. Further, third pad portions 322 are formed in the fixed layer 34 to be disposed between the third contact holes 321 and the third connection portions 324. Further, fourth pad portions 422 are formed in the fixed layer 34 to be disposed between the fourth contact holes 421 and the fourth connection portions 424.

In the light-emitting diode display according to the first embodiment, the size (area $S_P$) of the first, second, and third pad portions 122, 222, and 322 is larger than the size (area $S_E$) of the second electrodes 115, 215, and 315 of the first, second, and third diodes 110, 210, and 310. Specifically, $S_P/S_E=2$.

Further, the light-emitting diode display according to the first embodiment satisfies the following relationships:

$$L_{U-1}/L_{P-1} \leq 0.5$$

$$L_{U-2}/L_{P-2} \leq 0.5,$$

wherein $L_{P-1}$ and $L_{P-2}$ are the lengths along the first direction and the second direction, respectively, of one pixel including the first light-emitting diode 110 which emits red light, the second light-emitting diode 210 which emits green light, and the third light-emitting diode 310 which emits blue light, and $L_{U-1}$ and $L_{U-2}$ are the lengths along the first direction and the second direction, respectively, of one light-emitting unit. More specifically, $$L_{U-1}/L_{P-1}=2$$

$$L_{U-2}/L_{P-2}=4.$$

In addition, the light-emitting diode display according to the first embodiment satisfies the following relationship:

$$2.5 \times 10^{-11} \, m^2 \leq S_{max} \leq 1 \times 10^{-8} \, m^2$$

wherein $S_{max}$ is the area of the emission surface of the largest light-emitting diodes among the first, second, and third light-emitting diodes 110, 210, and 310. More specifically, $$S_{max}=1 \times 10^{-10} \, m^2.$$

Further, the light-emitting diode display according to the first embodiment satisfies the following relationship:

$$3 \times 10^0 \leq S_{Unit}/S_{Total} \leq 1.3 \times 10^4,$$

wherein $S_{Total}$ is the total area of the light emission surfaces of the first, second, and third light-emitting diodes 110, 210, and 310 in one light-emitting unit, and $S_{Unit}$ is the area of one light-emitting unit. More specifically, $$S_{Unit}/S_{Total}=1.3\times10^1.$$

Further, when the desired number of the first light-emitting diodes constituting one light-emitting unit is $N_1$, the desired number of the second light-emitting diodes constituting one light-emitting unit is $N_2$, and the desired number of the third light-emitting diodes constituting one light-emitting unit is $N_3$, a combination of ($N_1$, $N_2$, $N_3$) is (1, 1, 1).

In the first embodiment, the first compound semiconductor layer 11, the active layer 13, and the second compound semiconductor layer 12 in each of the first light-emitting diodes 110 which emit red light are composed of AlGaInP compound semiconductors. The first compound semiconductor layer 11, the active layer 13, and the second compound semiconductor layer 12 in each of the second light-emitting diodes 210 which emit green light are composed of InGaN compound semiconductors. The first compound semiconductor layer 11, the active layer 13, and the second compound semiconductor layer 12 in each of the third light-emitting diodes 310 which emit blue light are composed of InGaN compound semiconductors.

The first compound semiconductor layers 11 are electrically connected to the respective first electrodes 114, 214, and 314. Specifically, the first electrodes 114, 214, and 31.4 are formed on the respective first compound semiconductor layers 11. Similarly, the second compound semiconductor layers 12 are electrically connected to the respective second electrodes 115, 215, and 315. Specifically, the second electrodes 115, 215, and 315 are formed on the respective second compound semiconductor layers 12. In the first embodiment, the first conductivity type is n-type, and the second conductivity type is p-type. Therefore, the first electrodes 114, 214, and 314 are n-side electrodes, and the second electrodes 115, 215, and 315 are p-side electrodes. Specifically, the second electrodes 115, 215, and 315 are composed of an ohmic contact material such as Ni or the like, and the first electrodes 114, 214, and 314 are composed of an ohmic contact material such as Ti or the like. In addition, the first, second, third, and fourth common electrodes 401, 402, 403, and 404 are composed of a wiring material such as Al, Cu, or the like. Further, the first, second, third, and fourth contact holes 121, 221, 321, and 421 are composed of a wiring material such as Al, Cu, or the like. The first, second, third, and fourth pad portions 122, 222, 322, and 422 are composed of a wiring material such as Al, Cu, or the like. The first, second, third, and fourth connection portions 124, 224, 324, and 424 are composed of a wiring material such as Al, Cu, or the like.

The fixed layer 34 has a two-layer structure including, for example, an insulating layer 32 and a burying material layer 33 provided in order from the first transfer substrate side. The insulating layer 32 is composed of polyimide resin, and the burying material layer 33 is composed of ultraviolet curable resin. The insulating material layer 77 is composed of polyimide resin.

A method for manufacturing the light-emitting diode display according to the first embodiment, specifically a method for manufacturing the light-emitting diode display according to a first configuration, is described with reference to FIGS. 4A, 4B, 5A, 5B, 6A, 8B, 7A, 7B, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, and 17C. In addition, FIGS. 8A, 9A, 10A, 11A, 12A, 13A, 14A, 15A, 16A, and 17A are schematic partial end views equivalent to a sectional view taken along line B-B in FIG. 1. FIGS. 8B, 9B, 10B, 11B, 12B, 13B, 14B, 15B, 16B, and 17B are schematic partial end views equivalent, to a sectional view taken along line E-E in FIG. 1. FIGS. 8C, 9C, 10C, 11C, 12C, 13C, 14C, 15C, 16C, and 17C are schematic partial end views equivalent to a sectional view taken along line F-F in FIG. 1.

[Step-100]

First, the light-emitting diodes (110, 210, 310) are manufactured by a usual method. Namely, a plurality of first light-emitting diodes 110 which emit red light are provided on a first light-emitting diode production substrate, the first light-emitting diodes 110 each including the following components:

(a-1) the first compound semiconductor layer 11 having a first conductivity type (specifically, in the first embodiment, n-type);
(a-2) the active layer 13;
(a-3) the second compound semiconductor layer 12 having a second conductivity type (specifically, in the first embodiment, p-type) different from the first conductivity type;
(a-4) the first electrode 114 electrically connected to the first compound semiconductor layer 11; and
(a-5) the second electrode 115 electrically connected to the second compound semiconductor layer 12.

In addition, a plurality of second light-emitting diodes 210 which emit green light are provided on a second light-emitting diode production substrate, the second light-emitting diodes 210 each including the following components:

(b-1.) the first compound semiconductor layer 11 having a first conductivity type,
(b-2) the active layer 13;
(b-3) the second compound semiconductor layer 12 having a second conductivity type different from the first conductivity type;
(b-4) the first electrode electrically 214 connected to the first compound semiconductor layer 11; and
(b-5) the second electrode electrically 215 connected to the second compound semiconductor layer 12.

Further, a plurality of third light-emitting diodes 310 which emit blue light are provided on a third light-emitting diode production substrate, the third light-emitting diodes 310 each including the following components:

(c-1) the first compound semiconductor layer 11 having a first conductivity type;
(c-2) the active layer 13;
(c-3) the second compound semiconductor layer 12 having a second conductivity type different from the first conductivity type;
(c-4) the first electrode electrically 314 connected to the first compound semiconductor layer 11; and
(c-5) the second electrode electrically 315 connected to the second compound semiconductor layer 12, Specifically, a buffer layer 10B is formed on a light-emitting diode production substrate 10A including, for example, a sapphire substrate having a nominal diameter of 2 inches, on the basis of a MOCVD method. Further, the first compound semiconductor layer 11 having n-conductivity type, the active layer 13, and the second compound semiconductor layer 12 having p-conductivity type are formed in order on the buffer layer 10B on the basis of a MOCVD method. Then, the first compound semiconductor layer 11, the active layer 13, and the second compound semiconductor layer 12 are patterned, and the second electrode 15 (115, 215, 315) as the p-side electrode is further formed on the second compound semiconductor layer 12 by a lift-off method and vacuum evaporation method. As a result, a light-emitting diode 10 (110, 210, 310) having a laminated structure including the first compound semiconductor layer 11, the active layer 13, the second compound semiconductor layer 12, and the second electrode 15 (115, 215, 315) is produced (refer to FIG. 4A).

(Step-110)

Then, the first, second, and third light-emitting diodes 110, 210, and 310 are pre-fixed to a light-emitting unit production substrate 53 to prepare light-emitting units each including a desired number of the first light-emitting diodes 110, a desired number of the second light-emitting diodes 210, and a desired number of the third light-emitting diodes 310, the first electrodes 114, 214, and 314 of the first, second, and third light-emitting diodes 110, 210, and 310 being connected to the sub-common electrode 43.

[Step-110A]

Specifically, the first light-emitting diodes 110 on the first light-emitting diode production substrate are transferred to the fixing layer 34, the second light-emitting diodes 210 on the second light-emitting diode production substrate are transferred to the fixing layer 34, and the third light-emitting diodes 310 on the third light-emitting diode production substrate are transferred to the fixing layer 34, The transfer order is basically an arbitrary order. For the transfer, a first transfer substrate 31 provided with the fixed layer 34 is prepared. As described above, the fixed layer 34 has a two-layer structure including the insulating layer 32 and the burying material layer 33 provided in order from the first transfer substrate side. The insulating layer 32 is composed of polyimide resin, and the burying material layer 33 is composed of photosensitive resin. A portion of the burying material layer 33 in which the first, second, and third light-emitting diodes 110, 210, and 310 to be buried is not cured, and the other portion of the burying material layer 33 is cured.

[Step-110A-(1)]

Figure 5A:
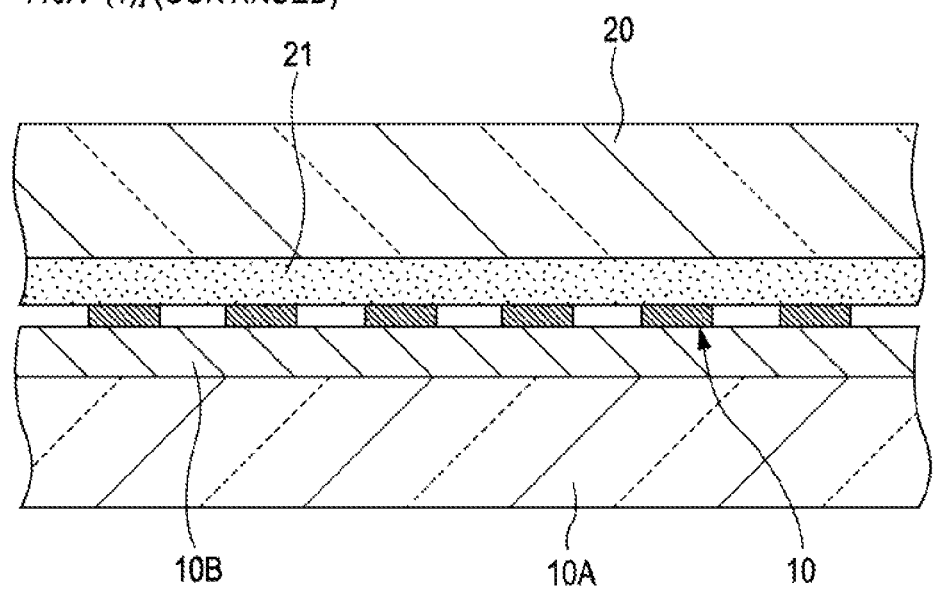
FIGS. 5A and 5B are each a schematic partial end view of light-emitting diodes and the like, for illustrating the method for manufacturing the light-emitting diode display according to the first embodiment in succession to FIG. 4B.
Figure 5B:
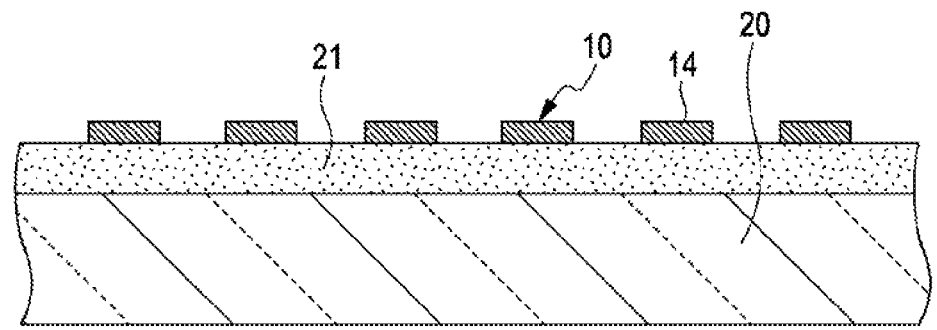

First, a pre-fixing substrate 20 is bonded to be in contact with the second electrodes 15 (115, 215, 315), and then the light-emitting diode production substrate 10A is removed from the light-emitting diodes 10 (110, 210, 310). Then, the first electrodes 14 (114, 214, 314) as the n-side electrodes are formed on the exposed first compound semiconductor layers 11. Specifically, first, the second electrodes 15 (115, 215, 315) are bonded to the pre-fixing substrate 20 (refer to FIGS. 4B and 5A). More specifically, the pre-fixing substrate 20 including a glass substrate which has an adhesive layer 21 formed on a surface thereof and composed of a uncured adhesive is prepared. Then, the second electrodes 15 (115, 215, 315) are bonded to the adhesive layer 21, and then the adhesive layer 21 is cured. Then, the light-emitting diode production substrate 10A is removed from the light-emitting diodes 10 (110, 210, 310). Specifically, the interface between the light-emitting diodes 10 (110, 210, 310) (more specifically, the first, compound semiconductor layers 11) and the light-emitting diode production substrate 10A is irradiated with an excimer laser through the light-emitting diode production substrate 10A. As a result, laser abrasion occurs, resulting in the separation of the light-emitting diode production substrate 10A from the light-emitting diodes 10 (110, 210, 310). Then, the first electrodes 14 (114, 214, 314) as the n-side electrodes are formed on the respective first compound semiconductor layers 11 by a lift-off method and a vacuum evaporation method. Consequently, the structure shown in FIG. 5B is prepared.

[Step-110A-(2)]

Figure 6A:
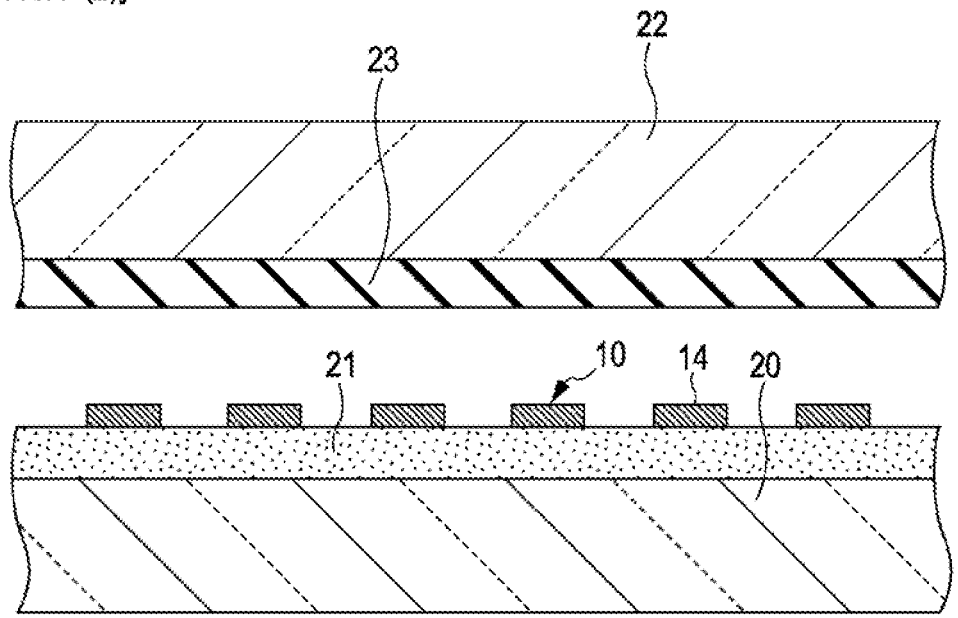
FIGS. 6A and 6B are each a schematic partial end view of light-emitting diodes and the like, for illustrating the method for manufacturing the light-emitting diode display according to the first embodiment in succession to FIG. 5B.
Figure 6B:
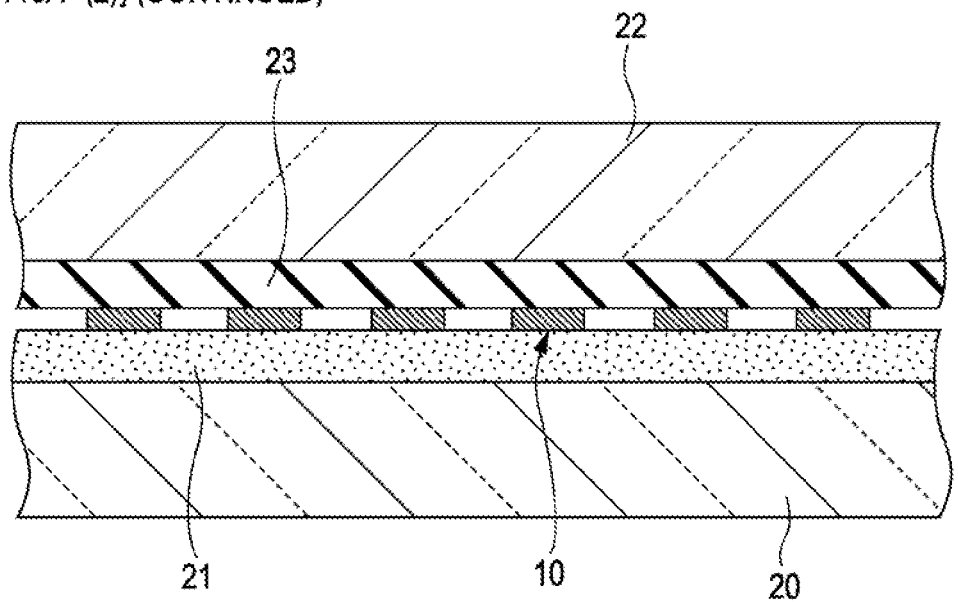
Figure 7A:
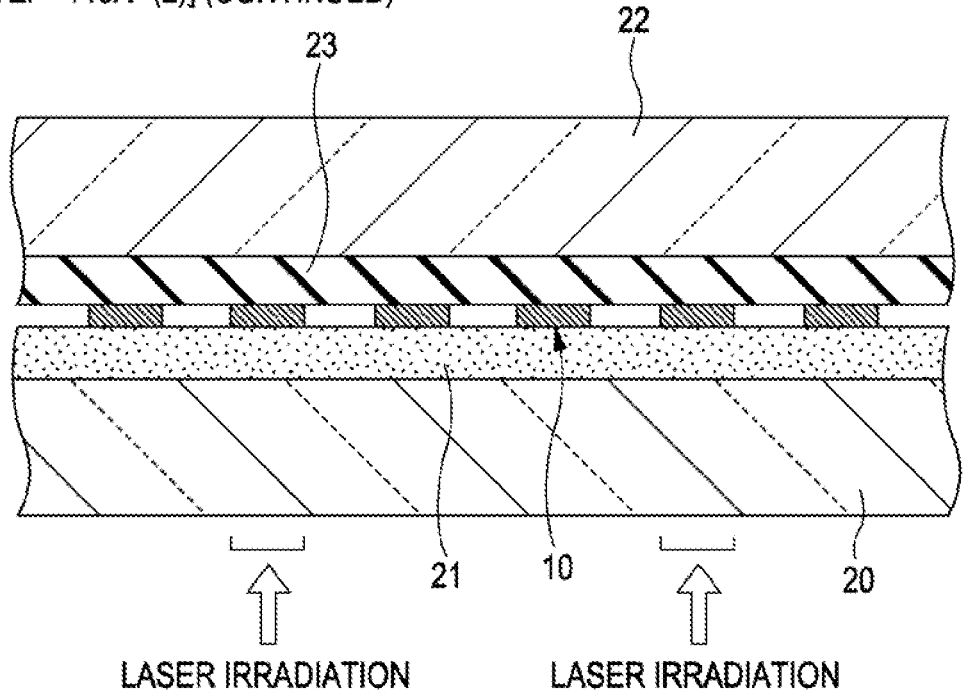
FIGS. 7A and 7B are each a schematic partial end view of light-emitting diodes and the like, for illustrating the method for manufacturing the light-emitting diode display according to the first embodiment in succession to FIG. 6B.
Figure 7B:
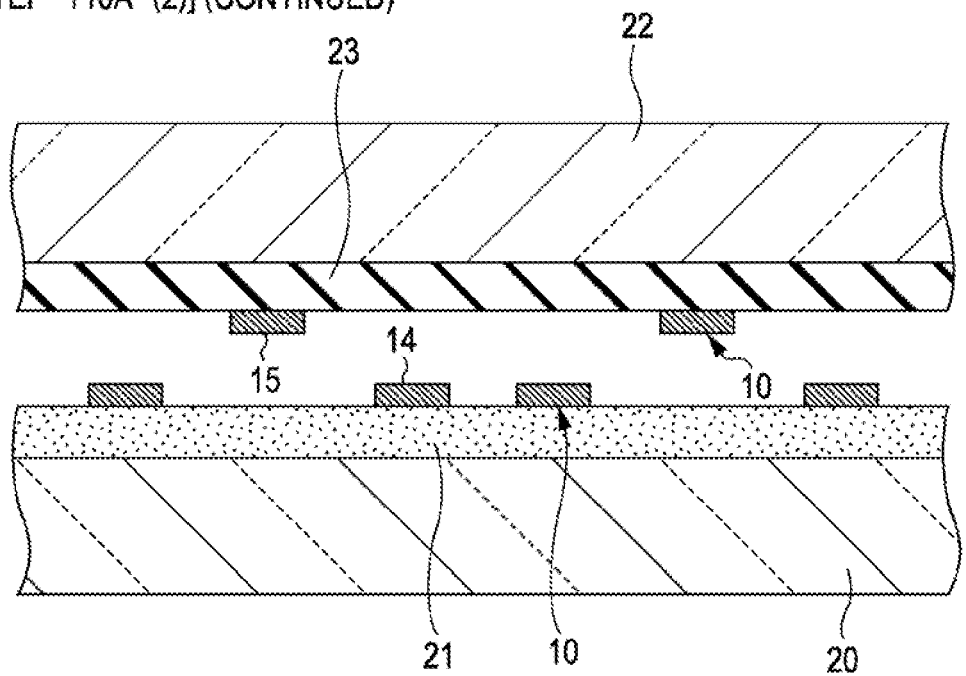
Figure 8A:
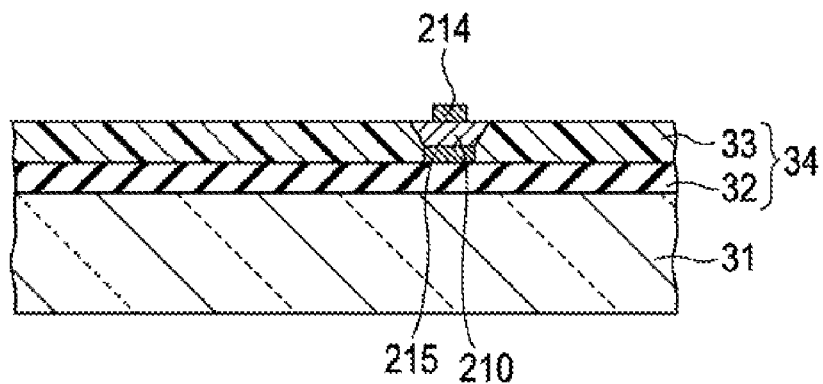
FIGS. 8A, 8B, and 8C are schematic partial end views equivalent to those taken along lines B-B, E-E, and F-F, respectively, in FIG. 1, for illustrating the method for manufacturing the light-emitting diode display according to the first embodiment.
Figure 8B:
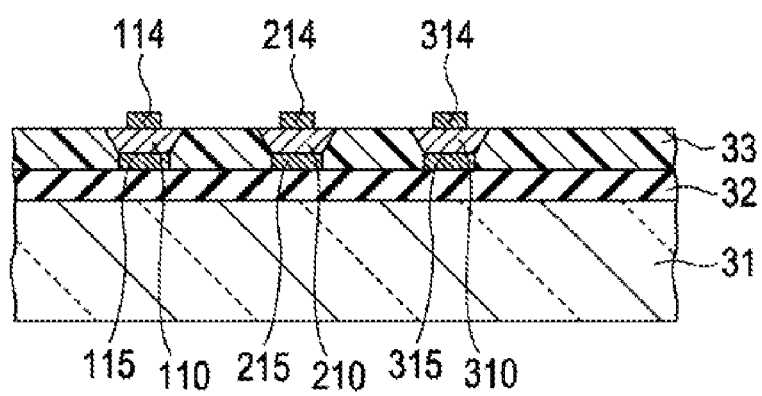
Figure 8C:
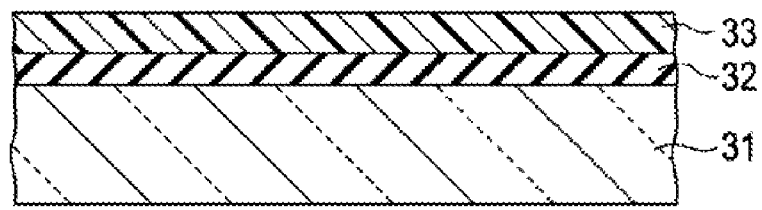
Figure 34A:
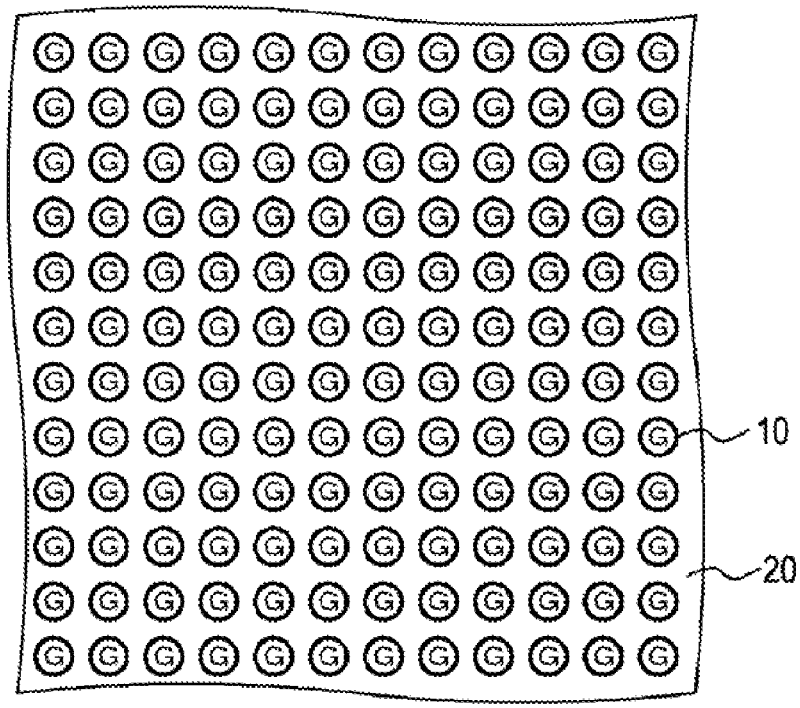
FIGS. 34A and 34B are schematic partial plan views, for illustrating the method for manufacturing the light-emitting diode display according to the first embodiment.
Figure 34B:
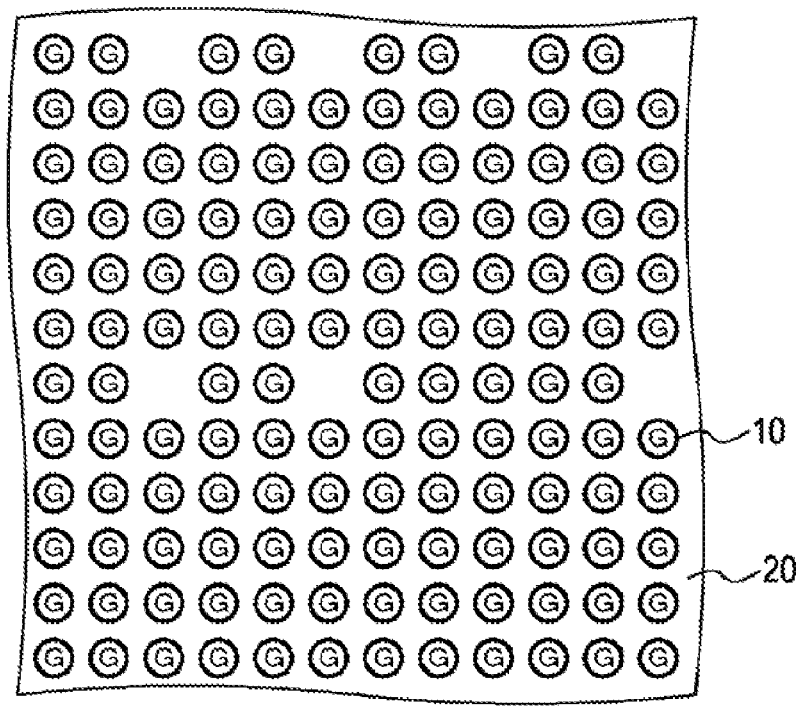
Figure 35A:
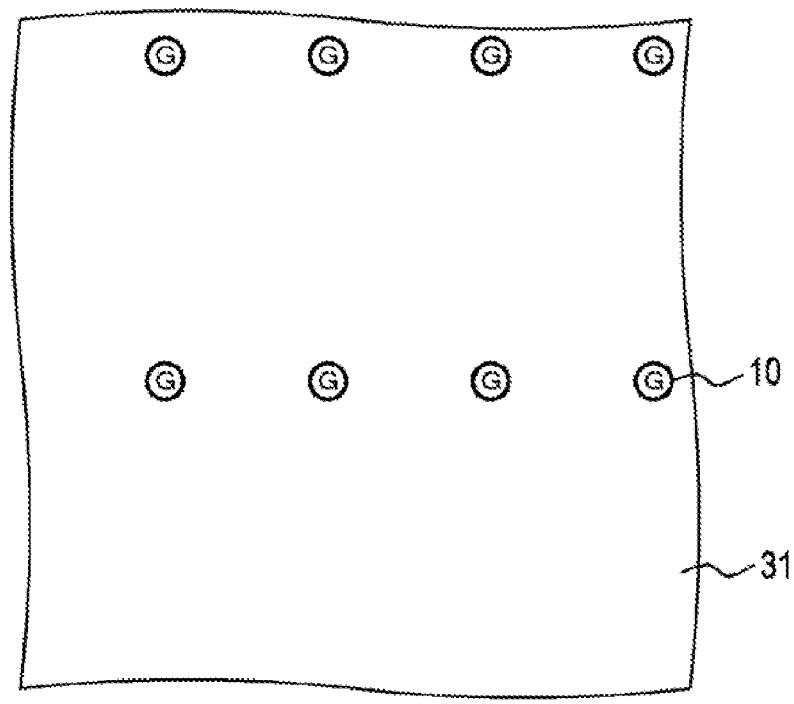
FIGS. 35A and 35B are schematic partial plan views, for illustrating the method for manufacturing the light-emitting diode display according to the first embodiment.
Figure 35B:
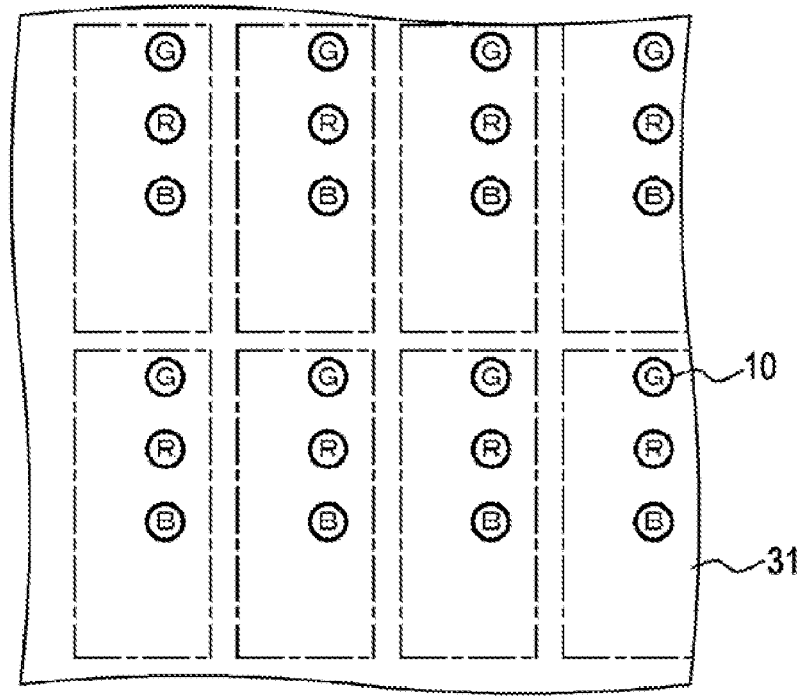

Next, desired light-emitting diodes 10 (110, 210, 310) are transferred, to an intermediate substrate 22 from the pre-fixing substrate 20. That is, the light-emitting diodes 10 (110, 210, 310) bonded to the pre-fixing substrate 20 are adhered to the intermediate substrate 22. Specifically, first, a slightly adhesive layer 23 formed on a surface of the intermediate substrate 22 including a glass substrate is pressed on the light-emitting diodes 10 (110, 210, 310) on the pre-fixing substrate 20 on which the light-emitting diodes 10 are left in an array (two-dimensional matrix) as schematically shown in FIG. 34A (refer to FIGS. 6A and 6B). In FIGS. 34A, 34B, 35A, and 35B, a circle shown by "G" at the center represents the second light-emitting diode 210 which emits green light. In FIG. 35B, a circle shown by "R" at the center represents the first light-emitting diode 110 which emits red light, and a circle shown by "B" at the center represents the third light-emitting diode 310 which emits blue light. The slightly adhesive layer 23 is composed of, for example, silicone rubber. The intermediate substrate 22 is supported by a positioning device (not shown) so that the positional relationship between the intermediate substrate 22 and the pre-fixing substrate 20 is controlled by operating the positioning device. Next, the light-emitting diodes 10 (110, 210, 310) to be mounted are irradiated with, for example, an excimer laser from the back of the pre-fixing substrate 20 (refer to FIG. 7A). As a result, laser abrasion occurs to separate the light-emitting diodes 10 (110, 210, 310) irradiated with an excimer laser from the pre-fixing substrate 20. Then, the intermediate substrate 22 is separated from the light-emitting diodes 10 to obtain the light-emitting diodes 10 separated from the pre-fixing substrate 20 and adhering to the slightly adhesive layer 23 (refer to FIG. 7B). FIG. 34B schematically shows the state of the pre-fixing substrate 20 in which one of every six light-emitting diodes in the first direction is separated and adheres to the slightly adhesive layer 23, and one of every three light-emitting diodes in the second direction is separated and adheres to the slightly adhesive layer 23.

Then, the light-emitting diodes 10 (110, 210, 310) are arranged (moved or transferred) on the burying material layer 33. Specifically, the light-emitting diodes 10 (110, 210, 310) are arranged on the burying material layer 33 of the first transfer substrate 31 from the intermediate substrate 22 on the basis of an alignment mark formed on the first transfer substrate 31. Since the light-emitting diodes 10 (110, 210, 310) weakly adhere to the slightly adhesive layer 23, the light-emitting diodes 10 (110, 210, 310) are left on the uncured burying material layer 33 by bringing (pressing) the light-emitting diodes 10 (110, 210, 310) into contact with the burying material layer and moving the intermediate substrate 22 away from the first transfer substrate 31. Further, the light-emitting diodes 10 (110, 210, 310) are buried deeply in the burying material layer 33 using a roller or the like to fix (arrange) the light-emitting diodes 10 (110, 210, 310) in the fixed layer 34. FIG. 35A schematically shows the state of the first transfer substrate 31.

For convenience sake, the method using the intermediate substrate 22 is referred to as the "step transfer method". When such a step transfer method is repeated a desired number of times, desired numbers of the light-emitting diodes 10 (110, 210, 310) adhere in a two-dimensional matrix to the slightly adhesive layer 23 and transferred to the first, transfer substrate 31. Specifically, in the first embodiment, in one time of step transfer, 1.0800 (=120×90) light-emitting diodes 10 (110, 210, 310) adhere in a two-dimensional matrix to the slightly adhesive layer 23 and transferred to the first transfer substrate 31. This operation is repeated (4×3) times. Further, transfer to the first transfer substrate 31 is performed for the first, second, and third light-emitting diodes 110, 210, and 310, and thus the transfer is performed a total of 36 times (=4×3×3). As a result, predetermined numbers of red light-emitting diodes, green light-emitting diodes, and blue light-emitting diodes are mounted at predetermined intervals (pitch) on the first transfer substrate 31. This state of the first transfer substrate 31 is schematically shown in FIG. 35B. In FIG. 35B, each light-emitting unit is surrounded by a one-dot chain line. Finally, the light-emitting units are transferred and fixed to a display substrate 61 to produce a light-emitting diode display including a plurality of light-emitting units which are arranged in the first direction and the second direction perpendicular to the first direction, i.e., arranged in a two-dimensional matrix. In this case, when 129600 (=480×270) light-emitting units are transferred to the display substrate 61 at each time, 16 times of transfer produce a light-emitting diode display including (1920×1080) light-emitting units.

Then, the uncured burying material layer 33 composed of a photosensitive resin in which the light-emitting diodes 10 (110, 210, 310) have been arranged is irradiated with ultraviolet light to cure the photosensitive resin constituting the burying material layer 33. As a result, the light-emitting diodes 10(110, 210, 310) are fixed to the burying material layer 33 (refer to FIGS. 8A, 8B, and 8C). In this state, the first electrodes 14 (114, 214, 314) of the light-emitting diodes 10 (110, 210, 310) are exposed.

[Step-110B]

Figure 9A:
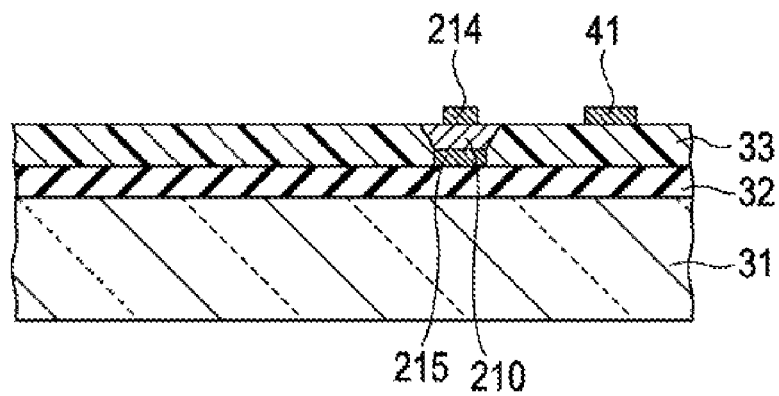
FIGS. 9A, 9B, and 9C are schematic partial end views equivalent to those taken along lines B-B, E-E, and F-F, respectively, in FIG. 1, for illustrating the method for manufacturing the light-emitting diode display according to the first embodiment in succession to FIGS. 8A, 8B, and 8C, respectively.
Figure 9B:
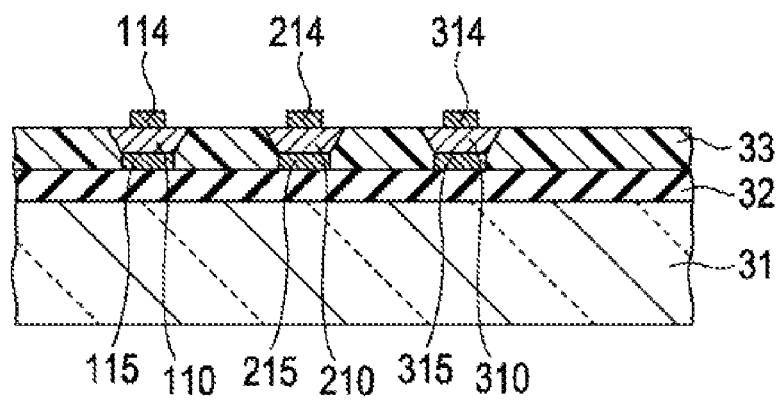
Figure 9C:
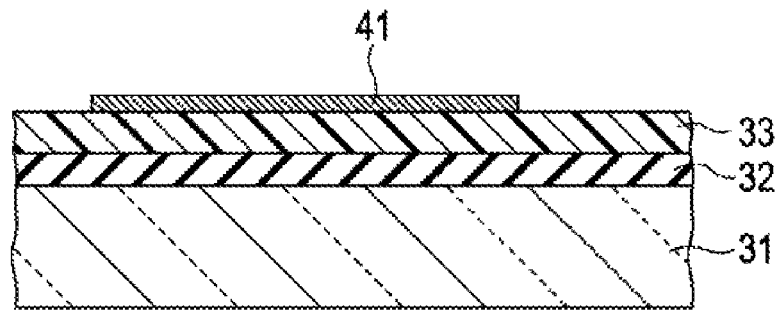
Figure 10A:
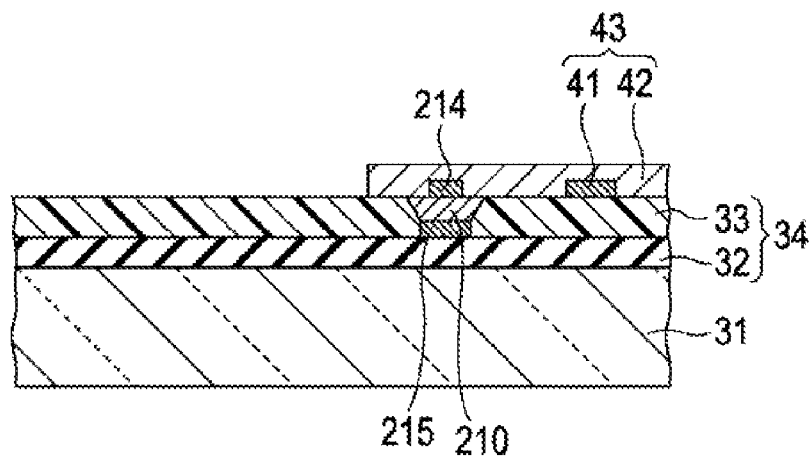
FIGS. 10A, 10B, and 10C are schematic partial end views equivalent to those taken along lines B-B, E-E, and F-F, respectively, in FIG. 1, for illustrating the method for manufacturing the light-emitting diode display according to the first embodiment in succession to FIGS. 9A, 98, and 9C, respectively.
Figure 10B:
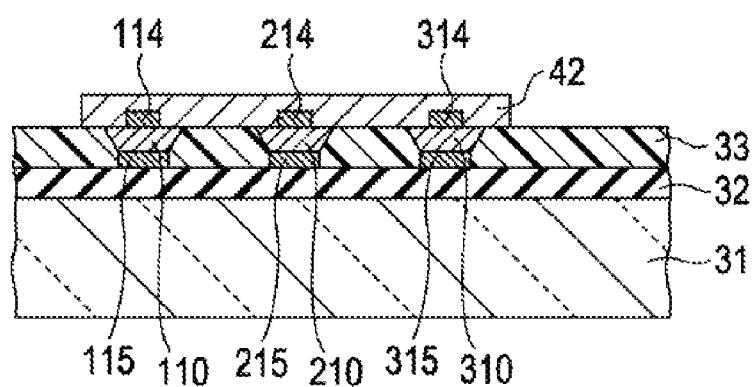
Figure 10C:
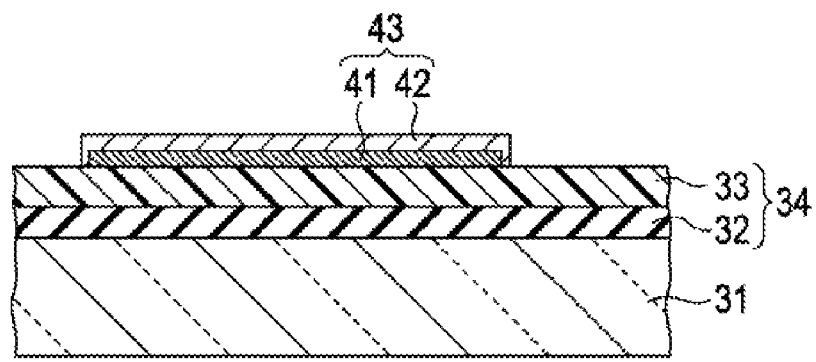
Figure 11A:
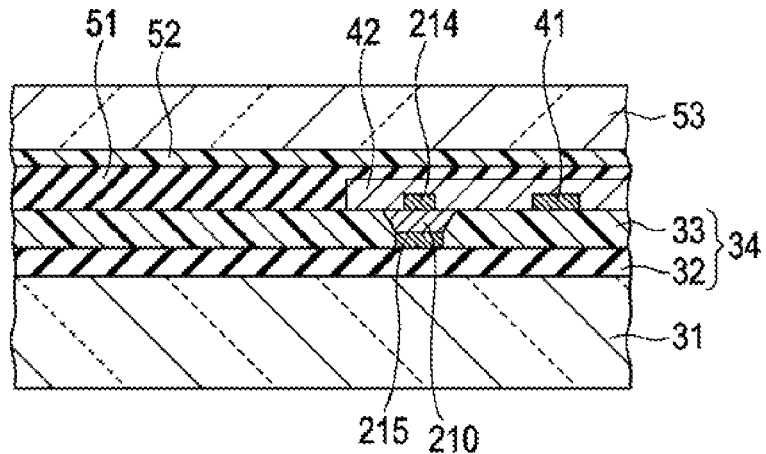
FIGS. 11A, 11B, and 11C are schematic partial end views equivalent to those taken along lines B-B, E-E, and F-F, respectively, in FIG. 1, for illustrating the method for manufacturing the light-emitting diode display according to the first embodiment in succession to FIGS. 10A, 10B, and 10C, respectively.
Figure 11B:
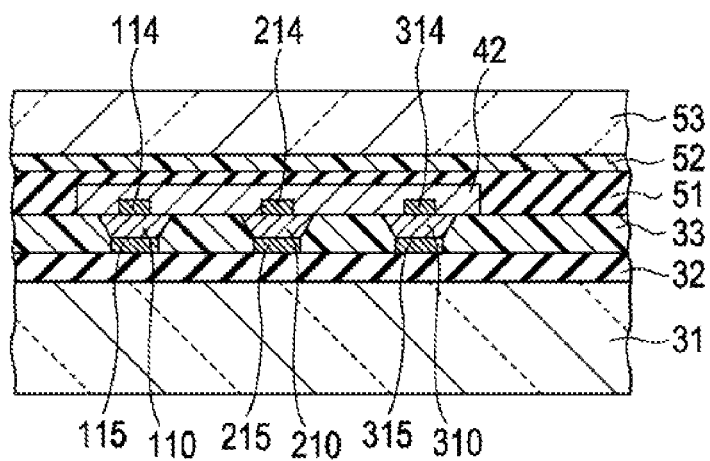
Figure 11C:
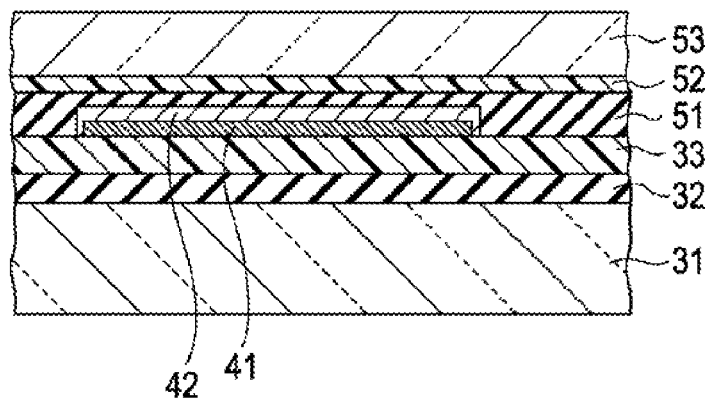
Figure 12A:
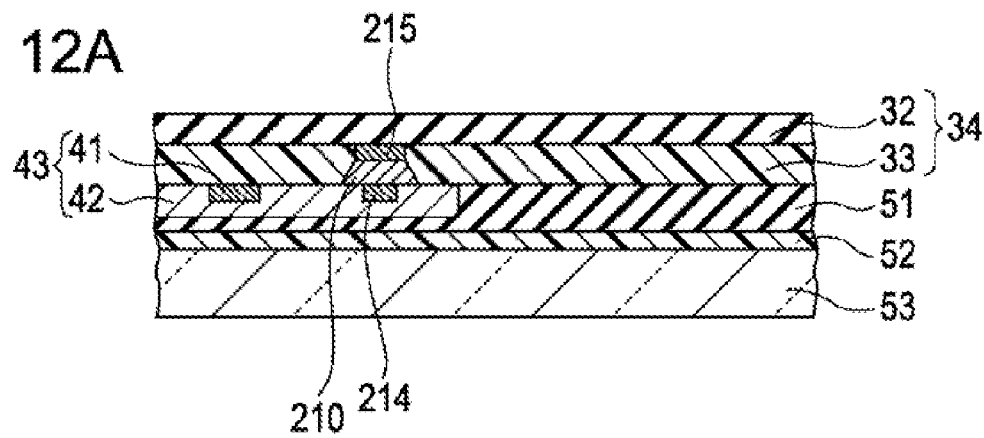
FIGS. 12A, 12B, and 12C are schematic partial end views equivalent to those taken along lines B-B, E-E, and F-F, respectively, in FIG. 1, for illustrating the method for manufacturing the light-emitting diode display according to the first embodiment in succession to FIGS. 11A, 11B, and 11C, respectively.
Figure 12B:
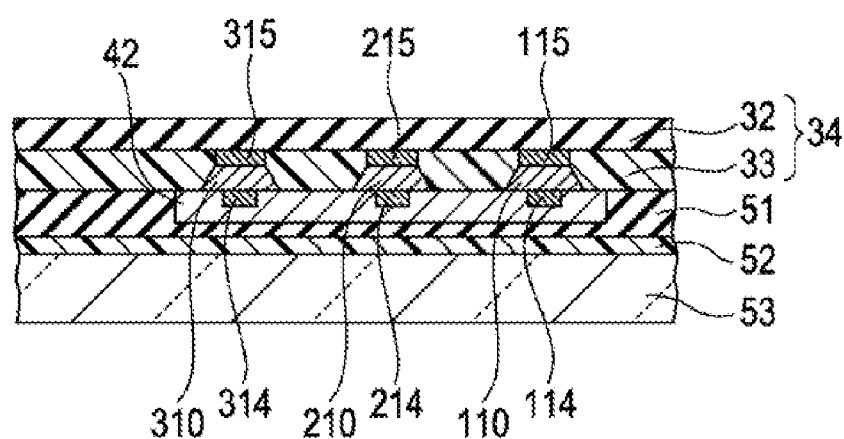
Figure 12C:
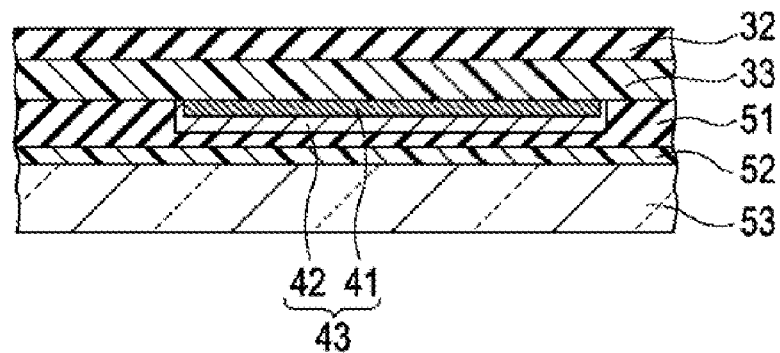
Figure 13A:
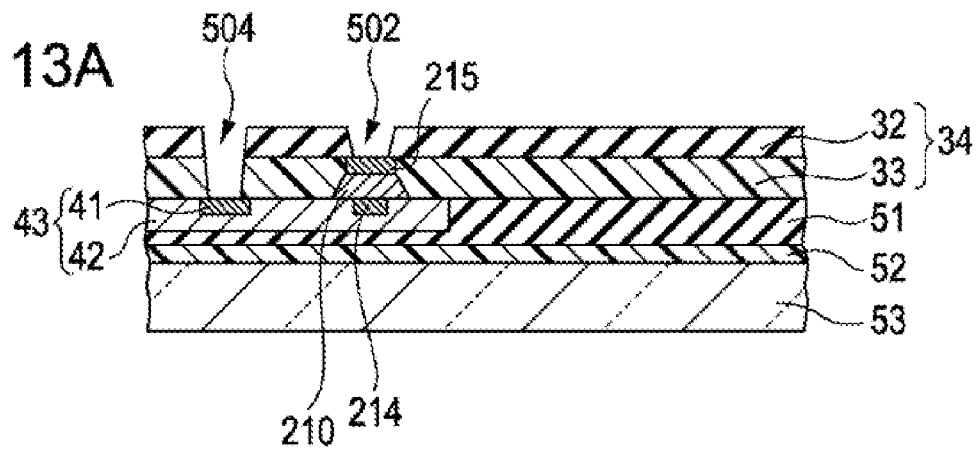
FIGS. 13A, 13B, and 13C are schematic partial end views equivalent to those taken along lines B-B, E-E, and F-F, respectively, in FIG. 1, for illustrating the method for manufacturing the light-emitting diode display according to the first embodiment in succession to FIGS. 12A, 12B, and 12C, respectively.
Figure 13B:
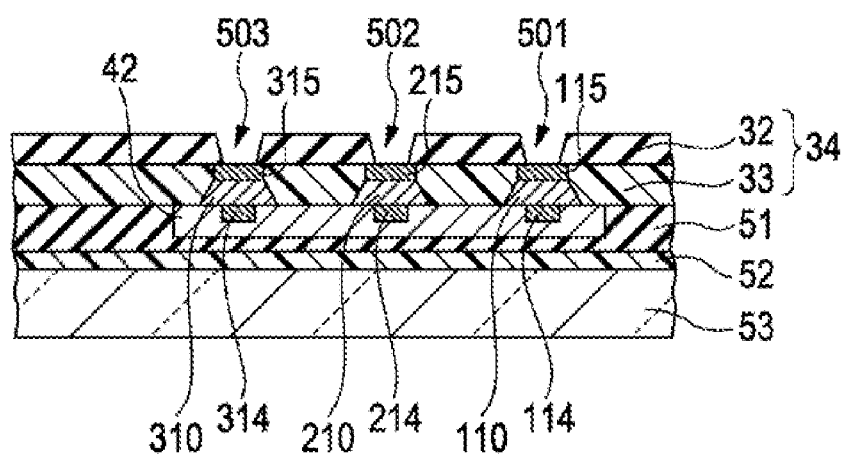
Figure 13C:
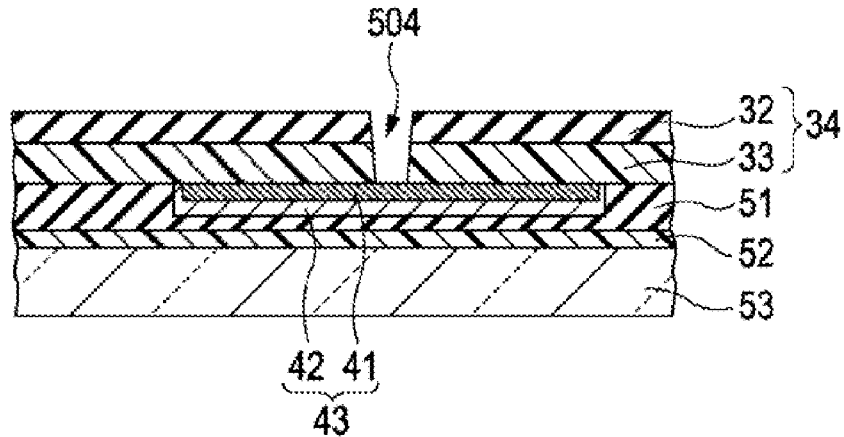

Next, the sub-common electrode 43 is formed, by a sputtering method and a lift-off method, over the first electrodes 114, 214, and 314 of a light-emitting diode group 110, 210, 310 which constitutes each light-emitting unit and the fixed layer 34, the light-emitting diode group including a desired number (in the first embodiment, $N_1$=1) of the first light-emitting diode 110, a desired number (in the first embodiment, $N_2$=1) of the second light-emitting diode 210, and a desired number (in the first embodiment, $N_3$=1) of the third light-emitting diode 310, Specifically, first, a metal layer 41 is formed at a position on the fixed layer 34 apart, from the first electrodes 114, 214, and 314 on the basis of a sputtering method and a lift-off method (refer to FIGS. 9A, 9B, and 9C).

Then, a light-transmitting electrode 42 is formed on the fixed layer 34 to extend over the metal layer 41 and the first electrodes 114, 214, and 314 on the basis of a sputtering method and a lift-off method (refer to FIGS. 10A, 10B, and 10C),

[Step-110C]

Then, the light-emitting diode group 110, 210, 310 which forms each light-emitting unit is bonded and pre-fixed to a light-emitting unit production substrate 53 through the fixed layer 34 and the sub-common electrode 43, and then the first transfer substrate 31 is removed. Specifically, the light-emitting unit production substrate 53 is prepared, the light-emitting unit production substrate 53 including a laser separating layer 52 composed of a resin layer with a laser abrasion property, such as an epoxy resin or a polyimide resin, and an insulating layer (second insulating layer 51) composed of an epoxy resin and functioning as an adhesive layer. Then, the fixed layer 34 and the sub-common electrode 43 are bonded and pre-fixed to the second insulating layer 51 (refer to FIGS. 11A, 11B, and 11C). Then, for example, an excimer laser is applied from the side of the first transfer substrate 31. As a result, laser abrasion occurs to separate the first transfer substrate 31 from the insulating layer 32 (refer to FIGS. 12A, 12B, and 12C).

[Step-110D]

Next, the first contact holes 121 connected to the second electrodes 115 of the first light-emitting diodes 110 are formed in the fixed layer 34, and the first pad portions 122 are formed to extend from the first contact, holes 121 to the fixed layer 34. In addition, the second contact holes 221 connected to the second electrodes 215 of the second light-emitting diodes 210 are formed in the fixed layer 34, and the second pad portions 222 are formed to extend from the second contact holes 221 to the fixed layer 34. Further, the third contact holes 321 connected to the second electrodes 315 of the third light-emitting diodes 310 are formed in the fixed layer 34, and the third pad portions 322 are formed to extend from the third contact holes 321 to the fixed layer 34. Further, the fourth contact holes 421 connected to the sub-common electrodes 43 are formed in the fixed layer 34, and the fourth pad portions 422 are formed to extend from the fourth contact holes 421 to the fixed layer 34. As a result, light-emitting units are produced. Specifically, apertures 501, 502, 503, and 504 are provided in the insulating layer 32 to be disposed above the second electrodes 115, 215, and 315 and the metal layer 41 on the basis of a lithographic technique and an etching technique. Then, a metal material layer is formed on the insulating layer 32 including the apertures 501, 502, 503, and 504 by a sputtering method and then patterned on the basis of the lithographic technique and etching technique to form the first contact holes 121, the first pad portions 122, the second contact holes 221, the second pad portions 222, the third contact holes 321, the third pad portions 322, the fourth contact holes 421, and the fourth pad portions 422 (refer to FIGS. 13A, 13B and 13C, and FIGS. 14A, 14B, and 14C).

[Step-110E]

Figure 14A:
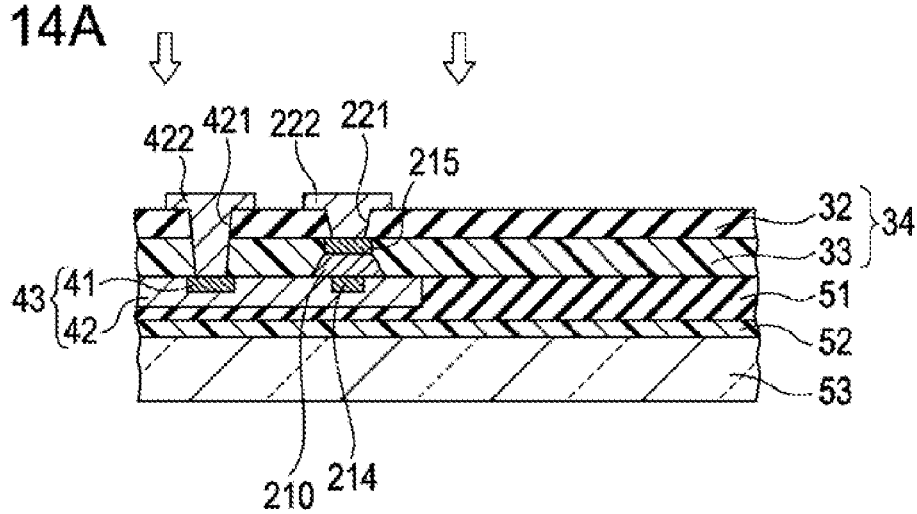
FIGS. 14A, 14B, and 14C are schematic partial end views equivalent to those taken along lines B-B, E-E, and F-F, respectively, in FIG. 1, for illustrating the method for manufacturing the light-emitting diode display according to the first embodiment in succession to FIGS. 13A, 13B, and 13C, respectively.
Figure 14B:
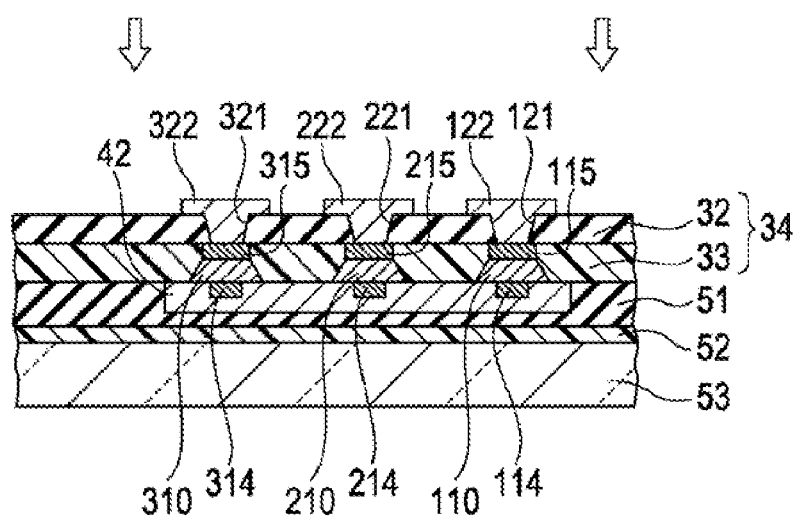
Figure 14C:
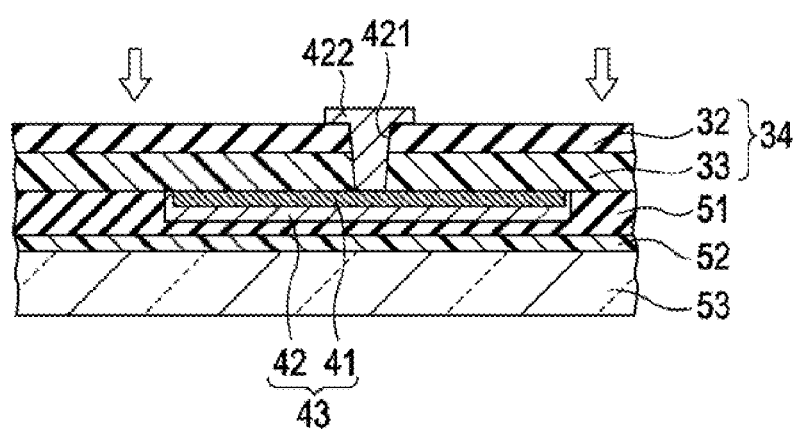
Figure 15A:
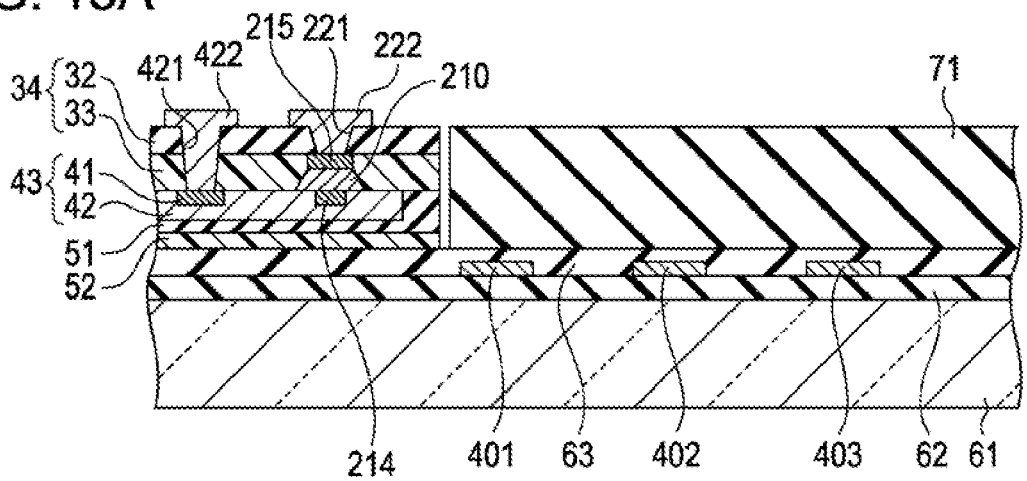
FIGS. 15A, 15B, and 15C are schematic partial end views equivalent to those taken along lines B-B, E-E, and F-F, respectively, in FIG. 1, for illustrating the method for manufacturing the light-emitting diode display according to the first embodiment in succession to FIGS. 14A, 14B, and 14C, respectively.
Figure 15B:
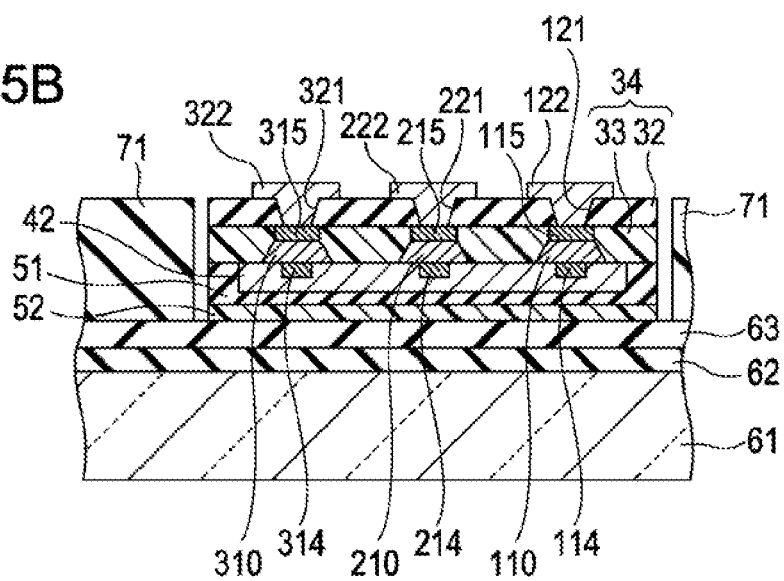
Figure 15C:
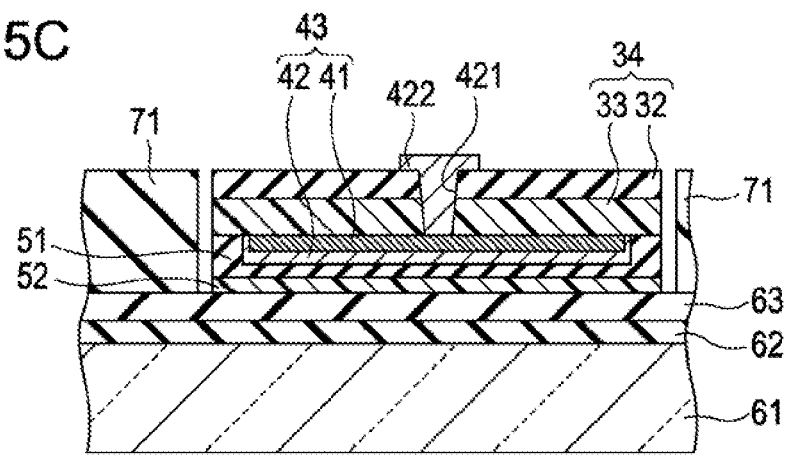

Next, the light-emitting units including the light-emitting diode groups 110, 210, and 310 are separated in the fixed layer 34 on the basis of a laser irradiation method. In FIGS. 14A, 14B, and 14C, portions irradiated with laser are shown by empty arrows.

In the first embodiment, the arrangement pitch of the first light-emitting diodes 110 in the light-emitting diode display is an integral multiple of the manufacturing pitch of the first light-emitting diodes 110 on the first light-emitting diode production substrate. The arrangement pitch of the second light-emitting diodes 210 in the light-emitting diode display is an integral multiple of the manufacturing pitch of the second light-emitting diodes 210 on the second light-emitting diode production substrate. The arrangement pitch of the third light-emitting diodes 310 in the light-emitting diode display is an integral multiple of the manufacturing pitch of the third light-emitting diodes 310 on the third light-emitting diode production substrate. Specifically, the arrangement pitch of the first, second, and third light-emitting diodes 110, 210, and 310 along the first direction in the light-emitting diode display is 6 times the manufacturing pitch of the first, second, and third light-emitting diodes 110, 210, and 310 on the first light-emitting diode production substrate. The arrangement pitch of the first, second, and third light-emitting diodes 110, 21.0, and 310 along the second direction in the light-emitting diode display is 3 times the manufacturing pitch of the first, second, and third light-emitting diodes 110, 210, and 310 on the first light-emitting diode production substrate.

(Step-120)

Specifically, first, the light-emitting units are transferred and fixed from the light-emitting production substrate to a display substrate 61 to produce a light-emitting diode display in which a plurality of light-emitting units are arranged in the first direction and the second direction perpendicular to the first direction, i.e., arranged in a two-dimensional matrix.

Specifically, the display substrate 61 is prepared, on which the insulating material layer 71 and the first, second, and third common electrodes 401, 402, and 403 extending along the first direction have been formed. In this case, the first, second, and third common electrodes 401, 402, and 403 are covered with the insulating material layer 71. The display substrate 61 is covered with an insulating layer (third insulating layer 62), the first, second, and third common electrodes 401, 402, and 403 being formed on the third insulating layer 62. The third insulating layer 62 and the first, second, and third common electrodes 401, 402, and 403 are covered with an insulating layer (fourth insulating layer 63) functioning as an adhesive layer. Further, more specifically, the insulating material layer 71 is formed on the fourth insulating layer 63. The insulating material layer 71 is not formed in portions of the display substrate 61, to which the light-emitting units are to be fixed. Portions of the fourth insulating layer 63 to which the light-emitting units are to be fixed are not cured, the other portions of the fourth insulating layer 63 being cured. The display substrate 61 having such configuration and structure may be formed by a normal method.

[Step-120A]

Specifically, first, the light-transmitting units are bonded to a second transfer substrate (not shown), and then the light-emitting unit production substrate 53 is removed. Specifically, substantially the same step as Step-110A-(2) may be performed. For example, excimer laser is applied from the back; side of the light-emitting unit production substrate 53. As a result, laser abrasion occurs to separate the light-emitting production substrate 53 from the laser separation layer 52.

[Step-120B]

Next, the light-emitting units are arranged on the display substrate 61 so as to be surrounded by the insulating material layer 71, and then the second transfer substrate is removed. Specifically, the light-emitting units and the fixed layer 34 around the units are arranged (moved or transferred) onto the fourth insulating layer 63 exposed and surrounded by the insulating material layer 71 (refer to FIGS. 15A, 15B, and 15C). More specifically, the light-emitting units and the fixed layer 34 around the units are arranged on the fourth insulating layer 63 exposed and surrounded by the insulating material layer 71 on the basis of alignment marks formed on the second transfer substrate. Since the light-emitting units and the fixed layer 34 around the units weakly adhere to a slightly adhesive layer (not shown) provided on the second transfer substrate, the second transfer substrate is moved away from the display substrate 61 while the light-emitting units and the fixed layer 34 around the units is brought into contact with (pressed on) the fourth insulating layer 63, As a result, the light-emitting units and the fixed layer 34 around the units are left on the fourth insulating layer 63. Further, when the light-emitting units and the fixed layer 34 around the units are buried deeply in the fourth insulating layer 63 using a roller or the like, the light-emitting units and the fixed layer 34 around the units are fixed (arranged) to the fourth insulating layer 63. After the all light-emitting units are completely arranged, the fourth insulating layer 63 is cured.

[Step-120C]

Figure 16A:
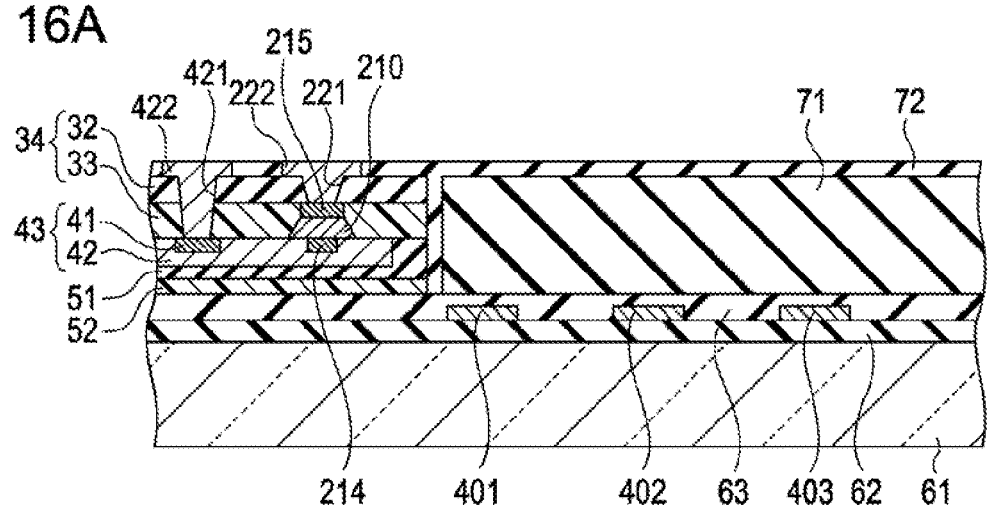
FIGS. 16A, 16B, and 16C are schematic partial end views equivalent to those taken along lines B-B, E-E, and F-F, respectively, in FIG. 1, for illustrating the method for manufacturing the light-emitting diode display according to the first embodiment in succession to FIGS. 15A, 15B, and 15C, respectively.
Figure 16B:
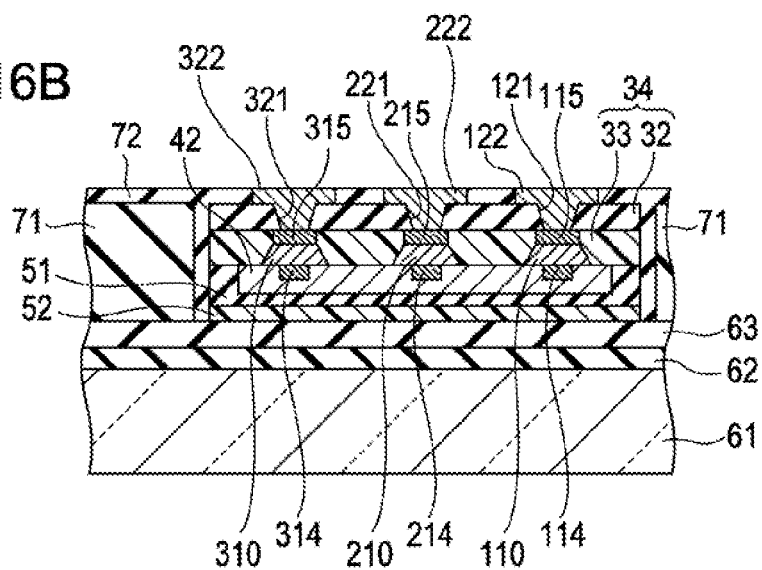
Figure 16C:
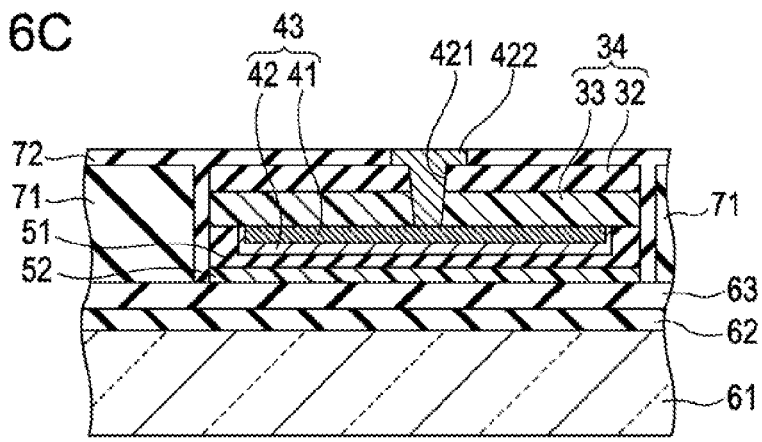
Figure 17A:
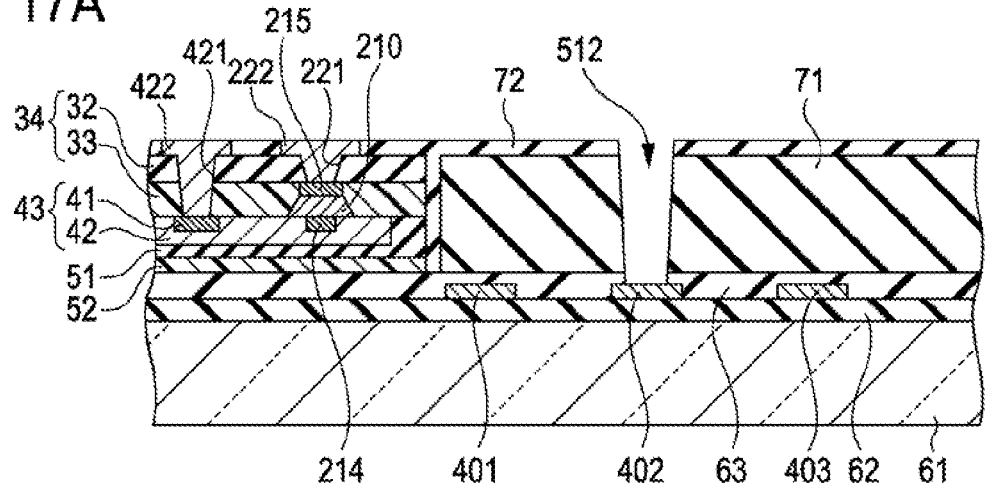
FIGS. 17A, 17B, and 17C are schematic partial end views equivalent to those taken along lines B-B, E-E, and F-F, respectively, in FIG. 1, for illustrating the method for manufacturing the light-emitting diode display according to the first, embodiment in succession to FIGS. 16A, 16B, and 16C, respectively.
Figure 17B:
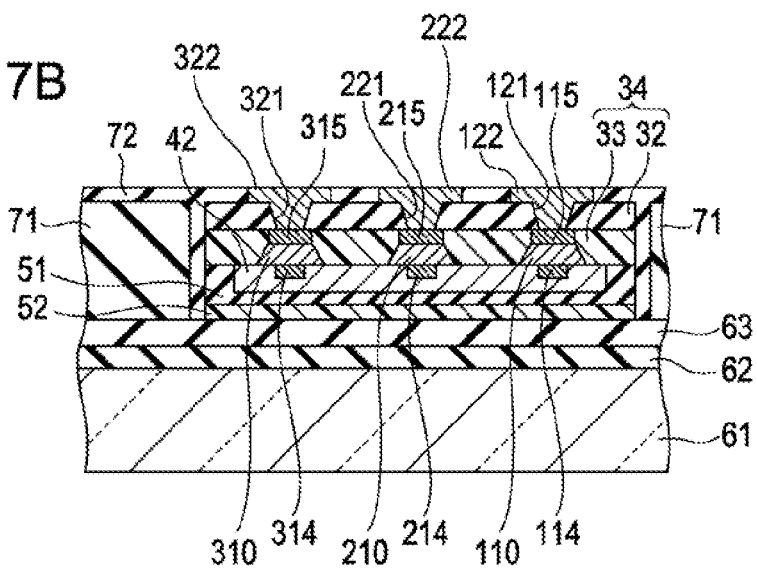
Figure 17C:
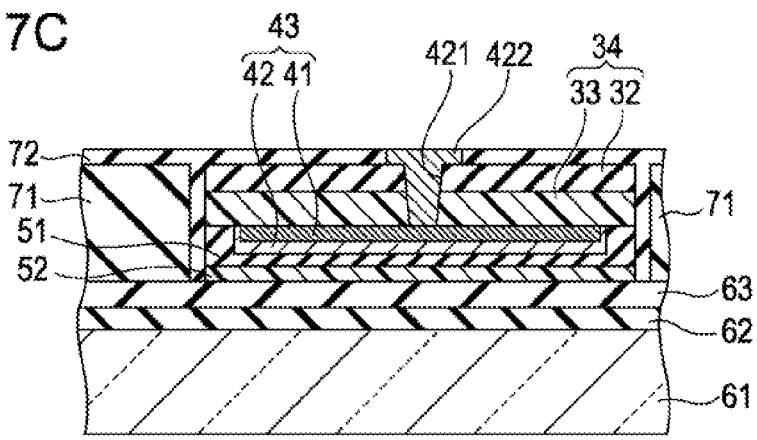
Figure 18A:
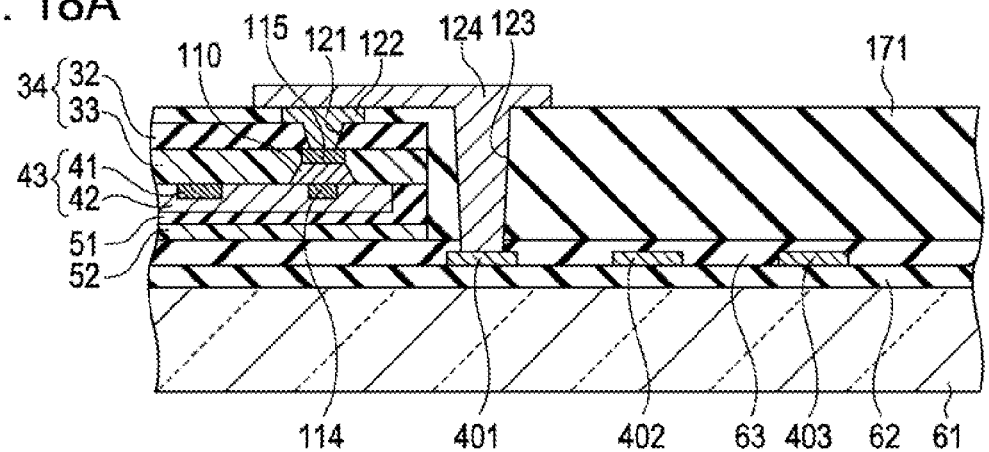
FIGS. 18A, 18B, and 18C are schematic partial sectional views equivalent to those taken along lines A-A, B-B, and C-C, respectively, in FIG. 1, showing one light-emitting unit of a light-emitting diode display according to a second embodiment.
Figure 18B:
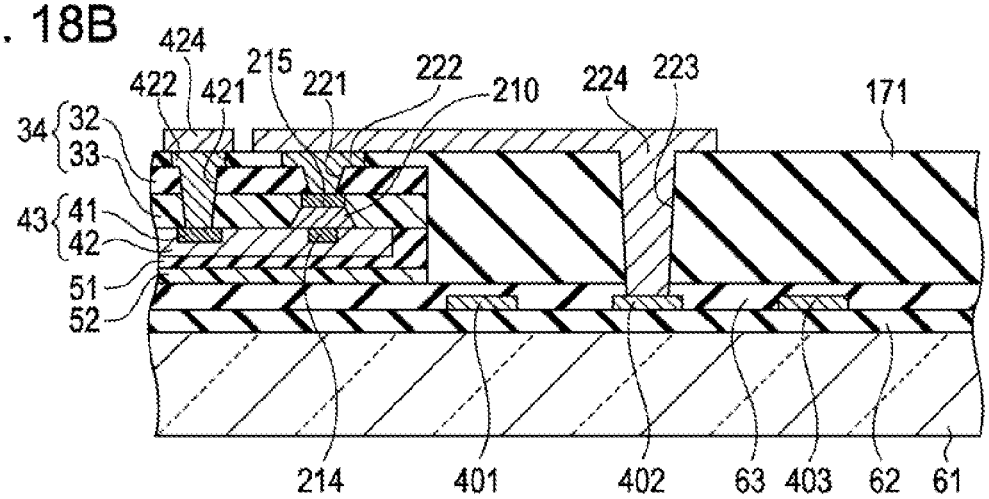
Figure 18C:
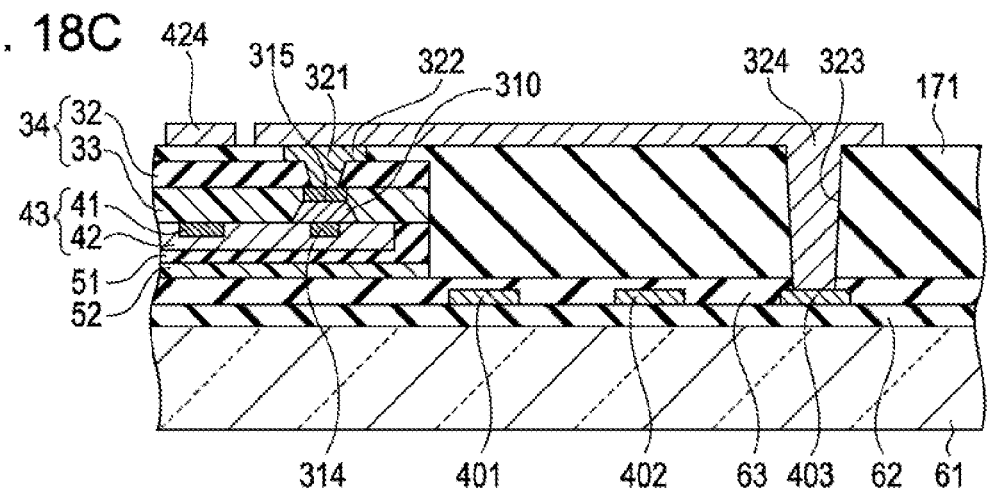
Figure 19A:
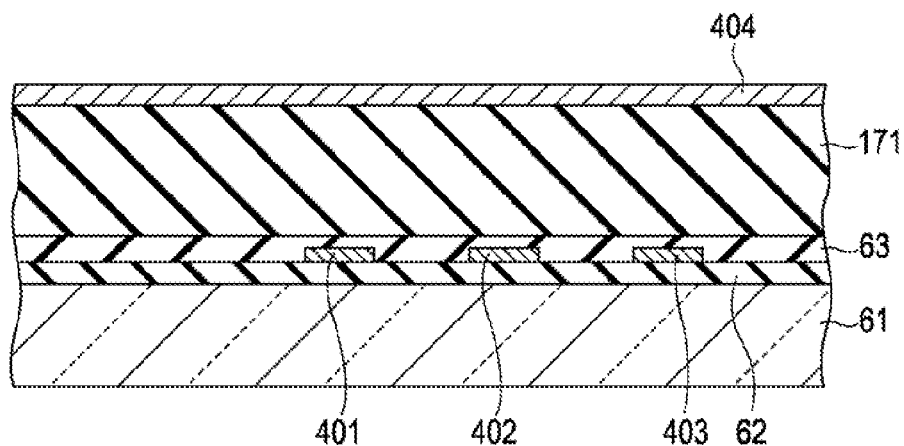
FIGS. 19A, 19B, and 19C are schematic partial sectional views equivalent to those taken along lines D-D, E-E, and F-F, respectively, in FIG. 1, showing one light-emitting unit of the light-emitting diode display according to the second embodiment.
Figure 19B:
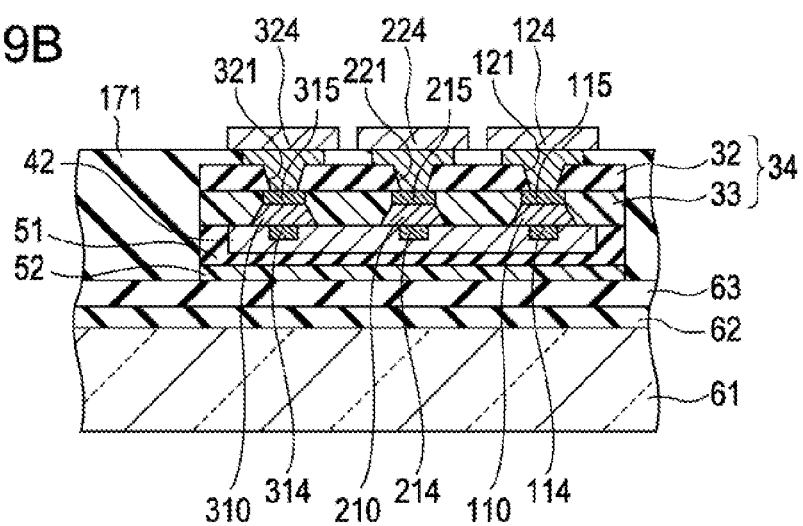
Figure 19C:
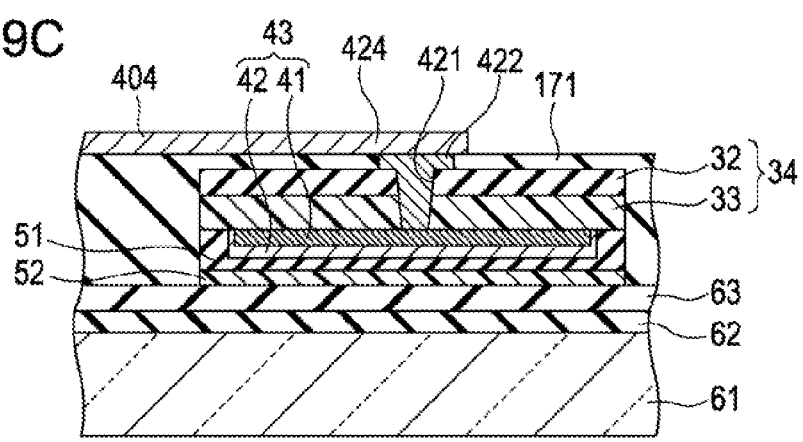

Then, a planarizing layer 72 composed of an insulating resin is formed over the entire surface by a spin coating method to form a smoothed planarizing layer 72. As a result, a structure shown in FIGS. 16A, 16B, and 16C is produced.

[Step-120D]

Next, the first connection portions 124 for electrically connecting the first pad portions 122 and the first common electrode 401 are formed to extend from the fixed layer 34 to the insulating material layer 71. In addition, the second connection portions 224 for electrically connecting the second pad portions 222 and the second common electrode 402 are formed, to extend from the fixed layer 34 to the insulating material layer 71. Further, the third, connection portions 324 for electrically connecting the third pad portions 322 and the third common electrode 403 are formed to extend from the fixed layer 34 to the insulating material layer 71, Further, the fourth common electrode 404 is formed on the insulating material layer 71, and the fourth connection portions 424 for electrically connecting the fourth pad portions 422 and the fourth common electrode 404 are formed to extend from the fixed layer 34 to the insulating material layer 71.

Specifically, apertures (in an example shown in FIGS. 17, apertures 512) are formed in the planarizing layer 72, the insulating material layer 71, and the fourth insulating layer 63 on the basis of a lithographic technique and an etching technique. Then, the first, second, third, and fourth connection portions 124, 224, 324, and 424 are formed on the basis of a sputtering method and a lithographic technique and etching technique. As a result, a structure shown in FIGS. 2A, 2B, and 2C and FIGS. 3A, 3B, and 3C is produced.

In the first embodiment or second to fourth embodiments, which will be described below, a plurality of light-emitting units in each of which the first electrodes 114, 214, and 314 of the first, second, and third light-emitting diodes 110, 210, and 310 are connected to the sub-common electrode 43 are transferred to the display substrate 61. Further, the light-emitting units are fixed to the display substrate 61 with the second electrodes 115, 215, and 315 facing upward. Therefore, in a subsequent step, the second electrodes 115, 215, and 315 of the first, second, and third light-emitting diodes 110, 210, and 310 are easily extended to the common electrodes (common wiring) 401, 402, and 403, respectively, and the first electrodes 114, 214, and 314 are easily extended to the fourth common electrode (fourth common wiring) 404. As a result, a micro-process may be reduced, and the process for manufacturing a light-emitting diode display may be simplified. Also, the area of the light-emitting diodes 110, 210, and 310 in one pixel is small, and the light-emitting diodes 110, 210, and 310 are arranged close to each other, thereby little causing so-called color breakup.

Second Embodiment

A second embodiment is a modification of the first embodiment, and more specifically relates to a method for manufacturing a light-emitting diode display according to a second configuration. FIGS. 18A, 18B, 18C, 19A, 19B, and 19C are schematic partial sectional views showing a light-emitting diode display produced by the method for manufacturing a light-emitting diode display of the second embodiment. The configuration and structure of the light-emitting diode display of the second embodiment are substantially the same as those of the first embodiment except that the planarizing layer 72 is not formed. Therefore, detailed description is omitted. FIGS. 18A, 18B, 18C, 19A, 19B, and 19C are schematic partial sectional views equivalent to those taken along lines A-A, B-B, C-C, D-D, E-E, and F-F, respectively, in FIG. 1.

Figure 20A:
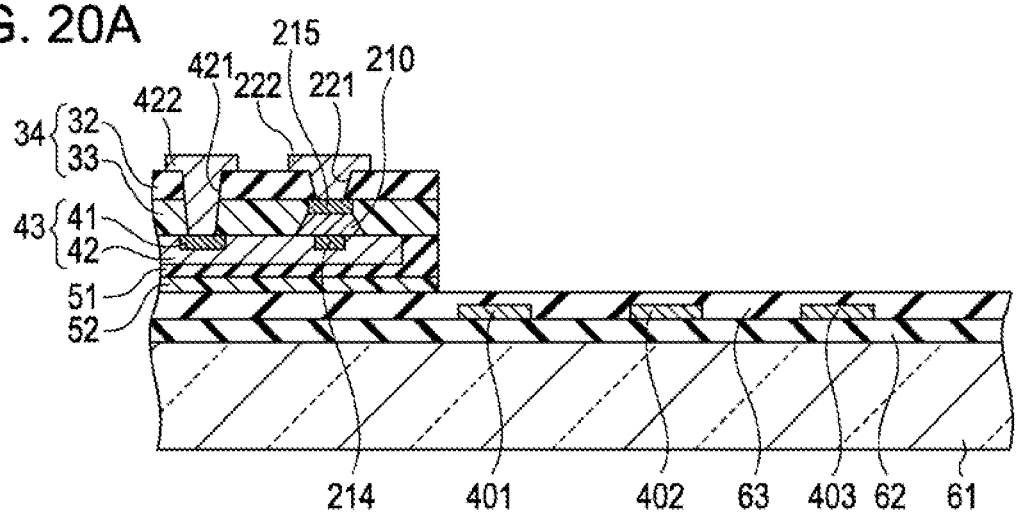
FIGS. 20A, 20B, and 20C are schematic partial end views equivalent to those taken along lines B-B, E-E, and F-F, respectively, in FIG. 1, for illustrating the method for manufacturing the light-emitting diode display according to the second embodiment.
Figure 20B:
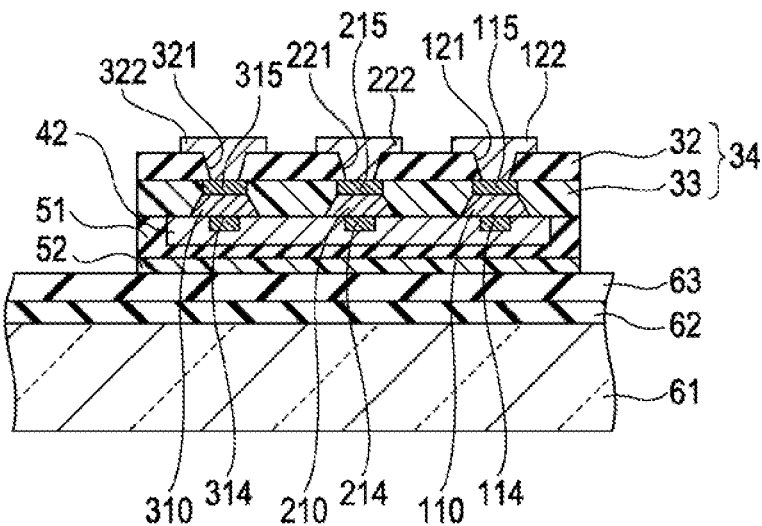
Figure 20C:
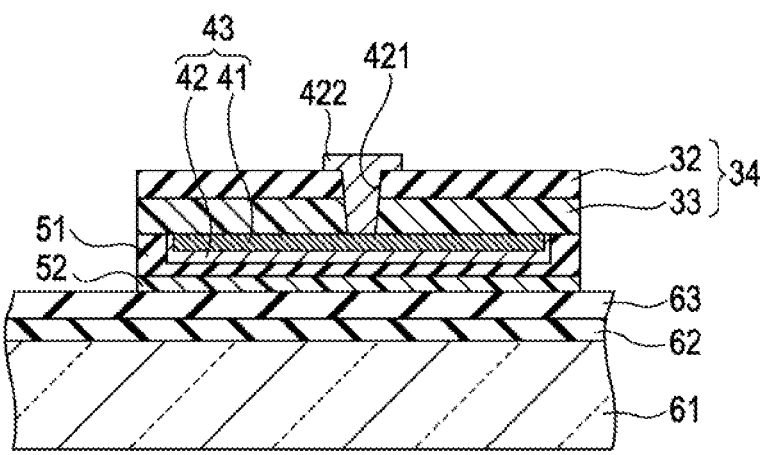
Figure 21A:
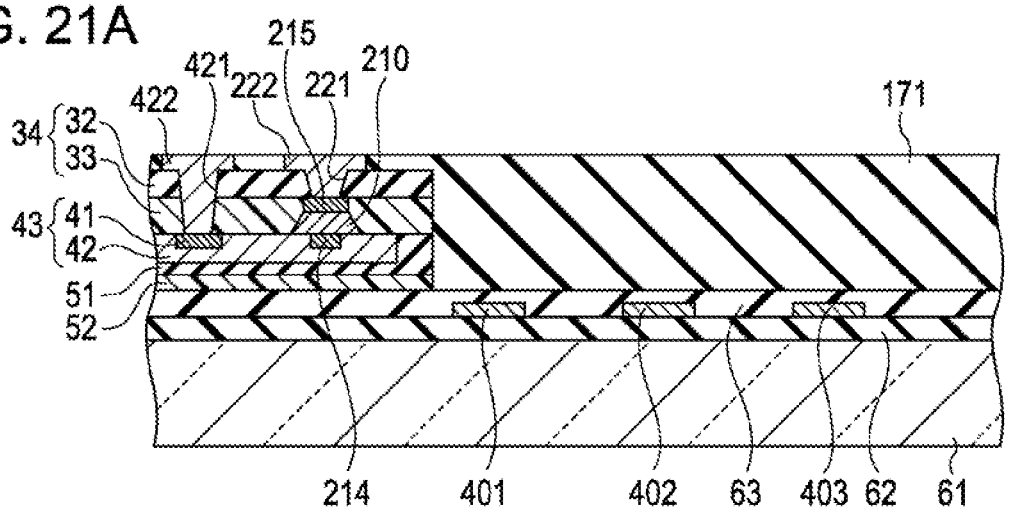
FIGS. 21A, 21B, and 21C are schematic partial end views equivalent to those taken along lines B-B, E-E, and F-F, respectively, in FIG. 1, for illustrating the method for manufacturing the light-emitting diode display according to the second embodiment in succession to FIGS. 20A, 20B, and 20C respectively.
Figure 21B:
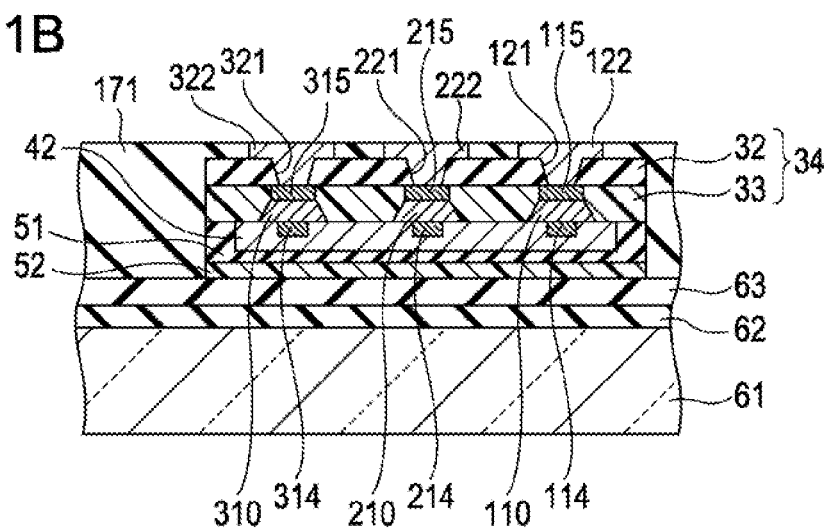
Figure 21C:
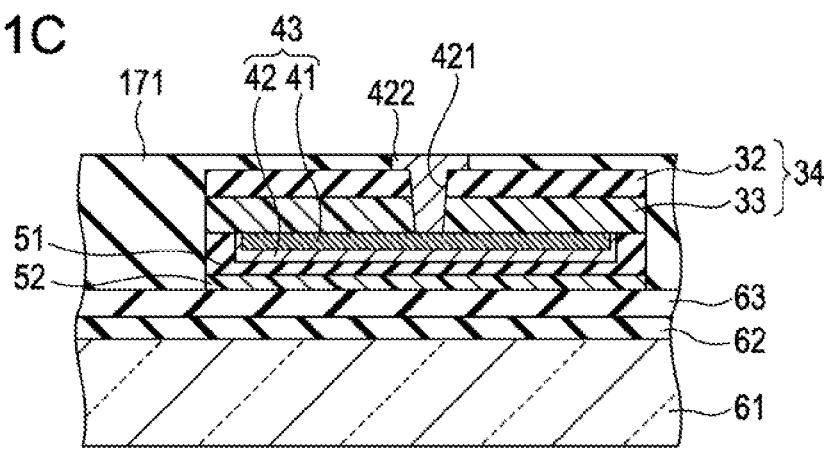
Figure 22A:
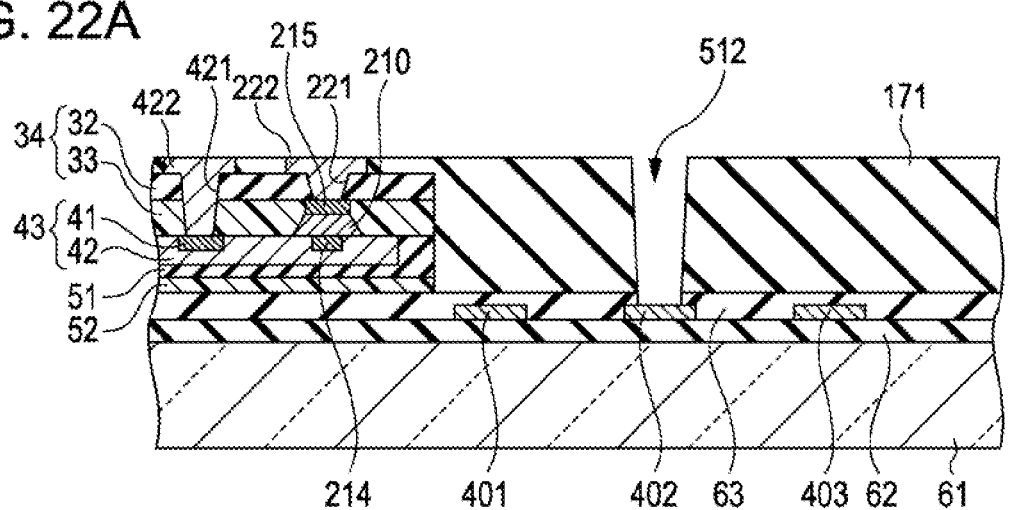
FIGS. 22A, 22B, and 22C are schematic partial end views equivalent to those taken along lines B-B, E-E, and F-F, respectively, in FIG. 1, for illustrating the method for manufacturing the light-emitting diode display according to the second embodiment in succession to FIGS. 21A, 21B, and 21C, respectively.
Figure 22B:
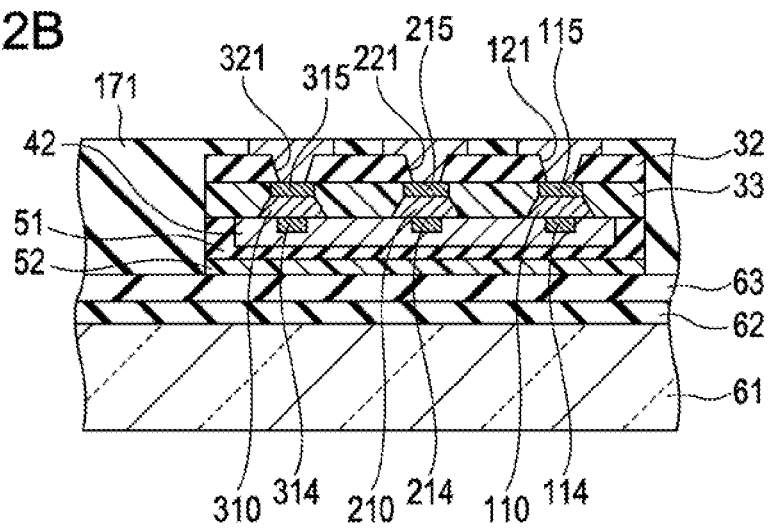
Figure 22C:
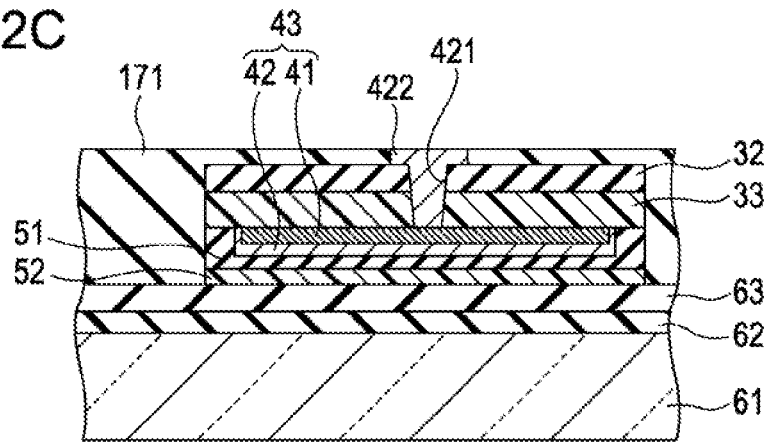
Figure 23A:
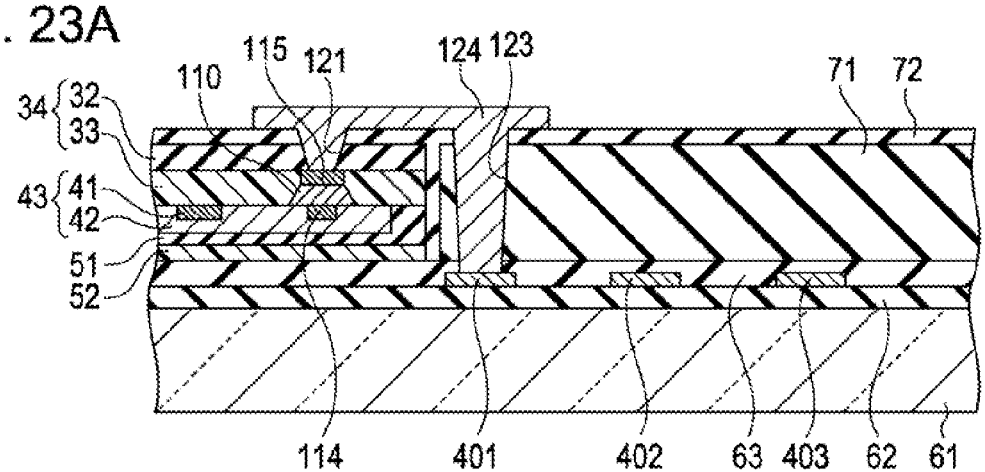
FIGS. 23A, 23B, and 23C are schematic partial sectional views equivalent to those taken along lines A-A, B-B, and C-C, respectively, in FIG. 1, showing one light-emitting unit of a light-emitting diode display according to a third embodiment.
Figure 23B:
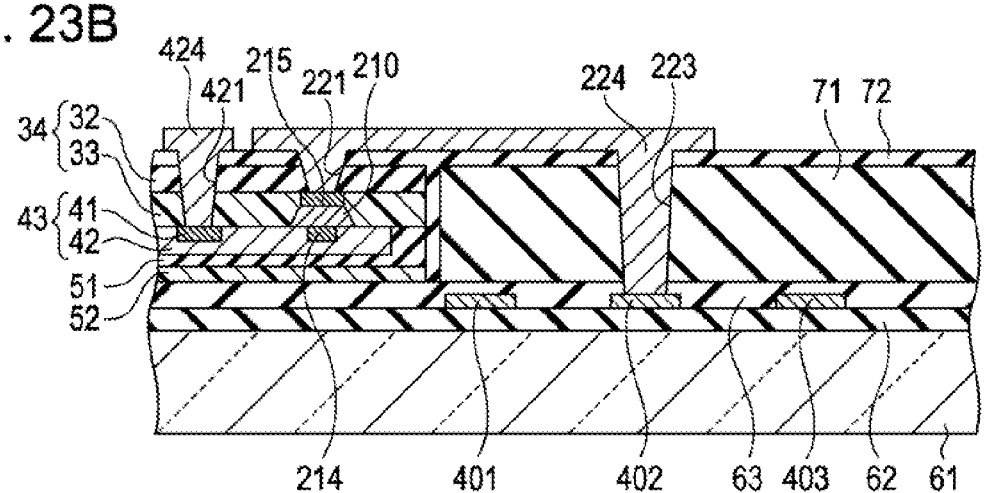
Figure 23C:
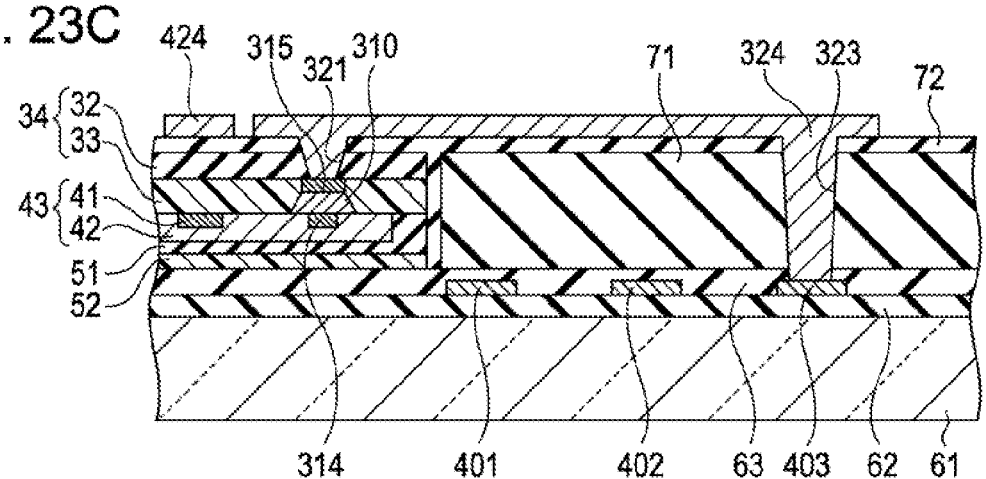
Figure 24A:
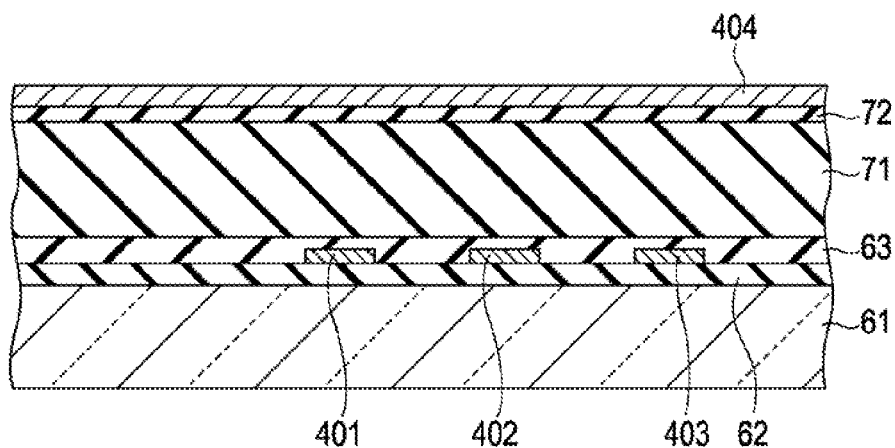
FIGS. 24A, 24B, and 24C are schematic partial sectional views equivalent to those taken along lines D-D, E-E, and F-F, respectively, in FIG. 1, showing one light-emitting unit of the light-emitting diode display according to the third embodiment.
Figure 24B:
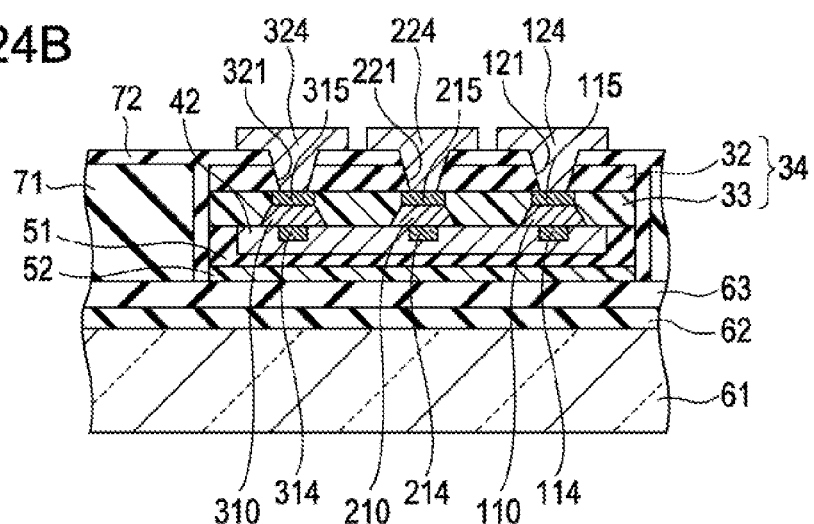
Figure 24C:
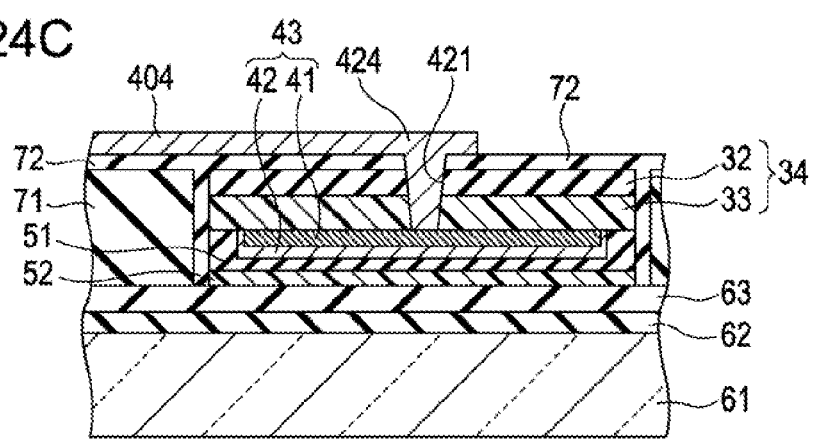

The method for manufacturing a light-emitting diode display of the second embodiment, more specifically the method for manufacturing a light-emitting diode display according to a second configuration, is described below with reference to FIGS. 20A, 20B, 20C, 21A, 21B, 21C, 22A, 22B, and 22C. FIGS. 20A, 21A, and 22A are schematic partial end views equivalent to that taken along line B-B in FIG. 1. FIGS. 20B, 21B, and 22B are schematic partial end views equivalent to that taken along line E-E in FIG. 1. FIGS. 20C, 21C, and 22C are schematic partial end views equivalent to that, taken along line F-F in FIG. 1.

[Step-200]

First, light-emitting diodes 10 (110, 210, 310) are produced by the same method as in Step-100 of the first embodiment. Next, the same step as Step-110 of the first embodiment, i.e., Step-110A, Step-110A-(1), Step-110A-(2), Step-110B, Step-110C, Step-110D, and Step-110E, is performed to pre-fix the first, second, and third light-emitting diodes 110, 210, and 310 to the light-emitting production substrate 53, producing light-emitting units. The light-emitting units each include a desired number of first light-emitting diodes 110, a desired number of second light-emitting diodes 210, and a desired number of third light-emitting diodes 310, the first electrodes 114, 214, and 314 of the first, second, and third light-emitting diodes 110, 210, and 310 being connected to the sub-common electrode 43.

(Step-210)

In the second embodiment, a display substrate 61 on which first, second, and third common electrodes 410, 402, and 403 extending along the first direction have been formed is prepared. Unlike in the first, embodiment, at this time, an insulating material layer is not formed.

[Step-210A]

The light-emitting units are bonded to a second transfer substrate by the same method as in Step-120A of the first embodiment, and then the light-emitting unit production substrate 53 is removed.

[Step-210B]

Next, the light-emitting units are arranged on the display substrate 61, and then the second transfer substrate is removed. Specifically, the light-emitting units and the fixed layer 34 around the light-emitting units are arranged (moved or transferred) on a predetermined portion of a fourth insulating layer 63 by the same method as in Step-120B of the first embodiment (refer to FIGS. 20A, 20B, and 20C).

[Step-210C]

Then, an insulating material layer 171 is formed to cover the first, second, and third common electrodes 401, 402, and 403 and surround the light-emitting units (refer to FIGS. 21A, 21B, and 21C). Specifically, the insulating material layer 171 composed of $SiO_2$ is formed by the CVD method, and then polished or etched-back to expose first, second, third, and fourth pad portions 122, 222, 322, and 422.

[Step-210D]

Next, first connection portions 124 for electrically connecting the first pad portions 122 and the first common electrode 401 are formed to extend from the fixed layer 34 to the insulating material layer 171. In addition, second connection portions 224 for electrically connecting the second pad portions 222 and the second common electrode 402 are formed to extend from the fixed layer 34 to the insulating material layer 171. Further, third connection portions 324 for electrically connecting the third pad portions 322 and the third common electrode 403 are formed to extend from the fixed layer 34 to the insulating material layer 171. Further, fourth connection portions 424 for electrically connecting the fourth pad portions 422 and the fourth common electrode 404 are formed to extend from the fixed layer 34 to the insulating material layer 171.

Specifically, apertures (in an example shown in FIGS. 22, apertures 512) are formed in the insulating material layer 171 and the fourth insulating layer 63 on the basis of a lithographic technique and an etching technique. Then, the first, second, third, and fourth connection portions 124, 224, 324, and 424 are formed on the basis of a sputtering method and a lithographic technique and etching technique. As a result, a structure shown in FIGS. 18A, 18B, and 18C and FIGS. 19A, 19B, and 19C is produced.

Third Embodiment

A third embodiment is a modification of the first embodiment, and more specifically relates to a method for manufacturing a light-emitting diode display according to a third configuration. FIGS. 23A, 23B, 23C, 24A, 24B, and 24C are schematic partial sectional views showing a light-emitting diode display produced by the method for manufacturing a light-emitting diode display of the third embodiment. The configuration and structure of the light-emitting diode display of the third embodiment are substantially the same as those of the first embodiment except that first, second, third, and fourth pad portions are not formed. Therefore, detailed description is omitted. FIGS. 23A, 23B, 23C, 24A, 24B, and 24C are schematic partial sectional views equivalent to those taken along lines A-A, B-B, C-C, D-D, E-E, and F-F, respectively, in FIG. 1.

Figure 25A:
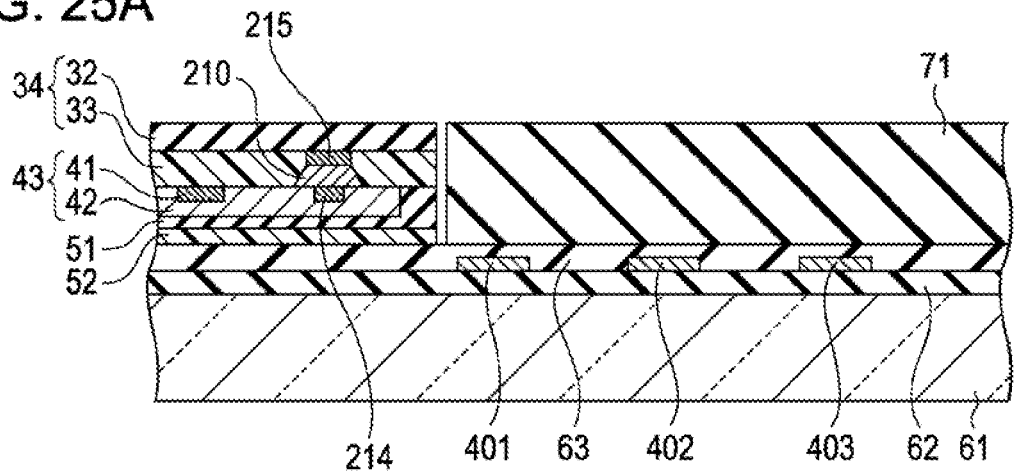
FIGS. 25A, 25B, and 25C are schematic partial end views equivalent to those taken along lines B-B, E-E, and F-F, respectively, in FIG. 1, for illustrating the method for manufacturing the light-emitting diode display according to the third embodiment.
Figure 25B:
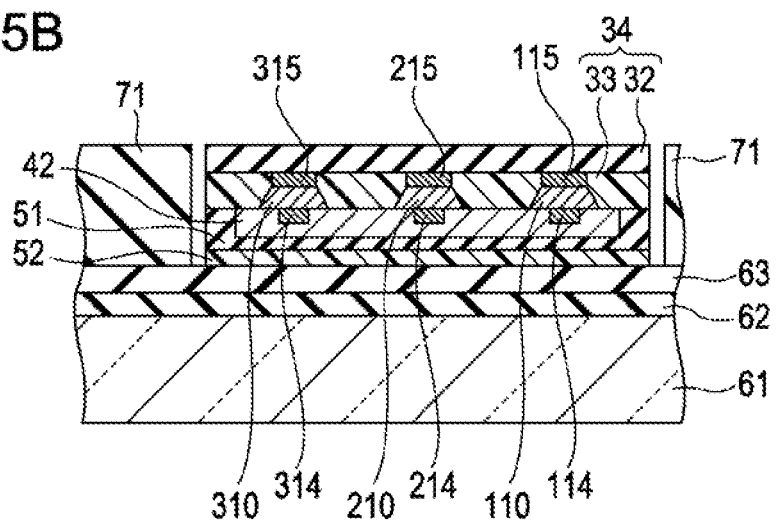
Figure 25C:
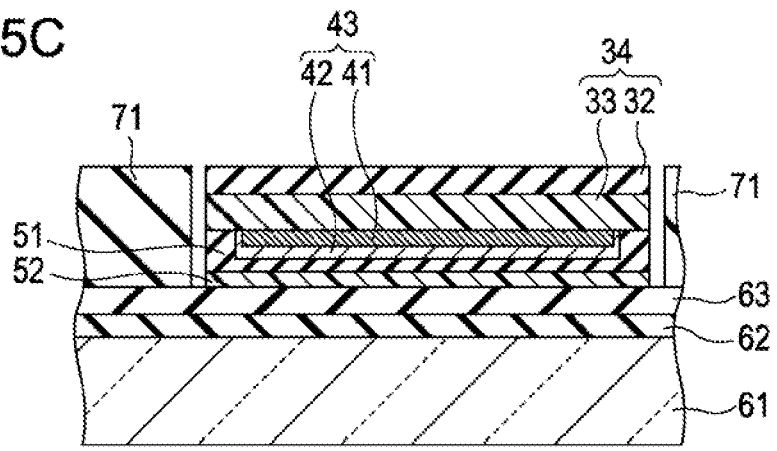
Figure 26A:
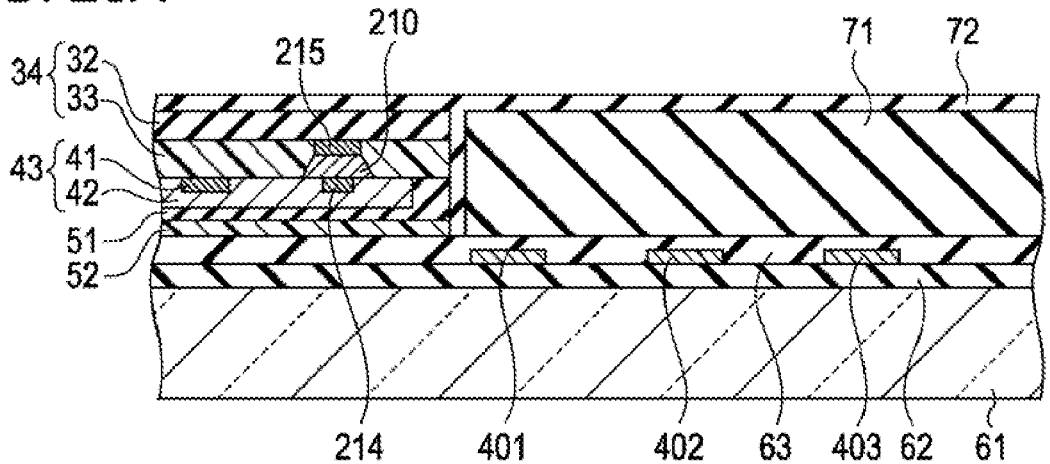
FIGS. 26A, 26B, and 26C are schematic partial end views equivalent to those taken along lines B-B, E-E, and F-F, respectively, in FIG. 1, for illustrating the method for manufacturing the light-emitting diode display according to the third embodiment in succession to FIGS. 25A, 25B, and 25C, respectively.
Figure 26B:
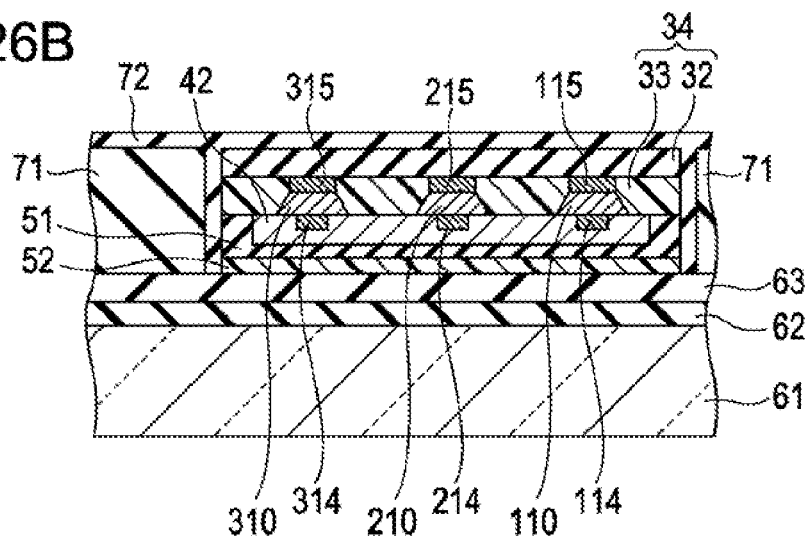
Figure 26C:
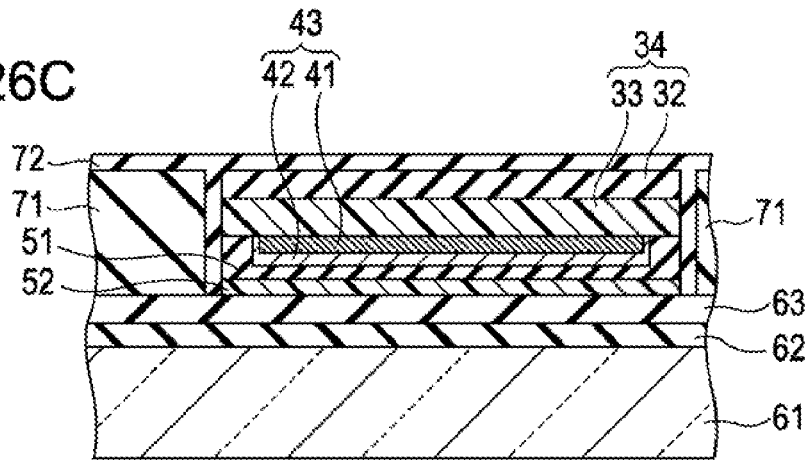
Figure 27A:
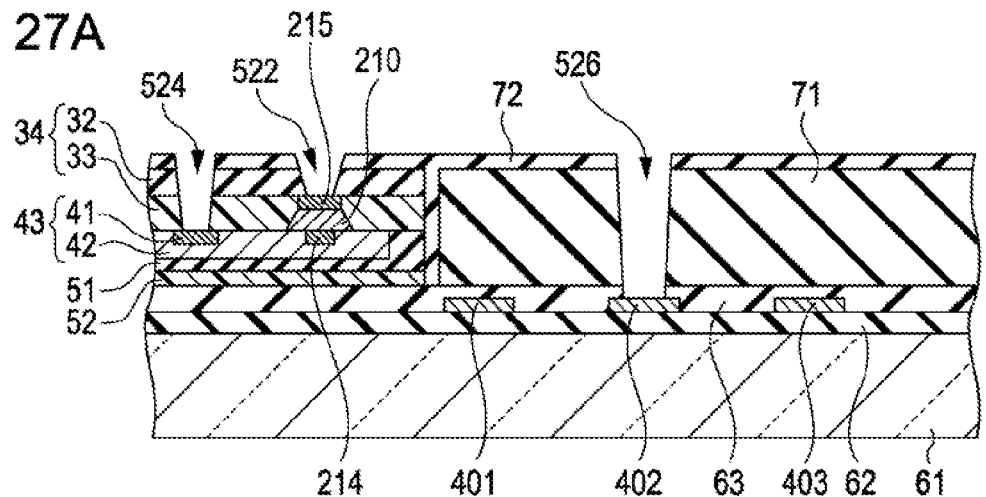
FIGS. 27A, 27B, and 27C are schematic partial end views equivalent to those taken along lines B-B, E-E, and F-F, respectively, in FIG. 1, for illustrating the method for manufacturing the light-emitting diode display according to the third embodiment in succession to FIGS. 26A, 26B, and 26C, respectively.
Figure 27B:
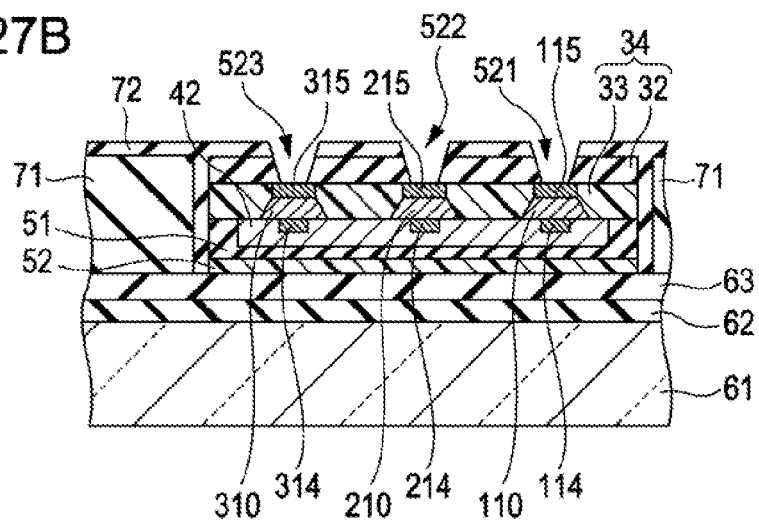
Figure 27C:
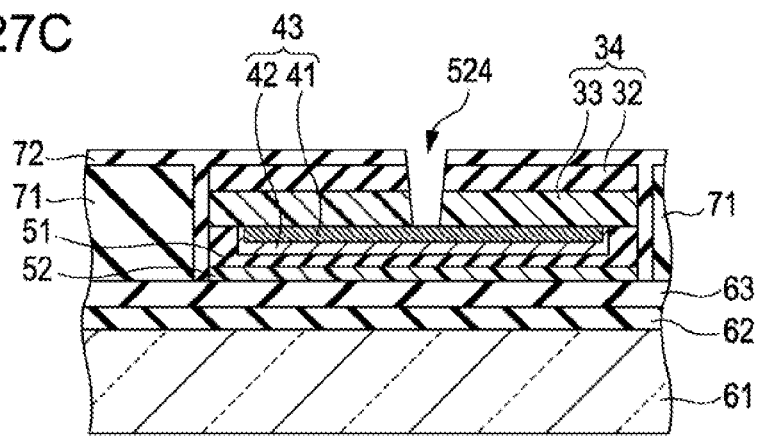
Figure 28A:
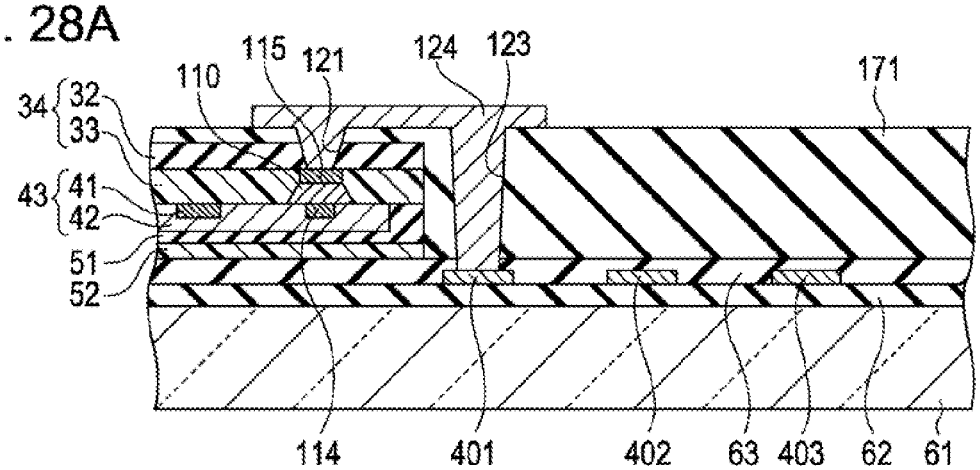
FIGS. 28A, 28B, and 28C are schematic partial sectional views equivalent to those taken along lines A-A, B-B, and C-C, respectively, in FIG. 1, showing one light-emitting unit of a light-emitting diode display according to a fourth embodiment.
Figure 28B:
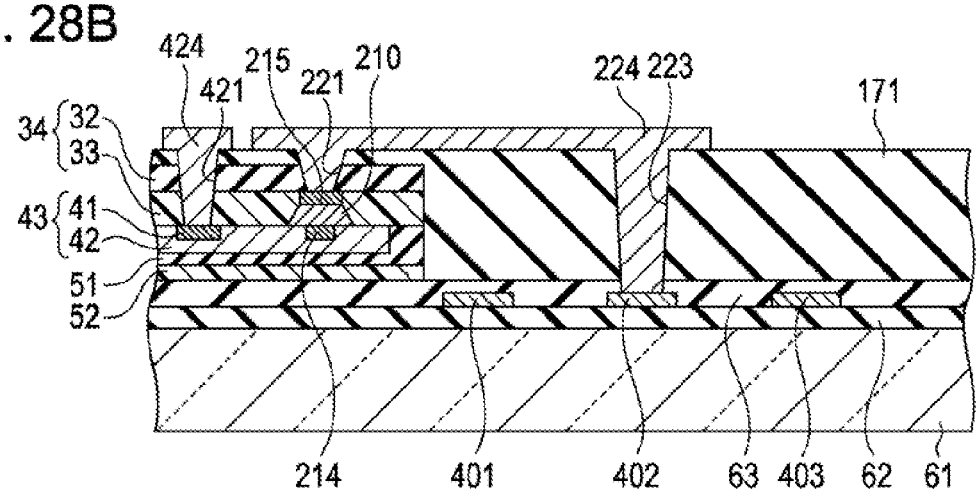
Figure 28C:
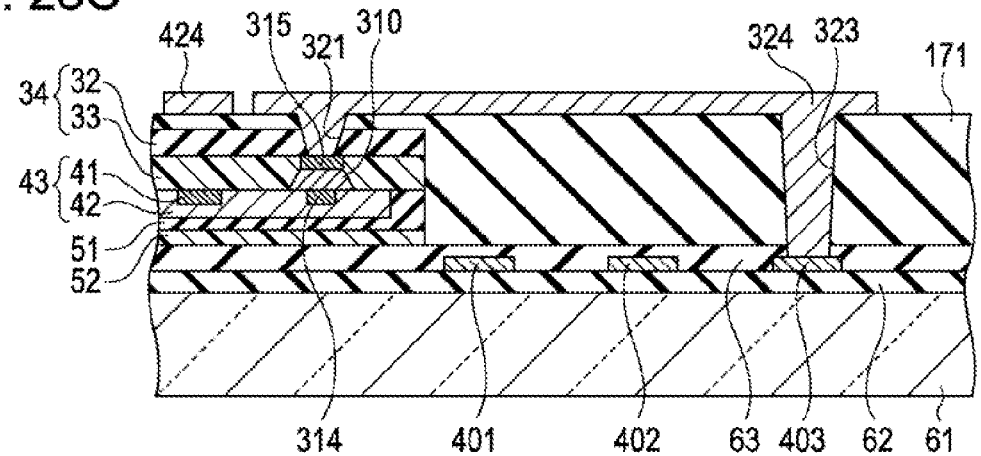
Figure 29A:
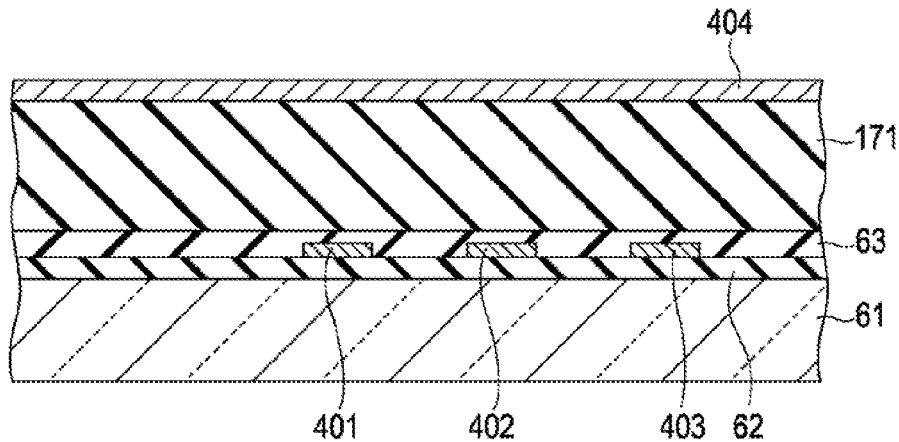
FIGS. 29A, 29B, and 29C are schematic partial sectional views equivalent to those taken along lines D-D, E-E, and F-F, respectively, in FIG. 1, showing one light-emitting unit of the light-emitting diode display according to the fourth embodiment.
Figure 29B:
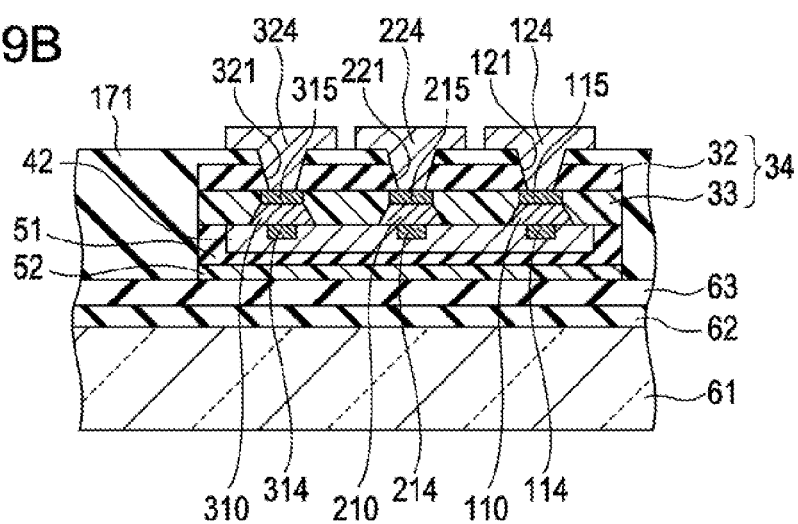
Figure 29C:
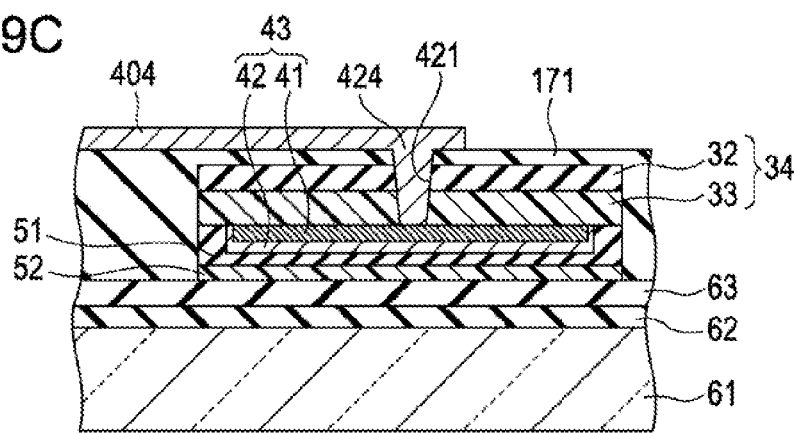

The method for manufacturing a light-emitting diode display of the third embodiment, more specifically the method for manufacturing a light-emitting diode display according to a third configuration, is described below with reference to FIGS. 25A, 25B, 25C, 26A, 26B, 26C, 27A, 27B, and 27C. FIGS. 25A, 26A, and 27A are schematic partial end views equivalent to that, taken along line B-B in FIG. 1. FIGS. 25B, 26B, and 27B are schematic partial end views equivalent to that taken along line E-E in FIG. 1. FIGS. 25C, 26C, and 27C are schematic partial end views equivalent to that taken along line F-F in FIG. 1.

[Step-300]

First, light-emitting diodes 10 (110, 210, 310) are produced by the same method as in Step-100 of the first embodiment. Next, the same steps as Step-110A and Step-110B of the first embodiment are performed, and then the same step as Step-110C of the first embodiment is performed to bond and pre-fix light-emitting diode groups 110, 210, and 310, which constitute light-emitting units, to a light-emitting unit production substrate 53 through a fixed layer 34 and a sub-common electrode 43, thereby producing light-emitting units. Then, the first transfer substrate 31 is removed. Then, the same step as Step-110E of the first embodiment is performed to separate the light-emitting units in the fixed layer 34.

(Step-310)

Like in the first embodiment, a display substrate 61 is prepared, on which an insulating material layer 71 and first, second, and third common electrodes 401, 402, and 403 covered with the insulating material layer and extending along the first direction have been formed.

[Step-310A]

The light-emitting units are bonded to a second transfer substrate (not shown) by the same step as Step-120A of the first embodiment, and then the light-emitting unit production substrate 53 is removed,

[Step-310B]

Next, the light-emitting units are arranged on the display substrate 61 so as to be surrounded by the insulating layer 71 by the same method as in Step-120B and Step-120-C of the first embodiment, and then the second transfer substrate is removed (refer to FIGS. 25A, 25B, 25C, 26A, 26B, and 26C).

[Step-310C]

Then, first contact holes 121 for electrically connecting the second electrodes 115 of the first light-emitting diodes 110 and the first common electrode 401 are formed in the fixed layer 34, and first connection portions 124 are formed to extend from the fixed layer 34 to the planarizing layer 72 and the insulating material layer 71. In addition, second contact holes 221 for electrically connecting the second electrodes 215 of the second light-emitting diodes 210 and the second common electrode 402 are formed in the fixed layer 34, and second connection portions 224 are formed to extend from the fixed layer 34 to a planarizing layer 72 and the insulating material layer 71. Further, third contact holes 321 for electrically connecting the second electrodes 315 of the third light-emitting diodes 310 and the third common electrode 403 are formed in the fixed layer 34, and third connection portions 324 are formed to extend from the fixed layer 34 to the planarizing layer 72 and the insulating material layer 71. Further, a fourth common electrode 404 is formed on the insulating material layer 71, fourth contact holes 421 for electrically connecting the sub-common electrodes 43 and the fourth common electrode 404 are formed in the fixed layer 34, and fourth connection portions 424 are formed to extend from the fixed layer 34 to the planarizing layer 72 and the insulating material layer 71.

Specifically, apertures 521, 522, 523, and 524 are formed in the planarizing layer 72, the insulating material layer 71, and an insulating layer 32 so as to be disposed above the second electrodes 115, 215, and 315 and the metal layer 41, on the basis of a lithographic technique and an etching technique. In addition, apertures are provided in the planarizing layer 72, the insulating material layer 71, and the insulating layer 32 so as to be disposed above the first, second, third, and fourth common electrodes 410, 402, 403, and 404 (refer to FIGS. 27A, 27B, and 27C). FIG. 27A shows only an aperture 526. Then, a metal material layer is formed on the insulating layer 32 including the apertures 521, 522, 523, 524, and 526 by a sputtering method and patterned on the basis of a lithographic technique and an etching technique to form the first, second, third, and fourth contact holes 121, 221, 321, and 421 and the first, second, third, and fourth connection portions 124, 224, 324, and 424 (refer to FIGS. 23A, 23B, 23C, 24A, 24B, and 24C).

Fourth Embodiment

A fourth embodiment is a modification of the first embodiment, and more specifically relates to a method for manufacturing a light-emitting diode display according to a fourth configuration. FIGS. 28A, 28B, 28C, 29A, 29B, and 29C are schematic partial sectional views showing a light-emitting diode display produced by the method for manufacturing a light-emitting diode display of the fourth embodiment. The configuration and structure of the light-emitting diode display of the fourth embodiment are substantially the same as those of the second embodiment except that first, second, third, and fourth pad portions are not formed. Therefore, detailed description is omitted. FIGS. 28A, 28B, 28C, 29A, 29B, and 29C are schematic partial sectional views equivalent to those taken along lines A-A, B-B, C-C, D-D, E-E, and F-F, respectively, in FIG. 1.

Figure 30A:
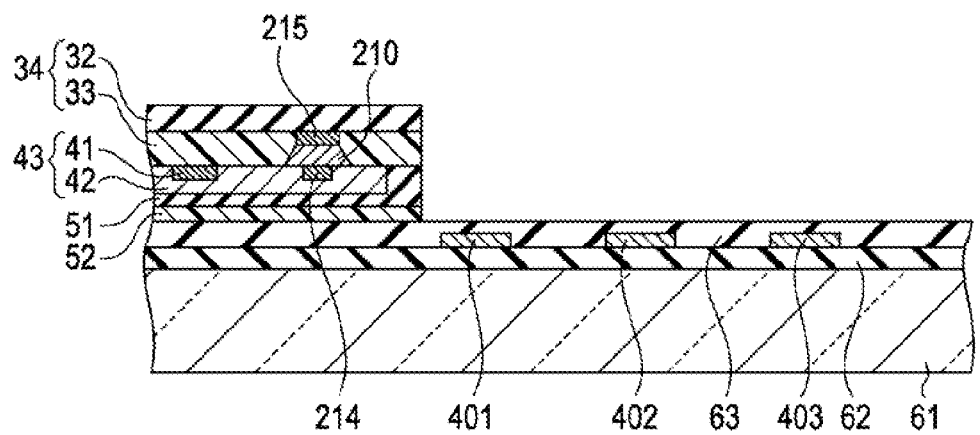
FIGS. 30A, 30B, and 30C are schematic partial end views equivalent to those taken along lines B-B, E-E, and F-F, respectively, in FIG. 1, for illustrating the method for manufacturing the light-emitting diode display according to the fourth embodiment.
Figure 30B:
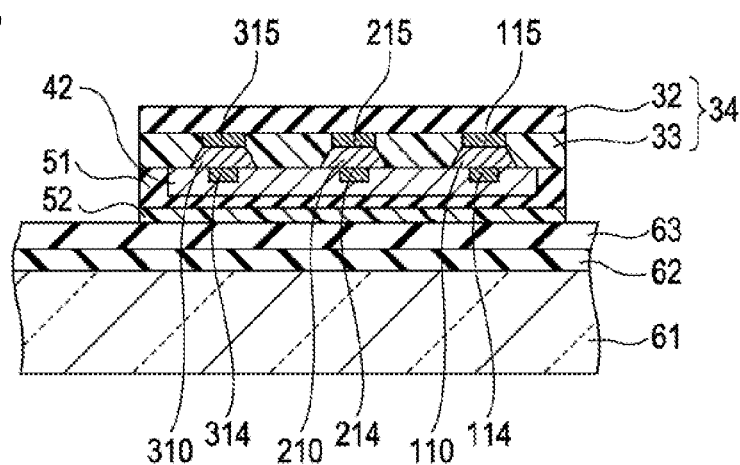
Figure 30C:
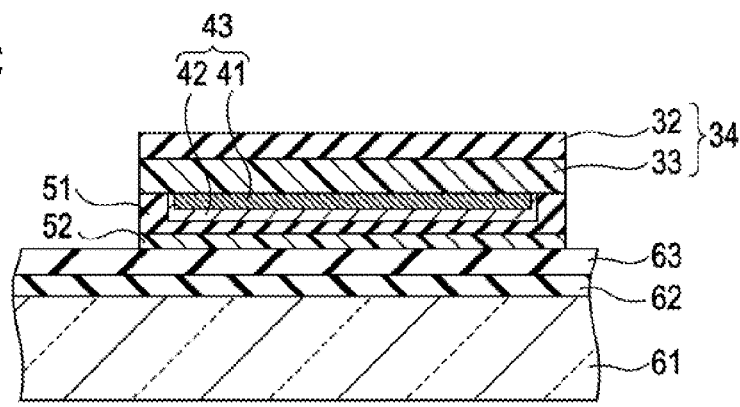
Figure 31A:
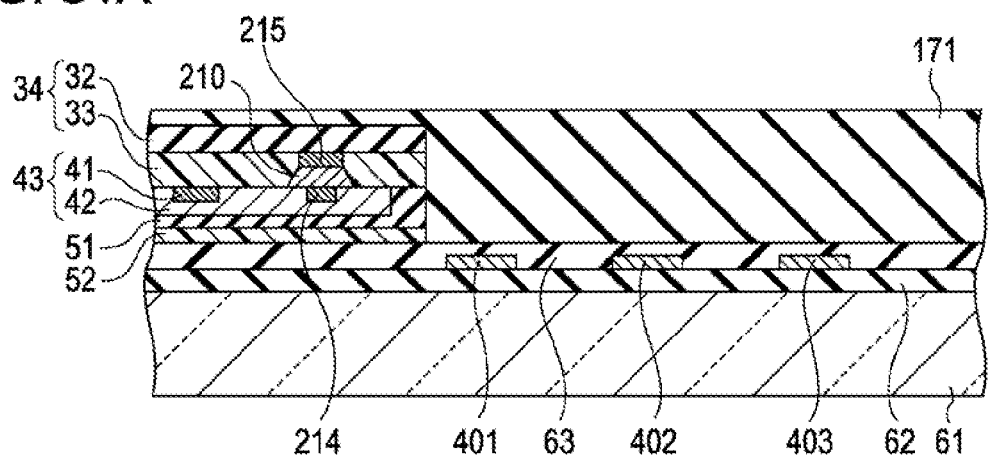
FIGS. 31A, 31B, and 31C are schematic partial end views equivalent to those taken along lines B-B, E-E, and F-F, respectively, in FIG. 1, for illustrating the method for manufacturing the light-emitting diode display according to the fourth embodiment in succession to FIGS. 30A, 3013, and 30C, respectively.
Figure 31B:
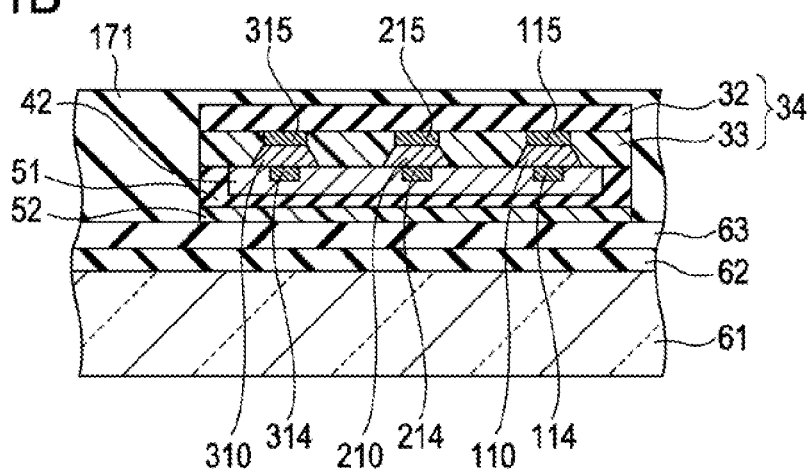
Figure 31C:
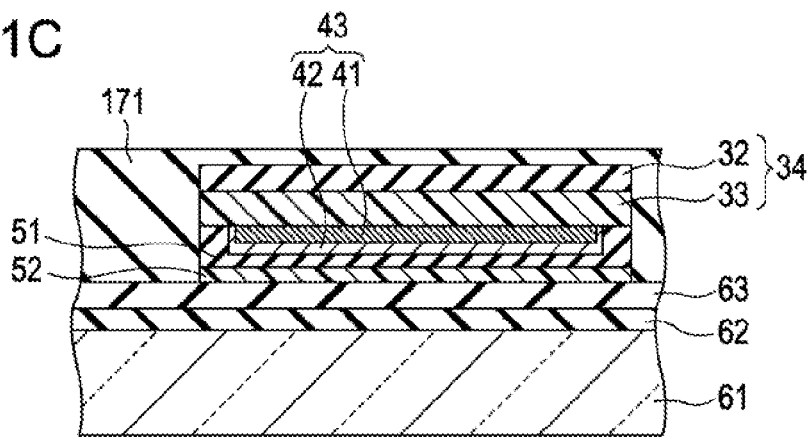
Figure 32A:
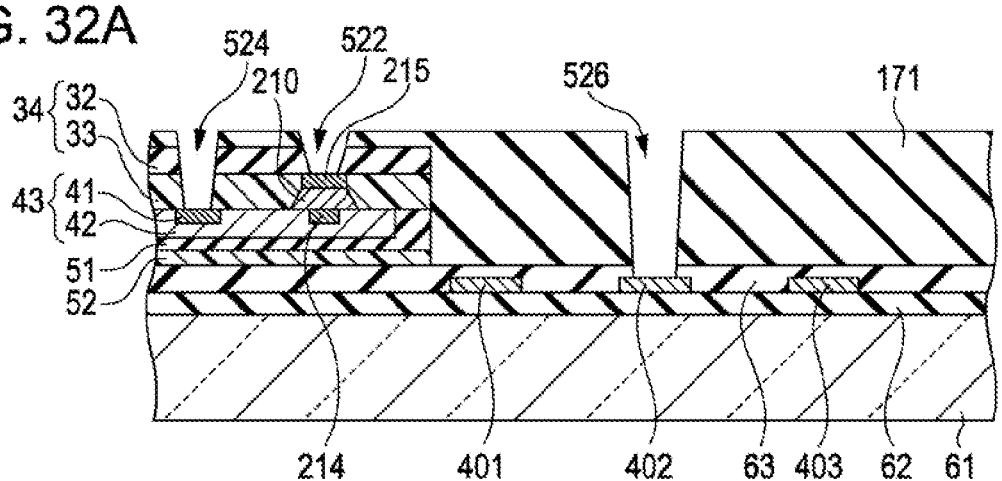
FIGS. 32A, 32B, and 32C are schematic, partial end views equivalent to those taken along lines B-B, E-E, and F-F, respectively, in FIG. 1, for illustrating the method for manufacturing the light-emitting diode display according to the fourth embodiment in succession to FIGS. 31A, 31B, and 31C, respectively.
Figure 32B:
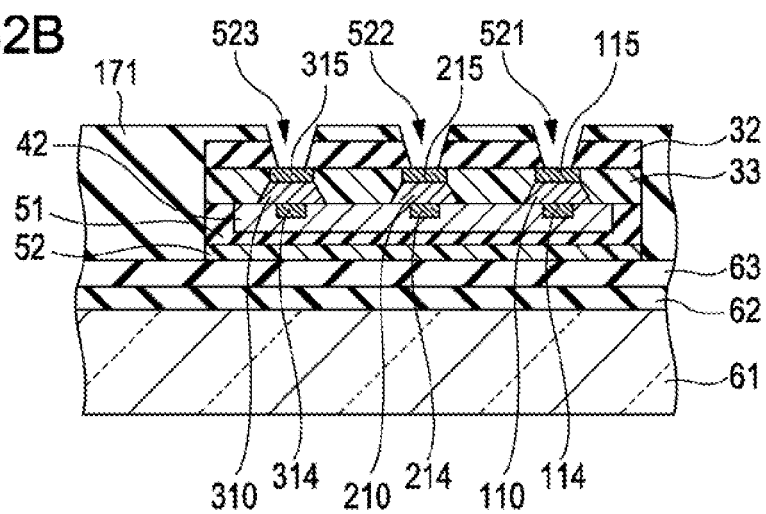
Figure 32C:
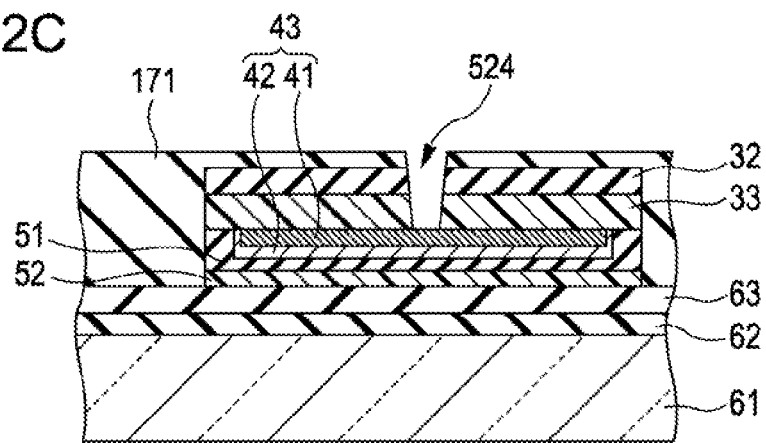

The method for manufacturing a light-emitting diode display of the fourth embodiment, more specifically the method for manufacturing a light-emitting diode display according to a fourth configuration, is described below with reference to FIGS. 30A, 30B, 30C, 31A, 31B, 31C, 32A, 32B, and 32C. FIGS. 30A, 31A, and 32A are schematic partial end views equivalent to that taken along line B-B in FIG. 1. FIGS. 30B, 31B, and 32B are schematic partial end views equivalent to that taken along line E-E in FIG. 1. FIGS. 30C, 31C, and 32C are schematic partial end views equivalent to that, taken along line F-F in FIG. 1.

[Step-400]

First, the same step as Step-300 of the third embodiment is performed.

(Step-410)

Like in the second embodiment, in the fourth embodiment, a display substrate 61 is prepared, on which first, second, and third common electrodes 401, 402, and 403 extending along the first direction have been formed. Unlike in the third embodiment, at this time, an insulating material layer has not been formed.

[Step-410A]

The light-emitting units are bonded to a second transfer substrate by the same method as in Step-120A of the first embodiment, and then the light-emitting unit production substrate 53 is removed.

[Step-410B]

Next, the light-emitting units are arranged on the display substrate 61 by the same method as in Step-210B of the second embodiment, and then the second transfer substrate is removed (refer to FIGS. 30A, 30B, and 30C).

[Step-410C]

Next, an insulating material layer 171 is formed to cover the first, second, and third common electrodes 401, 402, and 403 and surround the light-emitting units by the same method as in Step-210C of the second embodiment (refer to FIGS. 31A, 31B, and 31C).

[Step-410D]

Then, first contact holes 121 for electrically connecting the second electrodes 115 of the first light-emitting diodes 110 and the first common electrode 401 are formed in the fixed layer 34, and first connection portions 124 are formed to extend from the fixed layer 34 to the insulating material layer 171. In addition, second contact holes 221 for electrically connecting the second electrodes 215 of the second light-emitting diodes 210 and the second common electrode 402 are formed in the fixed layer 34, and second connection portions 224 are formed to extend from the fixed layer 34 to the insulating material layer 171. Further, third contact holes 321 for electrically connecting the second electrodes 315 of the third light-emitting diodes 310 and the third common electrode 403 are formed in the fixed layer 34, and third connection portions 324 are formed to extend from the fixed layer 34 to the insulating material layer 171. Further, a fourth common electrode 404 is formed on the insulating material layer 171, fourth contact holes 421 for electrically connecting the sub-common electrodes 43 and the fourth common electrode 404 are formed in the fixed layer 34, and fourth connection portions 424 are formed to extend from the fixed layer 34 to the insulating material layer 171. Specifically, the same step as Step-310C of the third embodiment may be performed.

Although the present application is described above on the basis of the preferred embodiments, the present application is not limited to these embodiments. The configurations and structures of the light-emitting diodes and the light-emitting diode display including the light-emitting diodes, which are described in the embodiments, are only examples, and the constituent members and materials, and the like are also examples. Thus, the configurations and structures, and the constituent members and materials, and the like may be appropriately changed. Although, in the embodiments, the sub-common electrode 43 includes the metal layer 41 and the light-transmitting electrode 42, alternatively the sub-common electrode 43 may include only a metal layer or an alloy layer as long as light emission from the light-emitting diodes is not inhibited. According to circumferences, the first electrodes 114, 214, and 314 may be formed, for example, after Step-110A-(2) or in Step-110B of the first embodiment. In each of the light-emitting diodes, the lamination order of the compound semiconductor layers may be reversed. Namely, in the embodiments, the first conductivity type is n-type, and the second conductivity type is p-type. However, conversely, the first conductivity type may be p-type, and the second conductivity type may be n-type. As the light-emitting diodes constituting each light-emitting unit, fourth light-emitting diodes, fifth light-emitting diodes, and the like may be further added to the first, second, and third light-emitting diodes. Examples of such a case include a light-emitting unit further including sub-pixels which emit white color light for improving luminance, a light-emitting unit further including sub-pixels which emit complementary color light for enlarging a color reproduction range, a light-emitting unit further including sub-pixels which emit yellow color light for enlarging a color reproduction range, and a light-emitting unit, further including sub-pixels which emit yellow and cyan color light for enlarging a color reproduction range. In such cases, the first electrodes of fourth light-emitting diodes, fifth light-emitting diodes, and the like may be connected to the sub-common electrode. The light-emitting diode display may be applied to not only color-display flat-screen direct-viewing type image displays such as television receivers and computer terminals but also image displays of a type in which an image is projected on the human retina, and projection-type image displays. In these image displays, for example, a field sequential driving system may be used, in which an image is display by time sharing control of emission/non-emission states of first, second, and third light-emitting diodes. However, the drive system is not limited to this.

Figure 33:
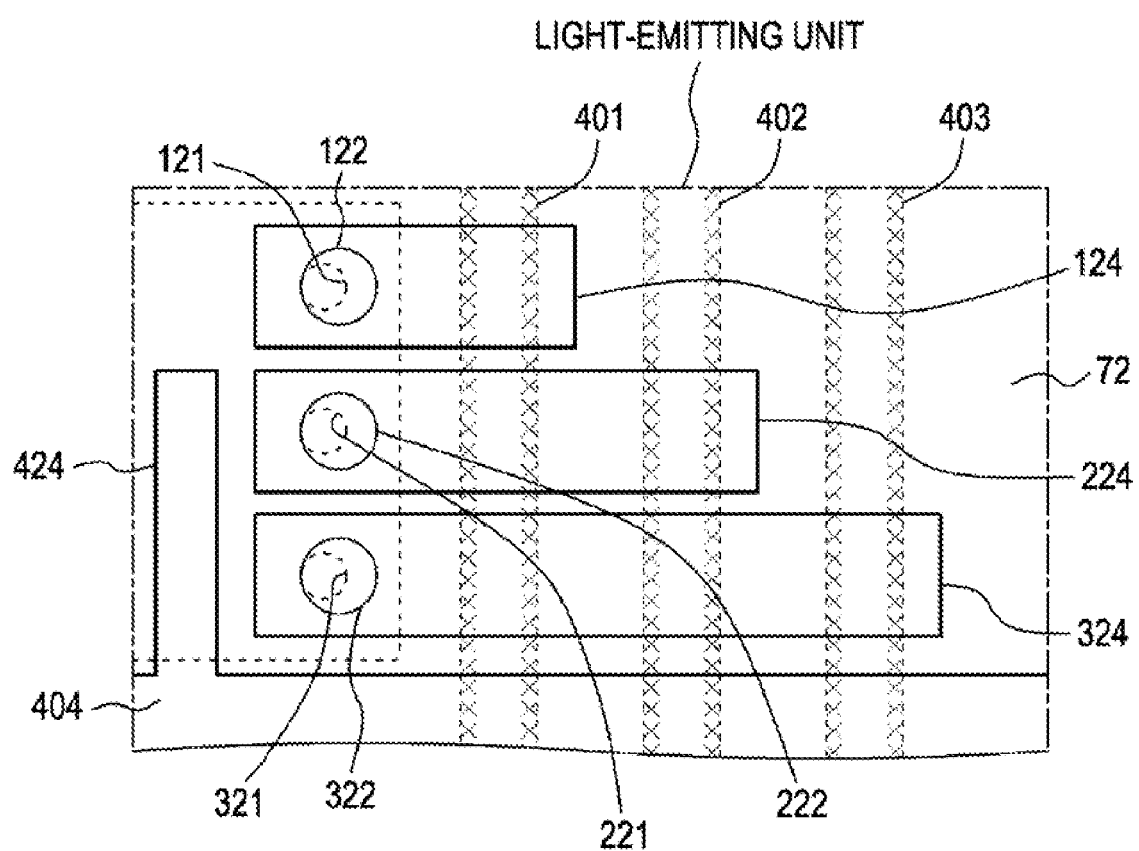
FIG. 33 is a schematic plan view of one light-emitting unit in a modified example of the light-emitting diode display according to the first embodiment.

FIG. 33 is a schematic plan view showing a light-emitting unit in a modified example of the light-emitting diode display according to the first embodiment. In this modified example, the center of a first pad portion 122 (shown by a thin line in FIG. 33) which closes a first contact hole 121 (shown by a dotted line in FIG. 33) does not coincide with the center of the first contact hole 121 and deviates to the first common wiring 401 side. In addition, the center of a second pad portion 222 (shown by a thin line in FIG. 33) which closes a second contact hole 221 (shown by a dotted line in FIG. 33) does not coincide with the center of the second contact hole 221 and deviates to the second common wiring 402 side. Further, the center of a third pad portion 322 (shown, by a thin line in FIG. 33) which closes a third contact hole 321 (shown by a dotted line in FIG. 33) does not coincide with the center of the third contact, hole 321 and deviates to the third common wiring 403 side. In this configuration, for example, when the first, second, and third connection portions 124, 224, and 324 are formed, an allowance may be obtained for the distances between these connection portions 124, 224, and 324 and the fourth connection portions 424. Therefore, short-circuiting may be securely prevented from occurring between these connection portions 124, 224, and 324 and the fourth connection portions 424. This modified example may be applied to the other embodiments.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method for manufacturing a light-emitting diode display, the method comprising:
    (A) providing a plurality of first light-emitting diodes which emit red light on a first light-emitting diode production substrate, the first light-emitting diodes each including (a-1) a first compound semiconductor layer having a first conductivity type, (a-2) an active layer, (a-3) a second compound semiconductor layer having a second conductivity type different from the first conductivity type, (a-4) a first electrode electrically connected to the first compound semiconductor layer, and (a-5) a second electrode electrically connected to the second compound semiconductor layer;
    providing a plurality of second light-emitting diodes which emit green light on a second light-emitting diode production substrate, the second light-emitting diodes each including (b-1) a first compound semiconductor layer having a first conductivity type, (b-2) an active layer, (b-3) a second compound semiconductor layer having a second conductivity type different from the first conductivity type, (b-4) a first electrode electrically connected to the first compound semiconductor layer, and (b-5) a second electrode electrically connected to the second compound semiconductor layer; and
    providing a plurality of third light-emitting diodes which emit blue light on a third light-emitting diode production substrate, the third light-emitting diodes each including (c-1) a first compound semiconductor layer having a first conductivity type, (c-2) an active layer, (c-3) a second compound semiconductor layer having a second conductivity type different from the first conductivity type, (c-4) a first electrode electrically connected to the first compound semiconductor layer, and (c-5) a second electrode electrically connected to the second compound semiconductor layer;
    (B) pre-fixing the first light-emitting diodes, the second light-emitting diodes, and the third light-emitting diodes to a light-emitting unit production substrate to form a light-emitting unit which includes a desired number of the first light-emitting diodes, a desired number of the second light-emitting diodes, and a desired number of the third light-emitting diodes, the first electrodes of each first light-emitting diode, each second light-emitting diode, and each third light-emitting diodes being connected to a sub-common electrode; and
    (C) transferring and fixing the light-emitting unit to a display substrate from the light-emitting unit production substrate to produce a light-emitting diode display including a plurality of light-emitting units arranged in a two-dimensional matrix.

2. The method for manufacturing a light-emitting diode display according to claim 1,
    wherein an arrangement pitch of the first light-emitting diodes in the light-emitting diode display is an integral multiple of a manufacturing pitch of the first light-emitting diodes on the first light-emitting diode production substrate;

an arrangement pitch of the second light-emitting diodes in the light-emitting diode display is an integral multiple of the manufacturing pitch of the second light-emitting diodes on the second light-emitting diode production substrate; and an arrangement pitch of the third light-emitting diodes in the light-emitting diode display is an integral multiple of the manufacturing pitch of the third light-emitting diodes on the third light-emitting diode production substrate.

3. The method for manufacturing a light-emitting diode display according to claim 1, wherein a first transfer substrate having a fixed layer is prepared;

the step (B) includes;

(B-1) transferring the first light-emitting diodes on the first light-emitting diode production substrate to the fixed layer, transferring the second light-emitting diodes on the second light-emitting diode production substrate to the fixed layer, and transferring the third light-emitting diodes on the third light-emitting diode production substrate to the fixed layer;

(B-2) forming the sub-common electrode from the first electrodes of a light-emitting diode group to the fixed layer, the light-emitting diode group including a desired number of the first light-emitting diodes, a desired number of the second light-emitting diodes, and a desired number of the third light-emitting diodes which form each light-emitting unit;

(B-3) bonding and pre-fixing, through the fixed layer and the sub-common electrode, the light-emitting diode group which forms each light-emitting unit to the light-emitting diode unit production substrate and then removing the first transfer substrate;

(B-4) forming first contact holes, which are connected to the second electrodes of the first light-emitting diodes, in the fixed layer and forming first pad portions extending from the first contact holes to the fixed layer, forming second contact holes, which are connected to the second electrodes of the second light-emitting diodes, in the fixed layer and forming second pad portions extending from the second contact holes to the fixed layer, forming third contact holes, which are connected to the second electrodes of the third light-emitting diodes, in the fixed layer and forming third pad portions extending from the third contact holes to the fixed layer, and forming fourth contact holes, which are connected to the sub-common electrode, in the fixed layer and forming fourth pad portions extending from the fourth contact holes to the fixed layer to form light-emitting units; and (B-5) separating the light-emitting units in the fixed layer;

a display substrate on which an insulating material layer and a first, second, and third common electrodes covered with the insulating material layer and extending in a first direction are formed is prepared; and the step (C) includes:

(C-1) bonding the light-emitting units to a second transfer substrate and removing the light-emitting unit production substrate;

(C-2) arranging the light-emitting units on the display substrate so that the light-emitting units are surrounded by the insulating material layer and then removing the second transfer substrate; and (C-3) forming first connection portions for electrically connecting the first pad portions to the first common electrode so that the first connection portions extend from the fixed layer to the insulating material layer;

forming second connection portions for electrically connecting the second pad portions to the second common electrode so that the second connection portions extend from the fixed layer to the insulating material layer;

forming third connection portions for electrically connecting the third pad portions to the third common electrode so that the third connection portions extend from the fixed layer to the insulating material layer;

forming a fourth common electrode on the insulating material layer; and forming fourth connection portions for electrically connecting the fourth pad portions to the fourth common electrode so that the first connection portions extend from the fixed layer to the insulating material layer.

4. The method for manufacturing a light-emitting diode display according to claim 1, wherein a first transfer substrate having a fixed layer is prepared;

the step (B) includes:

(B-1) transferring the first light-emitting diodes on the first light-emitting diode production substrate to the fixed layer, transferring the second light-emitting diodes on the second light-emitting diode production substrate to the fixed layer, and transferring the third light-emitting diodes on the third light-emitting diode production substrate to the fixed layer;

(B-2) forming the sub-common electrode from the first electrodes of a light-emitting diode group to the fixed layer, the light-emitting diode group including a desired number of the first light-emitting diodes, a desired number of the second light-emitting diodes, and a desired number of the third light-emitting diodes which form each light-emitting unit;

(B-3) bonding and pre-fixing the light-emitting diode group, which forms each light-emitting unit, to the light-emitting diode unit production substrate through the fixed layer and the sub-common electrode;

(B-4) forming first contact holes, which are connected to the second electrodes of the first light-emitting diodes, in the fixed layer and forming first pad portions extending from the first contact holes to the fixed layer, forming second contact holes, which are connected to the second electrodes of the second light-emitting diodes, in the fixed layer and forming second pad portions extending from the second contact holes to the fixed layer, forming third contact holes, which are connected to the second electrodes of the third light-emitting diodes, in the fixed layer and forming third pad portions extending from the third contact holes to the fixed layer, and forming fourth contact holes connected to the sub-common electrode in the fixed layer and forming fourth pad portions extending from the fourth contact holes on the fixed layer to form light-emitting units; and (B-5) separating the light-emitting units in the fixed layer;

a display substrate on which first, second, and third common electrodes are formed to extend in a first direction is prepared; and the step (C) includes:

(C-1) bonding the light-emitting units to a second transfer substrate and removing the light-emitting unit production substrate;

(C-2) arranging the light-emitting units on the display substrate and then removing the second transfer substrate;

(C-3) forming an insulating material layer to cover the first, second, and third common electrodes and surround the light-emitting units; and (C-4) forming first connection portions for electrically connecting the first pad portions to the first common electrode so that the first connection portions extend from the fixed layer to the insulating material layer;

forming second connection portions for electrically connecting the second pad portions to the second common electrode so that the second connection portions extend from the fixed layer to the insulating material layer;

forming third connection portions for electrically connecting the third pad portions to the third common electrode so that the third connection portions extend from the fixed layer to the insulating material layer;

forming a fourth common electrode on the insulating material layer; and forming fourth connection portions for electrically connecting the fourth pad portions to the fourth common electrode so that the first connection portions extend from the fixed layer to the insulating material layer.

5. The method for manufacturing a light-emitting diode display according to claim 1, wherein a first transfer substrate having a fixed layer is prepared;

the step (B) includes the steps of:

(B-1) transferring the first light-emitting diodes on the first light-emitting diode production substrate to the fixed layer, transferring the second light-emitting diodes on the second light-emitting diode production substrate to the fixed layer, and transferring the third light-emitting diodes on the third light-emitting diode production substrate to the fixed layer;

(B-2) forming the sub-common electrode from the first electrodes of a light-emitting diode group to the fixed layer, the light-emitting group including a desired number of the first light-emitting diodes, a desired number of the second light-emitting diodes, and a desired number of the third light-emitting diodes which form each light-emitting unit;

(B-3) bonding and pre-fixing the light-emitting diode group, which forms each light-emitting unit, to the light-emitting diode unit production substrate through the fixed layer and the sub-common electrodes to produce light-emitting units and then removing the first transfer substrate; and (B-4) separating the light-emitting units in the fixed layer;

a display substrate on which an insulating material layer and a first, second, and third common electrodes covered with the insulating material layer and extending in a first direction are formed is prepared; and the step (C) includes:

(C-1) bonding the light-emitting units to a second transfer substrate and removing the light-emitting unit production substrate;

(C-2) arranging the light-emitting units on the display substrate so that the light-emitting units are surrounded by the insulating material layer and then removing the second transfer substrate; and (C-3) forming first contact holes in the fixed layer in order to electrically connect the second electrodes of the first light-emitting diodes to the first common electrode and forming first connection portions so that the first connection portions extend from the fixed layer to the insulating material layer;

forming second contact holes in the fixed layer in order to electrically connect the second electrodes of the second light-emitting diodes to the second common electrode and forming second connection portions so that the second connection portions extend from the fixed layer to the insulating material layer;

forming third contact holes in the fixed layer in order to electrically connect the second electrodes of the third light-emitting diodes to the third common electrode and forming third connection portions so that the third connection portions extend from the fixed layer to the insulating material layer;

forming a fourth common electrode on the insulating material layer; and forming fourth contact holes in the fixed layer in order to electrically connect the sub-common electrode to the fourth common electrode and forming fourth connection portions so that the fourth connection portions extend from the fixed layer to the insulating material layer.

6. The method for manufacturing a light-emitting diode display according to claim 1, wherein a first transfer substrate having a fixed layer is prepared;

step (B) includes:

(B-1) transferring the first light-emitting diodes on the first light-emitting diode production substrate to the fixed layer, transferring the second light-emitting diodes on the second light-emitting diode production substrate to the fixed layer, and transferring the third light-emitting diodes on the third light-emitting diode production substrate to the fixed layer;

(B-2) forming the sub-common electrode from the first electrodes of a light-emitting diode group to the fixed layer, the light-emitting diode group including a desired number of the first light-emitting diodes, a desired number of the second light-emitting diodes, and a desired number of the third light-emitting diodes which form each light-emitting unit;

(B-3) bonding and pre-fixing the light-emitting diode group, which forms each light-emitting unit, to the light-emitting diode unit production substrate through the fixed layer and the sub-common electrodes to produce light-emitting units and then removing the first transfer substrate; and (B-4) separating the light-emitting units in the fixed layer;

a display substrate on which first, second, and third common electrodes are formed to extend in a first direction is prepared; and the step (C) includes:

(C-1) bonding the light-emitting units to a second transfer substrate and removing the light-emitting unit production substrate;

(C-2) arranging the light-emitting units on the display substrate and then removing the second transfer substrate;

(C-3) forming an insulating material layer to cover the first, second, and third common electrodes and surround the light-emitting units; and (C-4) forming first contact holes in the fixed layer in order to electrically connect the second electrodes of the first light-emitting diodes to the first common electrode and forming first connection portions so that the first connection portions extend from the fixed layer to the insulating material layer;

forming second contact holes in the fixed layer in order to electrically connect the second electrodes of the second light-emitting diodes to the second common electrode and forming second connection portions so that the second connection portions extend from the fixed layer to the insulating material layer;

forming third contact holes in the fixed layer in order to electrically connect the second electrodes of the third light-emitting diodes to the third common electrode and forming third connection portions so that the third connection portions extend from the fixed layer to the insulating material layer;

forming a fourth common electrode on the insulating material layer; and forming fourth contact holes in the fixed layer in order to electrically connect the sub-common electrode to the fourth common electrode and forming fourth connection portions so that the fourth connection portions extend from the fixed layer to the insulating material layer.

7. The method for manufacturing a light-emitting diode display according to claim 3, wherein the size of the first pad portions is larger than the size of the second electrodes of the first light-emitting diodes;

the size of the second pad portions is larger than the size of the second electrodes of the second light-emitting diodes; and the size of the third pad portions is larger than the size of the second electrodes of the third light-emitting diodes.

8. The method for manufacturing a light-emitting diode display according to claim 4, wherein the size of the first pad portions is larger than the size of the second electrodes of the first light-emitting diodes;

the size of the second pad portions is larger than the size of the second electrodes of the second light-emitting diodes; and the size of the third pad portions is larger than the size of the second electrodes of the third light-emitting diodes.

9. The method for manufacturing a light-emitting diode display according to claim 1, wherein light emitted from the first, second, and third light-emitting diodes is emitted from the first electrode side, and the sub-common electrode has a light-transmitting structure.

10. The method for manufacturing a light-emitting diode display according to claim 9, wherein the sub-common electrode includes a metal layer or alloy layer.

11. The method for manufacturing a light-emitting diode display according to claim 9, wherein the sub-common electrode includes a light-transmitting electrode and a metal layer or alloy layer extending from the light-transmitting electrode;

the first electrodes of the first, second, and third light-emitting diodes are in contact with the light-transmitting electrode; and the fourth contact holes are in contact with the metal layer or alloy layer.

12. The method for manufacturing a light-emitting diode display according to claim 1, wherein the following relationships are satisfied:

$L_{U\text{-}1}/L_{P\text{-}1} \leq 0.5$ $L_{U\text{-}2}/L_{P\text{-}2} \leq 0.5$ wherein $L_{P\text{-}1}$ and $L_{P\text{-}2}$ are lengths along the first direction and the second direction, respectively, of one pixel including the first, second, and third light-emitting diodes, and $L_{U\text{-}1}$ and $L_{U\text{-}2}$ are lengths along the first direction and the second direction, respectively, of one light-emitting unit.

13. The method for manufacturing a light-emitting diode display according to claim 12, wherein the following relationships are satisfied:

$L_{U\text{-}1}/L_{P\text{-}1} \leq 0.5$ $L_{U\text{-}2}/L_{P\text{-}2} \leq 0.25$.

14. The method for manufacturing a light-emitting diode display according to claim 1, wherein the following relationship is satisfied:

$2.5 \times 10^{-11} \text{ m}^2 \leq S_{max} \leq 1 \times 10^{-8} \text{ m}^2$, wherein $S_{max}$ is the area of the emission surface of the largest light-emitting diode among the first, second, and third light-emitting diodes.

15. A light-emitting diode display comprising:

a plurality of light-emitting units arranged in a first direction and a second direction perpendicular to the first direction, the light-emitting units each including:

a desired number of first light-emitting diodes which emit red light and each of which includes (a-1) a first compound semiconductor layer having a first conductivity type, (a-2) an active layer, (a-3) a second compound semiconductor layer having a second conductivity type different from the first conductivity type, (a-4) a first electrode electrically connected to the first compound semiconductor layer, and (a-5) a second electrode electrically connected to the second compound semiconductor layer;

a desired number of second light-emitting diodes which emit green light and each of which includes (b-1) a first compound semiconductor layer having a first conductivity type, (b-2) an active layer, (b-3) a second compound semiconductor layer having a second conductivity type different from the first conductivity type, (b-4) a first electrode electrically connected to the first compound semiconductor layer, and (b-5) a second electrode electrically connected to the second compound semiconductor layer; and a desired number of third light-emitting diodes which emit blue light and each of which includes (c-1) a first compound semiconductor layer having a first conductivity type, (c-2) an active layer, (c-3) a second compound semiconductor layer having a second conductivity type different from the first conductivity type, (c-4) a first electrode electrically connected to the first compound semiconductor layer, and (c-5) a second electrode electrically connected to the second compound semiconductor layer;

wherein the first electrodes of the first, second, and third light-emitting diodes in each of the light-emitting units are connected to a sub-common electrode;

the second electrodes of the first, second, and third light-emitting diodes in each of the light-emitting units arranged in the first direction are connected to first, second, and third common electrodes, respectively, which extend in the first direction; and the sub-common electrodes of the light-emitting units arranged in the second direction are connected to a fourth common electrode extending in the second direction.

16. The light-emitting diode display according to claim 15, wherein the first, second, and third common electrodes are formed on a display substrate;

the sub-common electrodes are formed in a fixed layer fixed on the display substrate;

the first, second, and third light-emitting diodes in the light-emitting units are fixed in the fixed layer;

the fixed layer is surrounded by an insulating material layer which covers the first, second, and third common electrodes;

the first, second, and third light-emitting diodes in the light-emitting units are disposed on the sub-common electrode so that the first electrodes of the light-emitting diodes are connected to the sub-common electrode;

the second electrodes of the first light-emitting diodes are connected to the first common electrode through first contact holes formed in the fixed layer and first connection portions formed to extend from the fixed layer to the insulating material layer;

the second electrodes of the second light-emitting diodes are connected to the second common electrode through second contact holes formed in the fixed layer and second connection portions formed to extend from the fixed layer to the insulating material layer;

the second electrodes of the third light-emitting diodes are connected to the third common electrode through third contact holes formed in the fixed layer and third connection portions formed to extend from the fixed layer to the insulating material layer; and the sub-common electrodes are connected to the fourth common electrode formed on the insulating material layer through fourth contact holes formed in the fixed layer and fourth connection portions formed to extend from the fixed layer to the insulating material layer.

17. The light-emitting diode display according to claim 16, wherein first pad portions are provided in the fixed layer and disposed between the first contact holes and the first connection portions;

second pad portions are provided in the fixed layer and disposed between the second contact holes and the second connection portions;

third pad portions are provided in the fixed layer and disposed between the third contact holes and the third connection portions; and fourth pad portions are provided in the fixed layer and disposed between the fourth contact holes and the fourth connection portions.

18. The light-emitting diode display according to claim 17, wherein a size of the first pad portions is larger than a size of the second electrodes of the first light-emitting diodes;

a size of the second pad portions is larger than the size of a second electrodes of the second light-emitting diodes; and a size of the third pad portions is larger than a size of the second electrodes of the third light-emitting diodes.

19. The light-emitting diode display according to claim 15, wherein light emitted from the first, second, and third light-emitting diodes is emitted from the first electrode side, and the sub-common electrode has a light-transmitting structure.

20. The light-emitting diode display according to claim 19, the sub-common electrode includes a metal layer or alloy layer.

21. The light-emitting diode display according to claim 19, wherein the sub-common electrode includes a light-transmitting electrode and a metal layer or alloy layer extending from the light-transmitting electrode;

the first electrodes of the first, second, and third light-emitting diodes are in contact with the light-transmitting electrode; and the fourth contact holes are in contact with the metal layer or alloy layer.

22. The light-emitting diode display according to claim 15, wherein the following relationships are satisfied:

$$L_{U\text{-}1}/L_{P\text{-}1} \leqq 0.5$$

$$L_{U\text{-}2}/L_{P\text{-}2} \leqq 0.5$$

wherein $L_{P\text{-}1}$ and $L_{P\text{-}2}$ are lengths along the first direction and the second direction, respectively, of one pixel including the first, second, and third light-emitting diodes, and $L_{U\text{-}1}$ and $L_{U\text{-}2}$ are lengths along the first direction and the second direction, respectively, of one light-emitting unit.

23. The light-emitting diode display according to claim 22, wherein the following relationships are satisfied:

$$L_{U\text{-}1}/L_{P\text{-}1} \leqq 0.5$$

$$L_{U\text{-}2}/L_{P\text{-}2} \leqq 0.25.$$

24. The light-emitting diode display according to claim 15, wherein the following relationship is satisfied:

$$2.5 \times 10^{-11}\,m^2 \leqq S_{max} \leqq 1 \times 10^{-8}\,m^2,$$

wherein $S_{max}$ is the area of the emission surface of the largest light-emitting diode among the first, second, and third light-emitting diodes.

* * * * *